US008430644B2

(12) United States Patent
Mahalingam et al.

(10) Patent No.: US 8,430,644 B2
(45) Date of Patent: Apr. 30, 2013

(54) SYNTHETIC JET EJECTOR FOR THE THERMAL MANAGEMENT OF PCI CARDS

(75) Inventors: Raghavendran Mahalingam, Austin, TX (US); Samuel N. Heffington, Austin, TX (US); Ari Glezer, Atlanta, GA (US); Ronald Lutz, Round Rock, TX (US)

(73) Assignee: Nuventix, Inc., Austin, TX (US)

( * ) Notice: Subject to any disclaimer, the term of this patent is extended or adjusted under 35 U.S.C. 154(b) by 1237 days.

(21) Appl. No.: 11/601,608

(22) Filed: Nov. 17, 2006

(65) Prior Publication Data
US 2007/0119573 A1 May 31, 2007

Related U.S. Application Data

(60) Provisional application No. 60/750,656, filed on Dec. 14, 2005, provisional application No. 60/737,920, filed on Nov. 18, 2005, provisional application No. 60/755,603, filed on Dec. 31, 2005.

(51) Int. Cl.
*F28F 7/00* (2006.01)
(52) U.S. Cl.
USPC ....... 417/173; 165/908; 165/104.33; 361/697
(58) Field of Classification Search .................. 417/173; 165/908, 104.33, 80.3, 121, 122; 361/697, 361/692, 691, 679.54
See application file for complete search history.

(56) References Cited

U.S. PATENT DOCUMENTS

| 5,361,188 | A | * | 11/1994 | Kondou et al. | 361/695 |
|---|---|---|---|---|---|
| 5,422,787 | A | * | 6/1995 | Gourdine | 361/697 |
| 5,428,503 | A | * | 6/1995 | Matsushima et al. | 361/695 |
| 6,105,661 | A | * | 8/2000 | Torii | 165/80.4 |
| 6,134,108 | A | * | 10/2000 | Patel et al. | 361/695 |
| 6,588,497 | B1 | * | 7/2003 | Glezer et al. | 165/84 |
| 6,781,834 | B2 | * | 8/2004 | Nair et al. | 361/697 |
| 2003/0142479 | A1 | * | 7/2003 | Ganrot | 361/719 |

OTHER PUBLICATIONS

Chapter 6.6: Compact Ultrasonic Air Transducer; http://www.globalspec.com; Sep. 14, 2006; 11 pages.
Manger, Daniela L., "A sound transducer with a flat, flexible diaphragm working with bending waves"; Manger Products, Mellrichstadt, Germany; 4 pages.
Flomerics May 1998 Article 3.htm; Electronics Cooling; Thermal management of handheld telecommunication products; www.electronics-cooling.com/Resources/EC_Articles/May98/article3.htm; Mar. 24, 2005; 7 pages.

(Continued)

*Primary Examiner* — Charles Freay
*Assistant Examiner* — Christopher Bobish
(74) *Attorney, Agent, or Firm* — John A. Fortkort; Fortkort & Houston P.C.

(57) ABSTRACT

A method for constructing a thermal management system is provided herein. In accordance with the method, a fan (405) is provided which is adapted to provide a global flow of fluid through the device. A synthetic jet ejector (409) is also provided which is adapted to augment the global flow of fluid over the surfaces of a heat sink (403). The ratio of the flow per unit time of the synthetic jet ejector to the flow per unit time of the fan is selected so as to achieve a desired level of heat dissipation.

47 Claims, 60 Drawing Sheets

OTHER PUBLICATIONS

Georgia Institute of Technology, Package Research Center; e-newsletter, vol. 1, Issue 6, Dec. 2004; "Single Phase Pumped Flow Loop with a Stacked Microchannel Heat Sink"; www.prc/gatech.edu/newsletter/dec2004.htm; Jul. 16, 2005; 9 pages.

Toon, John, GT Research Horizons, Winter 2004; "Keeping Cool, Synthetic jet and droplet atomization technologies meet broad range of electronic thermal management needs"; http://gtresearchnews.gatech.edu/reshor/rh-w04/fluidics.html; Aug. 4, 2005; 4 pages.

Heffington, S. and Glezer, A., "Enhanced Boiling Heat Transfer by Submerged Ultrasonic Vibrations"; George W. Woodruff School of Mechanical Engineering, Georgia Institute of Technology, Atlanta, Georgia; Sep. 29-Oct. 1, 2004; 5 pages.

Harris, Tom, "How Speakers Work"; How Stuff Works; http://electronics.howstuffworks.com/speaker.htm; May 17, 2006, 31 pages.

Arik, Mehmet, White Paper, "Local Heat Transfer Coefficients of a High Frequency Synthetic Jet During Impingement Cooling Over Flat Surfaces"; GE Global Research Ctr., 19 pgs.

Innovative Techniques to Obtain Heat Transfer Coefficient and Film Effectiveness; Design Considerations for Rugged Enclosures; http://www.afrlhorizons.com/ETB/ETBriefs/Oct05; Dec. 9, 2005; 4 pages.

InTech, ISA—The Instrumentation, Systems, and Automation Society; "Synthetic jet, atomization keep it cool"; Dec. 3, 2003; www.isa.org/InTechTemplate.cfm Aug. 4, 2005; 2 pgs.

Bash, Cullen E et al.; "Acoustic Compression for theThermal Management of Multi-Load Electronic Systems"; White Paper; Hewlett-Packard Laboratories; 8 pages.

Wang, Evelyn N. et al.; "Micromachined Jets for Liquid Impingement Cooling of VLSI Chips"; Journal of Microelectromechanical Systems, vol. 13, No. 5, Oct. 2004; 10 pages.

Linderman, Ryan J. et al., "The Resonant Micro Fan for Fluidic Transport, Mixing and Particle Filtering"; Proceedings of 2001 ASME International Mechanica Engineering Congress and Exposition, Nov. 11-16, 2001, New York, NY; 8 pages.

Suzuki, Hiroaki et al., "Manipulation of a Round Jet with Electromagnetic Flap Actuators"; IEEE MEMS ;99, Orlando, Florida, Jan. 1999; 7 pages.

Ho, Chih-Ming and Tai, Yu-Chong; Micro-Electro-Mechannical-Systems (MEMS) and Fluid Flows; Annu. Rev. Fluid . Mich. 1998, 30:579-612.

Kercher, Dan S. et al.; "Microjet Cooling Devices for Thermal Management of Electronics"; http:/www.utdallas.edu; Mar. 24, 2005, 4 pages.

Li, Shuo and Smith, Marc K.; "Numerical Study of the Micro Synthetic Jet and Its Application to Thermal Management in Microelectronics"; http://www.me.gatech.edu/fluids/projects/smith/li.htm; Sep. 12, 2006; 2 pages.

Nemeth, Jackie; "Microjet Integration, New microjet allows for easy integration into electronic devices"; Research Horizons, http://www.gtresearchnews.gatech.edu/reshor/rh-spr98/mjet.html; Sep. 12, 2006; 2 pages.

Science Daily: Synthetic Jet and Droplet Atomization Technologies Help Electronic Devices Keep Cool; www.sciencedaily.com/releases/2003; Sep. 12, 2006; 4 pages.

Tillery, Steven W. et al.; "Boiling Heat Transfer Enhancement by Submerged, Vigration-Induced Jets"; White paper; George W. Woodruff School of Mech. Engineering; 15 pages.

Daniels, Christopher et al.; "Nonlinear Oscillations and Flow of Gas Within Closed and Open Conical Resonators"; NASA/TM-2004-212902; AIAA-2004-0677; Prepared for the 42nd Aerospace Sciences Meeting and Exhibit; Reno, Nevada, Jan. 5-8, 2004; Feb. 2004; 12 pages.

Davis, Sam; "Turn Down the Heat, Please!"; electronic design; www.elecdesign.com/Articles/Index.cfm; Mar. 17, 2005; 5 pages.

PI Ceramic; "PICA-Stack Piezoceramic Actuators Versatile Piezoelectric Power"; www.piceramic.com; 2006; 3 pages.

* cited by examiner

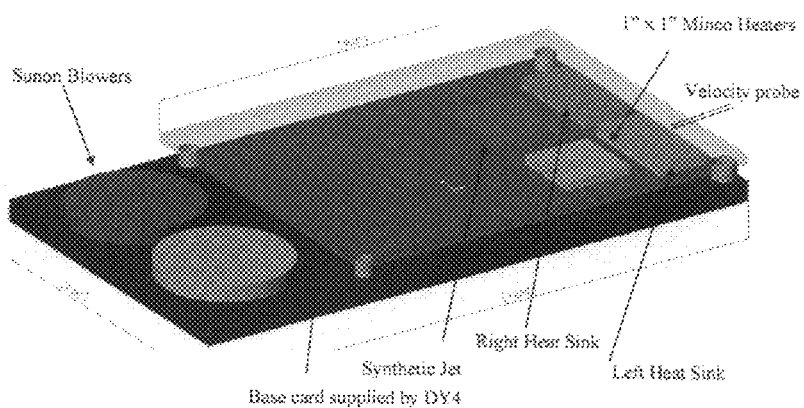
FIG. 9
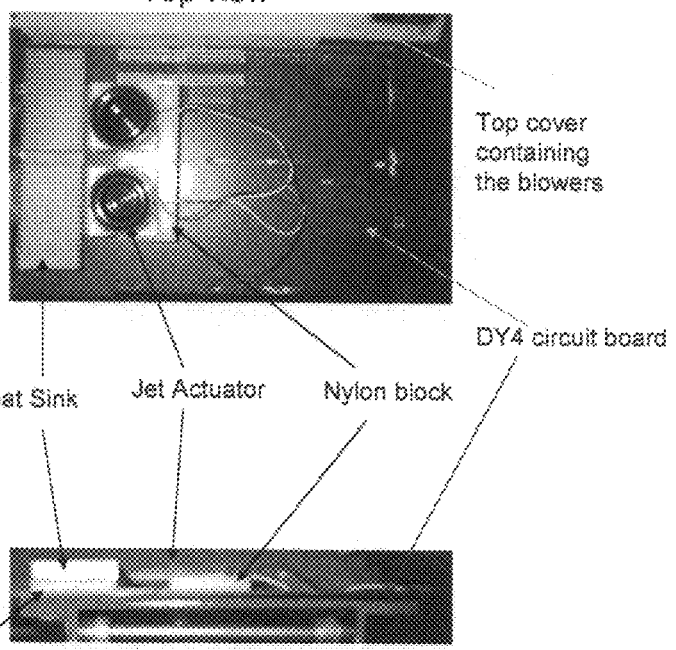
FIG. 10
FIG. 11

SYNTHETIC JET EJECTOR FOR THE THERMAL MANAGEMENT OF PCI CARDS

CROSS-REFERENCE TO RELATED APPLICATIONS

The present application claims priority from U.S. Provisional Patent Application Ser. No. 60/750,656, entitled "Synthetic Jet Ejector for Cooling Ruggadized Cards", which was filed on Dec. 14, 2005, and which is incorporated herein by reference in its entirety; from U.S. Provisional Patent Application Ser. No. 60/737,920, entitled "Small Form Synthetic Cooling Solutions for PCI Express Cards", which was filed on Nov. 18, 2005, and which is incorporated herein by reference in its entirety; and from U.S. Provisional Patent Application Ser. No. 60/755,603, entitled "Synthetic Jet Ejector for the Thermal management of PCI Cards", which was filed on Dec. 31, 2005, and which is incorporated herein by reference in its entirety.

FIELD OF THE DISCLOSURE

The present disclosure relates generally to synthetic jet ejectors, and more specifically to the use of low profile synthetic jet ejectors for the thermal management of PCI cards and other such devices.

BACKGROUND OF THE DISCLOSURE

The power and speed of computer components has increased steadily since the introduction of desktop computers decades ago. As software manufacturers have developed new applications to utilize the latest advances in processor speed and hard drive capacity, hardware manufacturers have developed new components and technologies to keep pace with the increased demands placed on computer systems by software. These components are frequently produced as add-on cards which interface with a computer's processor by way of a bus, such as the Peripheral Component Interconnect (PCI) bus. The use of a bus as the interface permits these components to be readily interchangeable. Hence, the component can be readily upgraded simply by swapping out a new card for the old one. Likewise, additional functionality (e.g., the ability to support dual monitors) can be readily imparted to a system through the addition of further cards. For some applications, as for military applications, these cards may be 'ruggadized" to better withstand vibrations and impacts of the type a system may be exposed to in the field.

As with other semiconductor devices, circuit densities in add-on cards have increased significantly in recent years, such that the thermal management of these devices has become more challenging. In the past, the thermal management of add-on cards and other semiconductor devices was often addressed through the use of forced convective air cooling through the use of fans. However, fan-based cooling systems are undesirable due to the noise attendant to their use. Moreover, the use of fans also requires relatively large moving parts, and corresponding high power inputs, in order to achieve the desired level of heat transfer. Furthermore, while fans are adequate for providing global movement of air over electronic devices, they generally provide insufficient localized cooling to provide adequate heat dissipation for the hot spots that typically exist in a semiconductor device. In addition, the structure, arrangement and mounting mechanisms employed with ruggedized cards frequently interfere with the fluid flow of a thermal management system.

More recently, thermal management systems have been developed which utilize synthetic jet ejectors. These systems are more energy efficient than comparable fan-based systems, and also offer reduced levels of noise and electromagnetic interference. Systems of this type are described in greater detail in U.S. Pat. No. 6,588,497 (Glezer et al.). The use of synthetic jet ejectors has proven very efficient in providing localized heat dissipation, and hence can be used to address hot spots in semiconductor devices. Synthetic jet ejectors may be used in conjunction with fan-based systems to provide thermal management systems that afford both global and localized heat dissipation.

One example of a thermal management system that utilizes synthetic jet ejectors is illustrated in FIG. 1. The system shown therein utilizes an air-cooled heat transfer module 101 which is based on a ducted heat ejector (DHE) concept. The module utilizes a thermally conductive, high aspect ratio duct 103 that is thermally coupled to one or more IC packages 105. Heat is removed from the IC packages 105 by thermal conduction into the duct shell 107, where it is subsequently transferred to the air moving through the duct. The air flow within the duct 103 is induced through internal forced convection by a pair of low form factor synthetic jet ejectors 109 which are integrated into the duct shell 107. In addition to inducing air flow, the turbulent jet produced by the synthetic jet ejector 109 enables highly efficient convective heat transfer and heat transport at low volume flow rates through small scale motions near the heated surfaces, while also inducing vigorous mixing of the core flow within the duct.

While the systems disclosed in U.S. Pat. No. 6,588,497 (Glezer et al.) represent notable improvements in the art, there still exists a need in the art for a thermal management system applicable to add-on cards which provides optimal thermal management of these devices. There also exists a need in the art for such a thermal management system that is scalable with the addition of cards to, or the deletion of cards from, a system. There is further a need in the art for such a thermal management system which does not interfere with the placement of circuitry on the card, and which permits the thermal management system to be added as a later step in the manufacturing process after the circuitry on the card has been defined. There is also a need in the art for a means for minimizing the noise generated by the thermal management system. These and other needs are met by the devices and methodologies disclosed herein and hereinafter described.

BRIEF DESCRIPTION OF THE DRAWINGS

FIG. 9 is an illustration of a thermal management system which features dual heat sinks and associated jet actuators disposed on a mezzanine board;

FIG. 10 is an illustration of the system used for baseline testing in the experiments described herein;

FIG. 11 is a side view of FIG. 10;

SUMMARY OF THE DISCLOSURE

Figure 1:
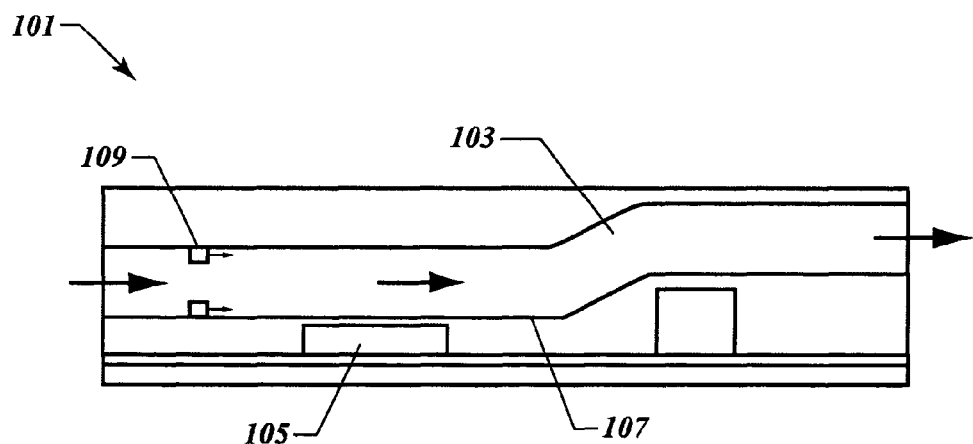
FIG. 1 is an illustration of a prior art thermal management system based on the use of synthetic jet ejectors.

In one aspect, a method for constructing a thermal management system is provided herein. In accordance with the method, a fan is provided which is adapted to provide a global flow of fluid through the device. A synthetic jet ejector is also provided which is adapted to augment the global flow of fluid over the surfaces of a heat sink. The ratio of the flow per unit time of the synthetic jet ejector to the flow per unit time of the fan is selected so as to achieve a desired level of heat dissipation.

In another aspect, a method for constructing a thermal management system is provided. In accordance with the method, a fan is provided which is adapted to provide a global flow of fluid through the device. A synthetic jet ejector is also provided which is adapted to augment the global flow of fluid over the surfaces of a heat sink, and the ratio of the flow per unit time of the synthetic jet ejector to the flow per unit time of the fan is selected so as to achieve a desired level of heat dissipation.

In a further aspect, a heat exchanger is provided which comprises a heat sink comprising a plurality of fins, and a synthetic jet ejector adapted to direct a plurality of synthetic jets between said fins. The synthetic jet ejector comprises an actuator disposed on one side of said heat sink which is in fluidic communication with a boom that extends across said fins, and wherein said boom is equipped with a plurality of apertures.

In still another aspect, an add-on card is provided herein which comprises a card substrate, a heat sink mounted on a first surface of said card substrate, and a synthetic jet ejector disposed on said card substrate and being adapted to direct a plurality of synthetic jets toward said heat sink.

In yet another aspect, a synthetic jet ejector is provided which comprises a housing having a first portion which houses said first and second electromagnetic actuators, and a manifold in open communication with said housing portion. The manifold is partitioned into first, second and third channels that are in open communication, respectively, with the first, second and third sets of apertures, and the number of apertures in said manifold is 4n, wherein n is an integer, and wherein $n \geq 1$.

In a further aspect, a heat exchanger is provided which comprises a heat sink comprising a plurality of fins, and a synthetic jet ejector adapted to direct a plurality of synthetic jets between the plurality of fins. The plurality of fins are essentially parallel, and include a first set of fins and a second set of fins. The centers of the first set of fins are arranged along a first axis, and the centers of said second set of fins are arranged along a second axis which is not collinear with the first axis.

In another aspect, a heat exchanger is provided which comprises a heat sink comprising a plurality of fins, and a synthetic jet ejector adapted to direct a plurality of synthetic jets between the fins. The plurality of fins are essentially parallel, and include a first set of fins and a second set of fins. A first edge of each member of said first set is disposed in a first plane, and a second edge of each member of said second set is disposed in a second plane distinct from said first plane.

In still another aspect, a heat exchanger is provided which comprises a heat sink comprising a plurality of fins, and a synthetic jet ejector adapted to direct a plurality of synthetic jets between said fins. The synthetic jet ejector comprises a first actuator disposed on a first side of said heat sink which is in fluidic communication with a first boom that extends across said fins, and the boom is equipped with a plurality of apertures.

In yet another aspect, a device is provided which comprises (a) a duct having a heat source and a heat sink disposed therein, said heat sink comprising a plurality of fins; (b) a fan adapted to generate a fluidic flow through said duct; and (c) a synthetic jet ejector adapted to augment said fluidic flow through said heat sink through the creation of at least one synthetic jet.

These and other aspects of the present disclosure are described in greater detail below.

DETAILED DESCRIPTION

It has now been found that the aforementioned needs can be addressed through the provision of one or more synthetic jet ejectors, in combination with a heat exchanger, to cool the components on ruggidized cards and other devices. The synthetic jet ejectors can be registered to the longitudinal channels of the heat exchangers to ensure maximum heat dissipation.

It has also been found that heat dissipation can be maximized through suitable placement and orientation of mezzanine cards. In particular, it has been found that the percentage gain in heat dissipation is correlated to the percentage gain in velocity due to the jet.

It has further been found that, in many embodiments of a fan/synthetic jet combination thermal management system, the percentage gain in heat dissipation due to the jets is related to the ratio between the jet CFM and the baseline CFM due to the fan. Using these correlations, new actuator designs may be developed which allow for much higher improvements in heat dissipation augmentation by the synthetic jets.

It has also been found that the aforementioned needs can be met through the provision of an add-on card which is provided with a dedicated thermal management system comprising a synthetic jet ejector and a heat sink. The synthetic jet ejector, which preferably runs off of the power source that powers the card, is preferably attached to the card by way of one or more rubber flanges, which serve to dampen vibrations while also ensuring proper orientation of the synthetic jet ejector on the card and proper alignment with the heat sink. In some embodiments, the synthetic jet ejector may be equipped with a plurality of electromagnetic actuators that are constructed to reduce or eliminate acoustic emissions through destructive interference.

These and other aspects of the teachings and methodologies contained herein are described in greater detail below.

Figure 2:
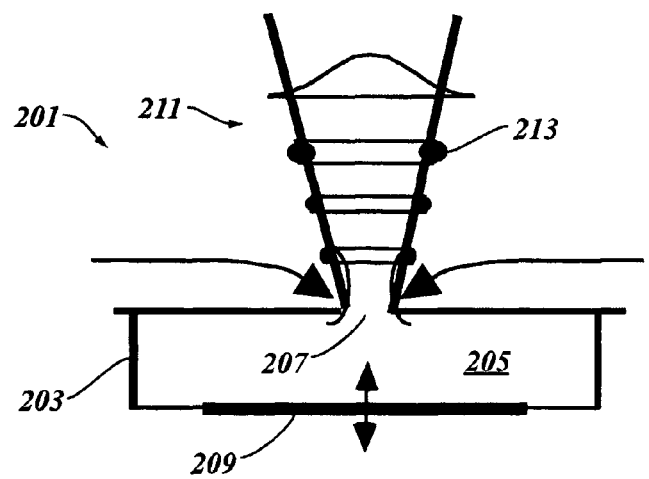
FIG. 2 is an illustration of a synthetic jet ejector and the synthetic jet created by it.

FIG. 2 illustrates one particular, non-limiting embodiment of a synthetic jet ejector useful in the systems and methodologies described herein. The synthetic jet ejector 201 comprises a housing 203 which encloses a cavity 205 and which has an aperture 207 therein. The cavity 205 is equipped with a diaphragm 209 that is built into one of the cavity walls.

Synthetic jets 211 are typically formed by the periodic suction and ejection of fluid out of the aperture 207 in the otherwise sealed cavity 205 by the time periodic motion of the diaphragm 209. These synthetic or "zero-mass-flux" jets 211, which are dominated by vortices 213, require no mass addition to the system, and thus provide a means of efficiently directing airflow across a heated surface. The synthetic jet ejector 201 can be conveniently integrated within that surface without the need for complex plumbing. Local heat transfer is substantially enhanced by small-scale motions induced by the primary vortex-dominated jet flow through mixing of the wall thermal boundary layers with the secondary flow. Moreover, the Nusselt numbers for synthetic jet ejector flows within high aspect ratio ducts is 6-8 times higher than for comparable conventional turbulent flow. Thus, the synthetic jet ejector 201 yields higher heat transfer at low flow rates and is well suited for low-profile applications.

In the devices and methodologies described herein, synthetic jets may be used advantageously in combination with ducts. Since synthetic jets are formed by the entrainment of ambient air, synthetic jet flows within a duct can enhance the jet ejector action (that is, a primary jet driving a secondary flow), thus resulting in significant induced secondary flow. Also, the synthetic jets can support sufficiently high pressure drops to allow flow at acceptable speeds through heat sinks which can be scaled for increased or reduced power. Unlike miniature fans, integrated synthetic jets are ideally suited for low-profile, high aspect ratio cooling applications.

In the devices and methodologies described herein, synthetic jets may also be used advantageously in the control of mean flows. For heat sink applications, flow bypass is a phenomenon that results in a dramatic reduction in the amount of flow entering a heat sink due to pressure drop in the heat sink. Increasing fan speeds to enable a large flow rate in the heat sink is an ineffective means of improving performance, since flow bypass varies non-linearly with the fan speed. Synthetic jets can be used to enable control of the inlet flow to reduce flow bypass, while simultaneously breaking up the local boundary layers on the walls of the heat sink.

Figure 3:
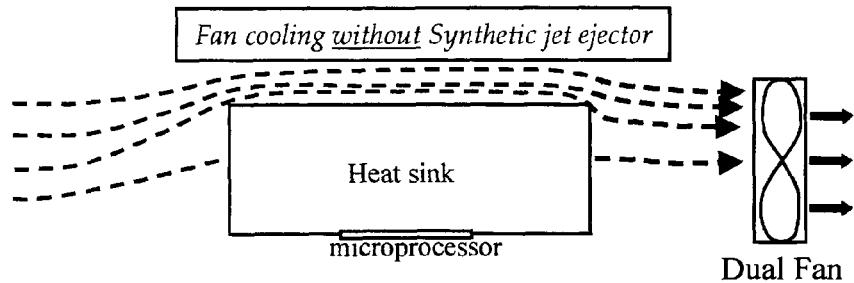
FIG. 3 is an illustration of the heat sink bypass effect in a thermal management system for a mean unducted flow.
Figure 4:
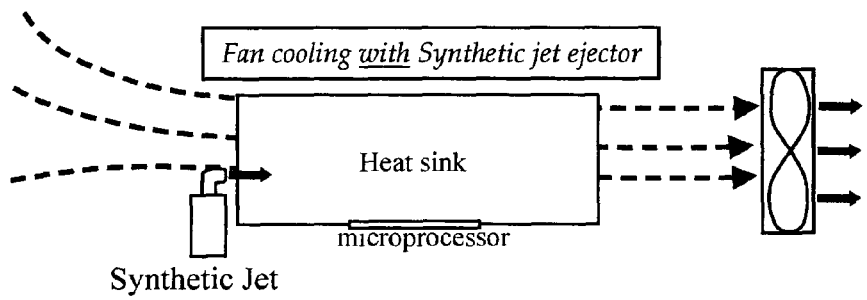
FIG. 4 is an illustration of the use of a synthetic jet to control the heat sink bypass effect in a thermal management system for a mean unducted flow.

FIGS. 3 and 4 demonstrate the flow bypass control achievable with synthetic jets in the systems and methodologies depicted herein. In the first system 301 depicted in FIG. 3, an extruded heat sink 303 was cooled with a dual fan 305 without a synthetic jet. In the second system 321 depicted in FIG. 4, an extruded heat sink 323 was cooled with a dual fan 325 with a synthetic jet ejector 327. As seen in FIG. 3, in the system 301 lacking synthetic jets, a majority of the flow bypasses the heat sink 303. In thermal management of servers (or other environments with existing mean airflows), flow bypass of global fluid flow over and around heat sinks results in a significant reduction in the amount of flow that enters the heat sink 303 due to pressure drop in the heat sink. Additionally, the presence of other blockages upstream of the heat sink 303 can impede the flow of cool fluid to the heat sink. Increasing fan speeds to enable a large flow rate in the heat sink is an ineffective means of improving performance since, as noted above, flow bypass varies non-linearly with the fan speed. Indeed, it is found that flow bypass typically increases with fan speed.

By contrast, in the system 321 of FIG. 4 which is equipped with synthetic jets 327, the synthetic jet ejector controls inlet flow to reduce flow bypass by enabling controlled re-entrainment of the inlet flow while simultaneously breaking up the local boundary layers on the walls of the heat sink. As a result, there is a marked reduction (measured at 24% in some embodiments) in thermal resistance of the device. Conversely, for the same heat dissipation, fans could be operated at 5V instead of 12 V, resulting in lower fan noise and higher fan reliability. Hence, the system 321 of FIG. 4 can be implemented with a smaller, less expensive fan. Moreover, the system 321 of FIG. 4 provides increased heat transfer coefficients and flow rates, and thus permits the use of higher power processors. Such a system may also be implemented as a retrofit solution, and can be hot swappable.

Figure 5:
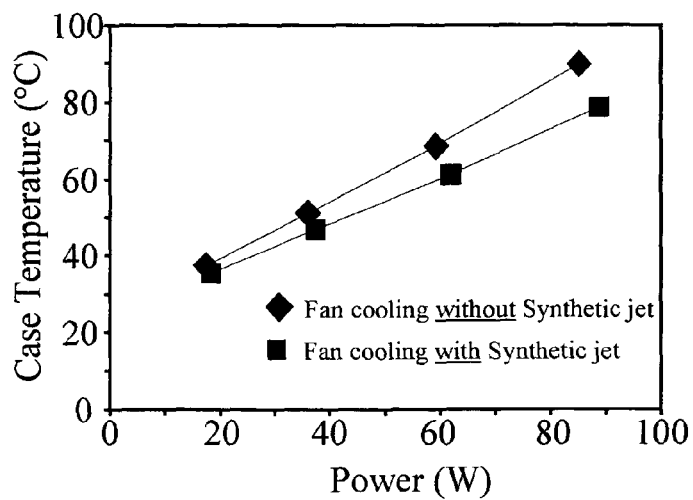
FIG. 5 is a graph of case temperature as a function of power.

FIG. 5 is a graph illustrating case temperature (in ° C.) as a function of fan power (in W) for the two systems depicted in FIGS. 3 and 4. As seen therein, the resultant reduction in thermal resistance achieved by the presence of a synthetic jet ejector 327 was found to be 24%.

Figure 6:
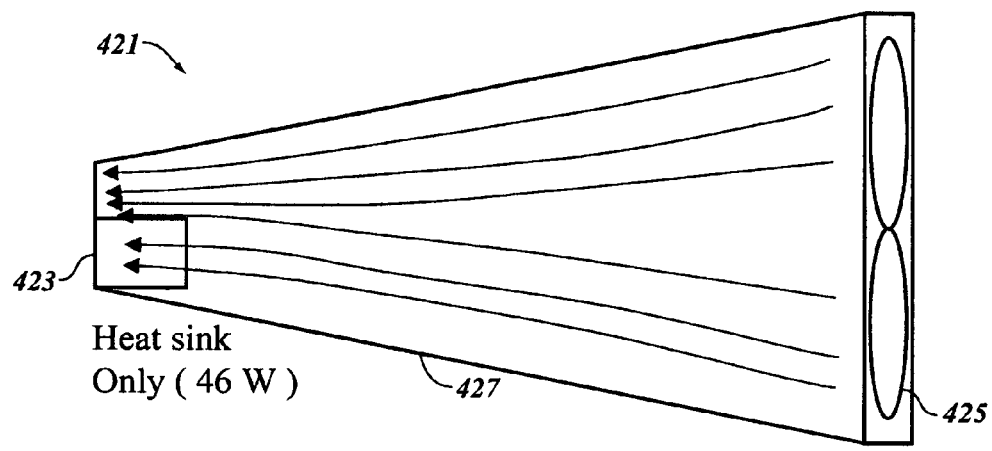
FIG. 6 is an illustration of the heat sink bypass effect in a thermal management system for a partially ducted flow.
Figure 7:
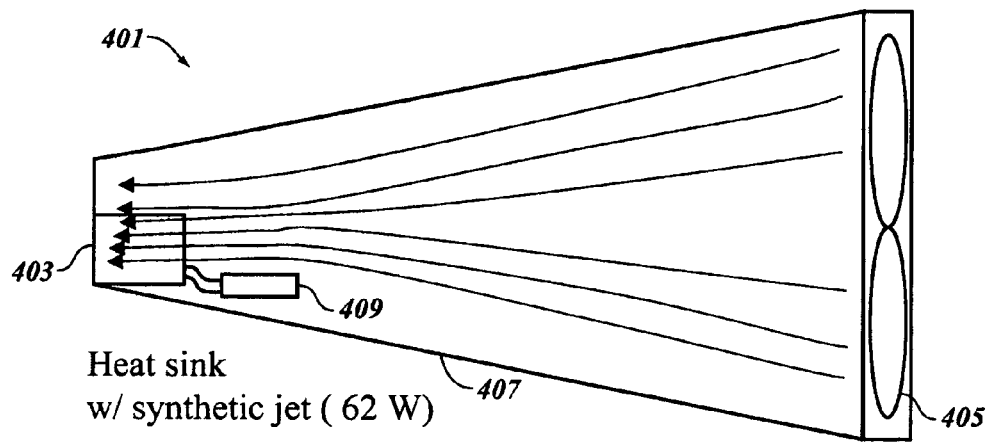
FIG. 7 is an illustration of the use of a synthetic jet to control the heat sink bypass effect in a thermal management system for a partially ducted flow.

The results illustrated in FIG. 5 are even more dramatic for ducted or partially ducted fan-cooled heat sinks equipped with synthetic jets. FIGS. 6 and 7 illustrate one particular, non-limiting embodiment of such a system. The system 401 depicted in FIG. 7 comprises a heat sink 403 in fluidic communication with a fan 405 by way of a duct 407. The system 401 is equipped with a synthetic jet ejector 409 to augment localized fluid flow at the heat sink 403. By contrast, the system 421 of FIG. 6 also comprises a heat sink 423 in fluidic communication with a fan 425 by way of a duct 427, but lacks a synthetic jet ejector.

Figure 8:
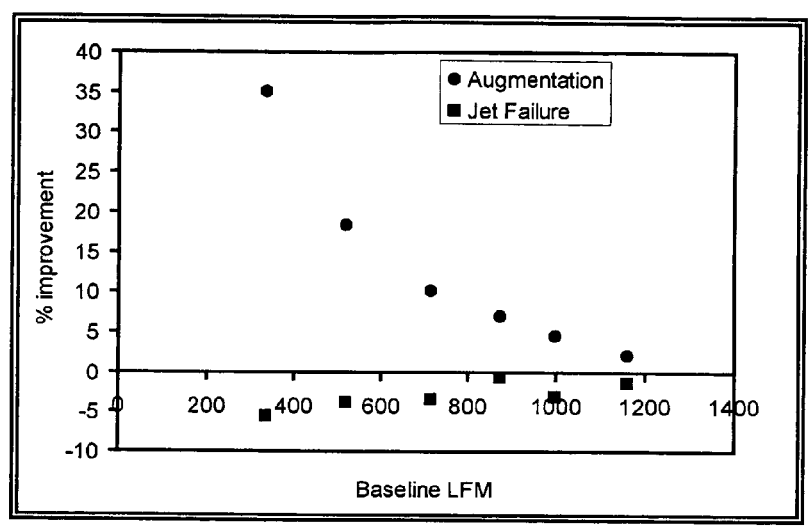
FIG. 8 is a graph of the percent improvement in heat dissipation as a function of baseline fluid flow rate.
Figure 12:
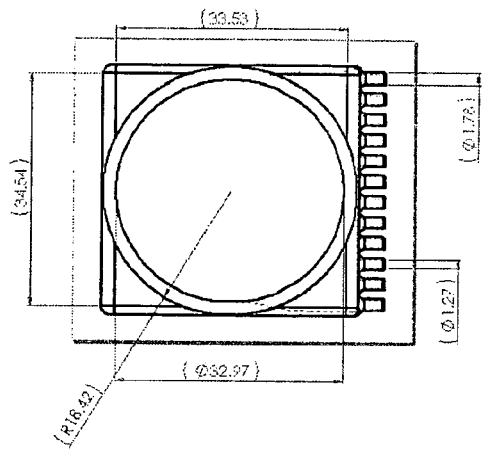
FIG. 12 is a top view of the synthetic jet ejector utilized in the system depicted in FIG. 10.
Figure 13:
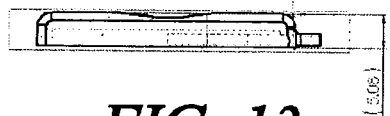
FIG. 13 is a side view of the synthetic jet ejector utilized in the system depicted in FIG. 10.
Figure 14:
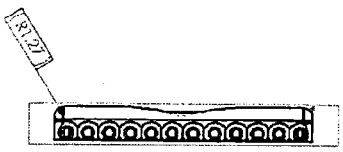
FIG. 14 is a front view of the synthetic jet ejector utilized in the system depicted in FIG. 10.
Figure 15:
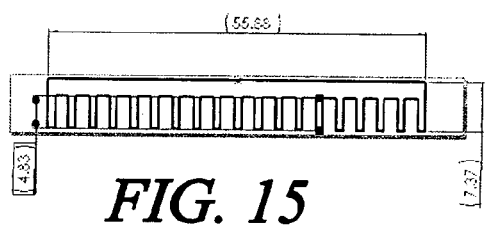
FIG. 15 is a front view of the heat sink utilized in the system depicted in FIG. 10.
Figure 16:
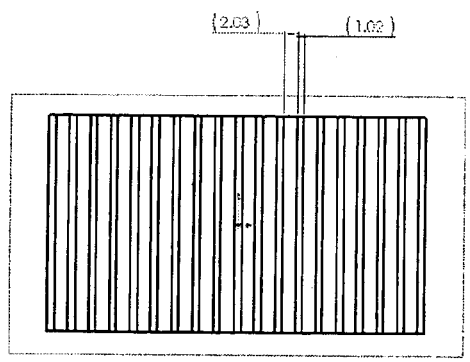
FIG. 16 is a top view of the heat sink utilized in the system depicted in FIG. 9.
Figure 17:
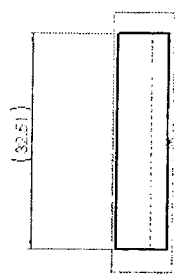
FIG. 17 is a side view of the heat sink utilized in the system depicted in FIG. 10.
Figure 18:
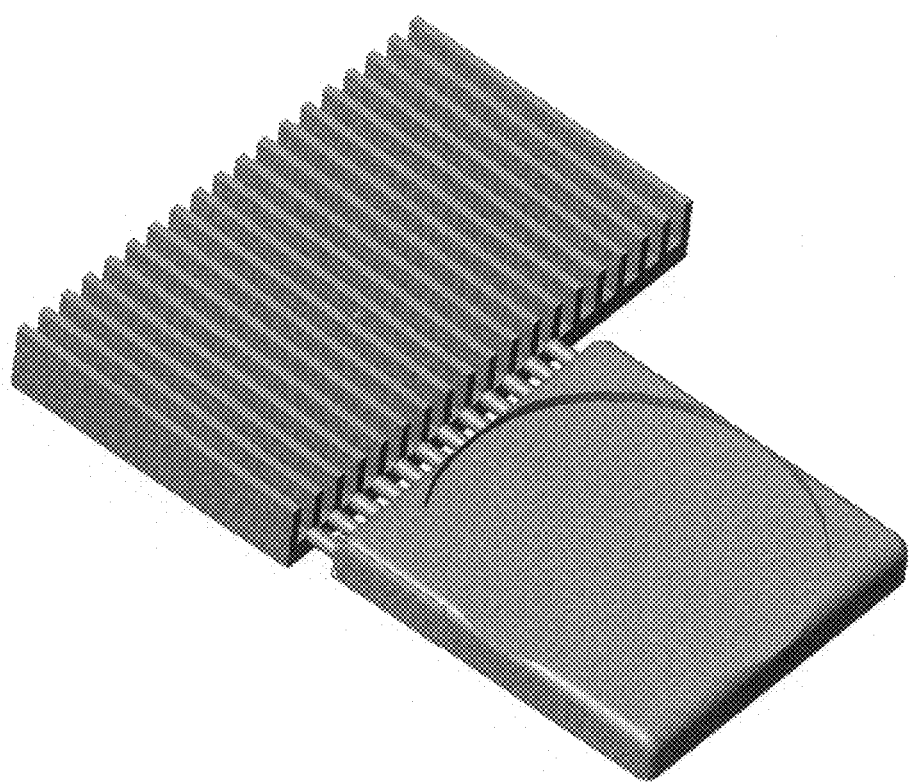
FIG. 18 is a perspective view of the synthetic jet ejector of FIG. 12 shown registered with the channels of the heat sink of FIG. 16.

FIG. 8 illustrates the results of a test that was conducted on the two systems of FIGS. 6-7. A partially ducted, fan-cooled, heat sink with a flow of 2 m/s per channel was tested with and without a synthetic jet. At a case to ambient temperature rise of 35° C., the jet-cooled case dissipated 35% more heat than the fan-only case at a mean flow of 300 lfm (linear feet per minute), and dissipated 15% more heat than the fan-only case at a mean flow of 600 lfm. Moreover, it was also found that, in the case of jet failure, there is a negligible drop in the heat dissipated due to the blockage induced by the jets.

FIGS. 9-11 illustrate a particular, non-limiting embodiment of a device made in accordance with the teachings herein. The device 501 comprises a main card 503 with a ruggidized mezzanine card 505 mounted thereon. First 507 and second 509 synthetic jet ejectors are provided on the mezzanine card, and are registered, respectively, with first 511 and second 513 heat sinks (the synthetic jet ejectors and associated heat sinks are shown in greater detail in FIGS. 12-18). In some applications, the first 511 and second 513 heat sinks may be mounted on top of a chip, central processing unit (CPU), or other such heat source. The main card 503 is equipped with first 515 and second 517 blowers or fans to provide a global flow of fluid through the device.

The device depicted in FIGS. 9-11 was utilized to run a number of baseline tests. In those tests, a bare Dy4® circuit card (available commercially from Curtis Wright Controls, Charlotte, N.C.) was used as the base card with dummy blocks and heaters representing the components on the card. The mean flow was provided by a bank of SUNON® power motor blowers placed at the end of the card furthest away from the heaters. Two 1"×1" adhesive strip heaters from Minco, Inc. (Minneapolis, Minn.) were used to provide the heat source. The heaters were adhered to the back of heat sinks that were then bonded to two insulating ceramic blocks. The ceramic blocks were bonded on the board directly. The base of the heat sinks housed a thermocouple that was used to measure the heater temperature. Velocity through the heat sink was measured using a miniature Pitot probe. The synthetic jet modules were placed on two dummy blocks representing components on the board.

It is to be noted that, in the actual device used for the tests, synthetic jets were directed over only two-thirds of the heat sink. This was for simplicity in the design of the synthetic jet ejector. The height between the tip of the fins and the top card was 2.5 mm. The card to card spacing was 16 mm, while the dimensions of each of the synthetic jet actuators was 36×36×5 mm. All velocities were measured in the exit plane of the heat sink. The heat sinks were made of aluminum 6061 (k=159 W/m.K). The heat sink geometry was selected on the basis of a Dy4® report. The other components that were used in the test setup are listed in TABLE 1.

TABLE 1

Test Component Information

| Item | Manufacturer | Specifications | Part No. |
|---|---|---|---|
| Actuators (mini speakers) | Kingstate | 36 mmΦ × 5 mm 8 Ohm, 0.15 W | KVM-36008 |
| Minco ® heaters | Minco | 1" × 1" | HK5163R17.4L12B |
| Thermocouples | Omega | Type K, 36" L, 30 gauge | 5TC-TT-K-30-36 |
| Blowers | Sunon | 35 mm × 7 mm, 1.6 CFM, 5 VDC | GB0535ADB1-8 |

The case temperature was monitored using a K-type thermocouple having a bead of 0.25 mm diameter embedded in the center of the copper heat spreader. The air temperature was measured using a thermocouple that can be traversed along the length of the center channel. The thermocouple readings were digitized using a 12-bit A/D board (National Instruments AT-MIO-16DE10), and cold-junction compensation was performed using an IC-sensor embedded in the shielded I/O connector block (SCB-100), which is used as the interface between the A/D board and the thermocouple wires. The measurements have a resolution of 0.024% of full scale, resulting in a temperature resolution of 0.03° C., since the temperature limits were set to 120° C.

The maximum error for each temperature reading was no greater than ±1.5° C., which corresponds to an error of ±1.5-6% for the temperature range associated with the reported data (±6% error for an ambient temperature reading of 25° C. and ±1.5% for a case temperature reading of 100° C.). The flow at the exit of the heat sink was measured using a Pitot static probe having an outer diameter of 0.8 mm, which results in 1% flow blockage based on the exit area of each channel. The Pitot probe was connected to a 0.2 Torr Barocel pressure transducer with a full range output of 1.0 V, and the voltage output was digitized by the same AID board described above resulting in a resolution of 0.1 m/s and an accuracy of ±0.7% in the velocity measurements.

Figure 19:
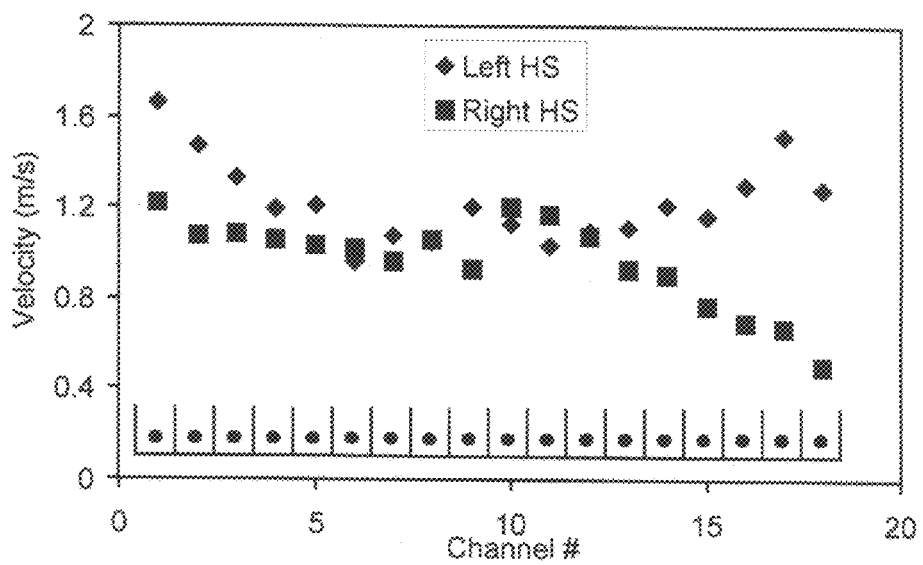
FIG. 19 is a graph depicting the channel to channel fluid velocity variation in a heat sink.

The baseline test case for all the comparisons is the fan-only case, where the jets are not placed in the path of the overall mean flow. The graph of FIG. 19 shows the distribution in the velocity created by the bank of SUNON® power motor blowers across the different channels of the heat sink. The velocity distribution across the heat sinks (measured in the exit plane of the heat sink) was found to be somewhat non-uniform, with the average across the heat sink being 1.22 m/s ($\sigma$=0.18 m/s) for the left-hand side and being 0.96 m/s ($\sigma$=0.14 m/s) for the right-hand side. The average velocity in the channels where the jets will be directed (12 out of the 18 channels) was found to be 1.18 m/s ($\sigma$=0.19 m/s) for the left-hand side and 1.07 m/s (σ=0.21 m/s) for the right-hand side. The data on the left-hand side will be used for all comparisons that follow. The overall flow rate through the heat sink was determined to be 0.29 CFM. The non-uniformity is related to the skewing of the flow created by the fan with respect to the axis of rotation.

Next, the effect of synthetic jets on the velocities in the heat sink was investigated. The effect of synthetic jets was studied for the following four cases:
1. Baseline, jets removed, fan on.
2. Jets in place, fan on, jets off.
3. Jets in place, fan off, jets on.
4. Jets in place, fan on, jets on.

Figure 20:
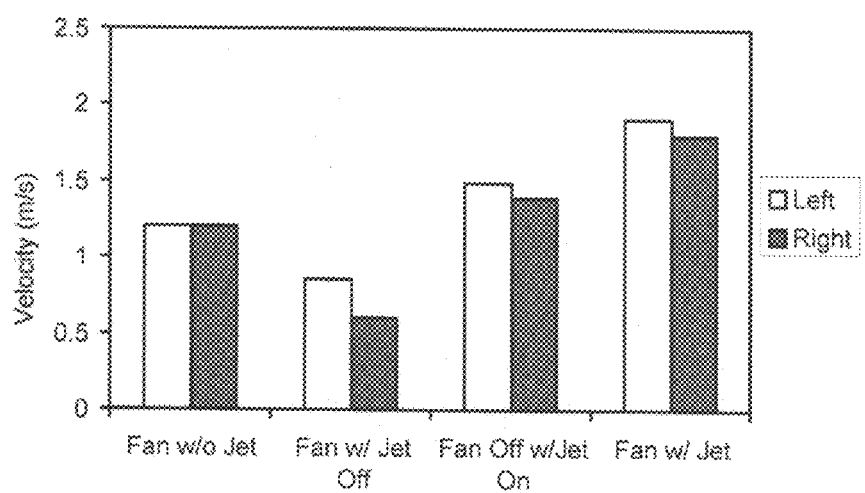
FIG. 20 is a graph of average fluid velocity measured in the left and right heat sinks of the device of FIG. 9.

Cases 1 and 4 are of interest for comparison. Case 2 represents the scenario of jet failure, and Case 3 represents the scenario of fan failure. FIG. 20 compares the velocity through the heat sinks for the different cases. As seen from Cases 1 to 4, the presence of the jets increases the velocity within the channels of the heat sink: for the Left Heat Sink there is a 59% increase in velocity (1.18 to 1.91 m/s) and for the Right Heat sink there is a 50% increase in velocity (1.07 to 1.80 m/s). The increase in velocity is an effect of flow re-entrainment by the jets. Additionally, its seen that for Case 2 (representing jet failure) the blockage presented by the jets results in a drop in heat sink velocity by 29%. The case of fan failure appears to be less of an issue in the heat sink velocity since, in Case 3, the heat sink velocity has gone up by 24%. It will be seen in the following sections that the case of fan failure is worse than jet failure from a heat transfer perspective, since the fan also cools the nearby board components which heat up due to conduction.

Figure 21:
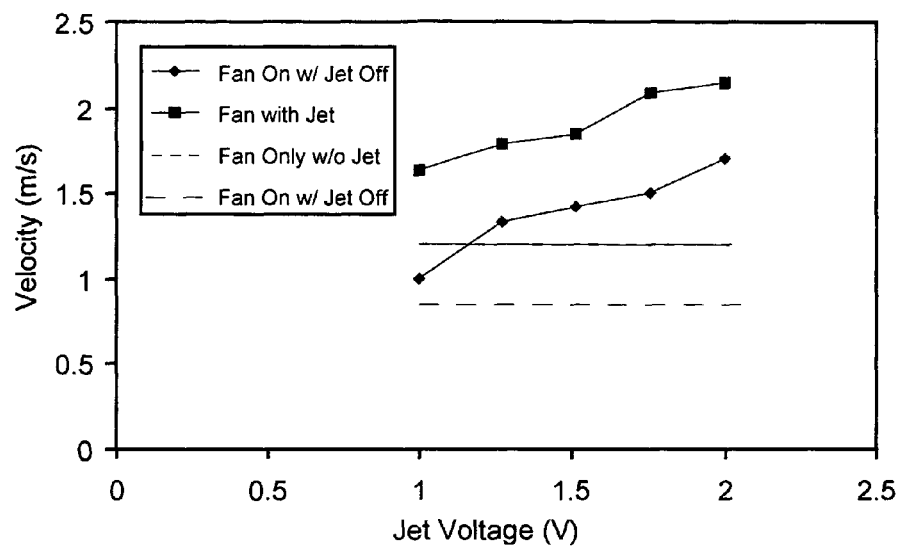
FIG. 21 is a graph of fluid velocity as a function of jet voltage.

FIG. 21 shows the variation of the heat sink velocity with jet voltage, i.e., strength. The channel velocity increases with jet voltage, going from 35% above the fan driven velocity at 1V, to 79% above the fan driven velocity at 2V. As seen before, presence of the inactive jet module lowers the velocity within the heat sink, since the jet module represents a blockage upstream of the heat sink.

Figure 22:
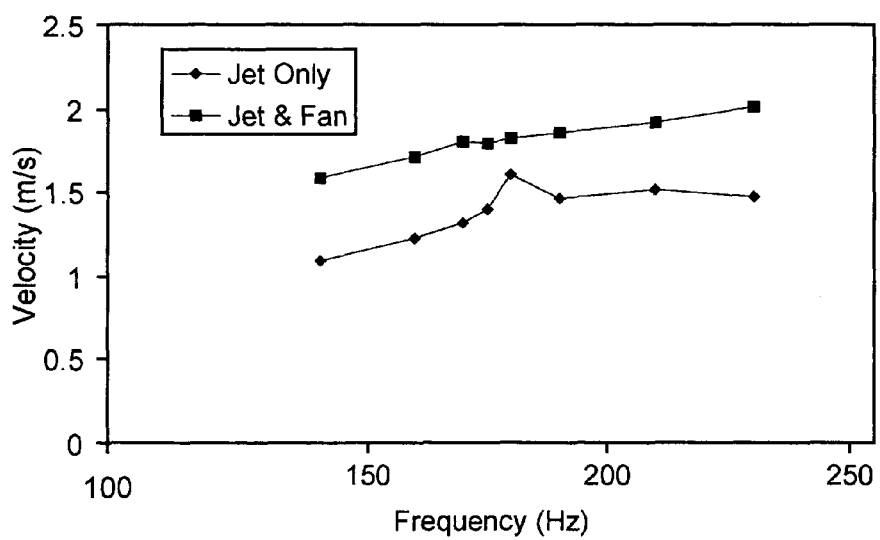
FIG. 22 is a graph of fluid velocity as a function of actuator frequency.

FIG. 22 shows the variation in heat sink velocity with jet frequency. The jet only configuration has a small resonance at ~175 Hz, while the presence of the fan flow eliminates the resonance. In the latter case, the velocity increases continuously with frequency. An operating frequency of 190 Hz was chosen, based on audible noise for the heat transfer tests.

Figure 23:
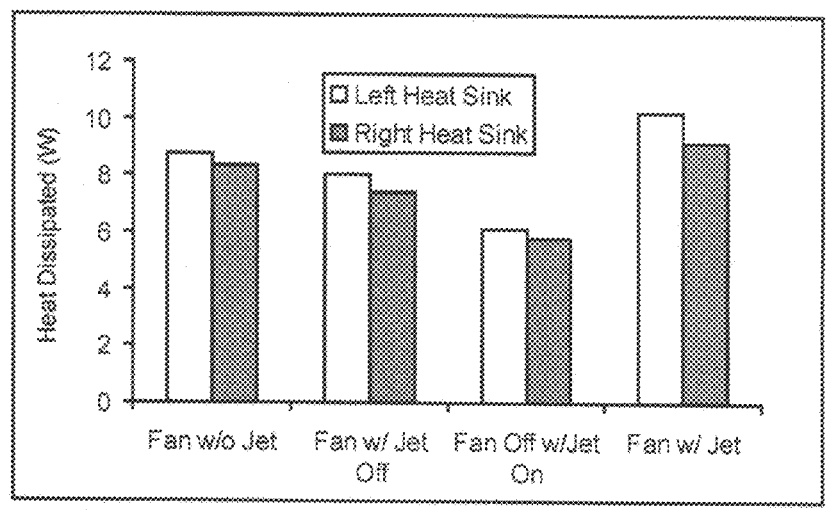
FIG. 23 is a graph of the amount of heat dissipated for four possible operating states of the fans and synthetic jet actuators in a device.

FIG. 23 shows the heat dissipated by the heaters under the different conditions described above. All the data was obtained at a fixed jet frequency of 190 Hz. The baseline test case of "Fan Only" dissipates about 8.7 W. The case of jet failure (i.e. jet off) results in a drop of 8.3% in heat dissipation due to the blockage. The case of fan failure (i.e., jets on and fan off) results in the least amount of heat, since the jets are a local cooling device and do not cool the adjacent board and other components heated by conduction. Finally, the test case of the "fan and jet" dissipates ~10.2 W, a 17% improvement over the "Fan Only" case. Noting that the jets are active only over 12 out of the 18 channels of the heat sink, it may be deduced that the heat dissipation for a jet module spanning the entire length of the heat sink would likely be about 11 W, which represents a 25% improvement over the "Fan Only" case.

Figure 24:
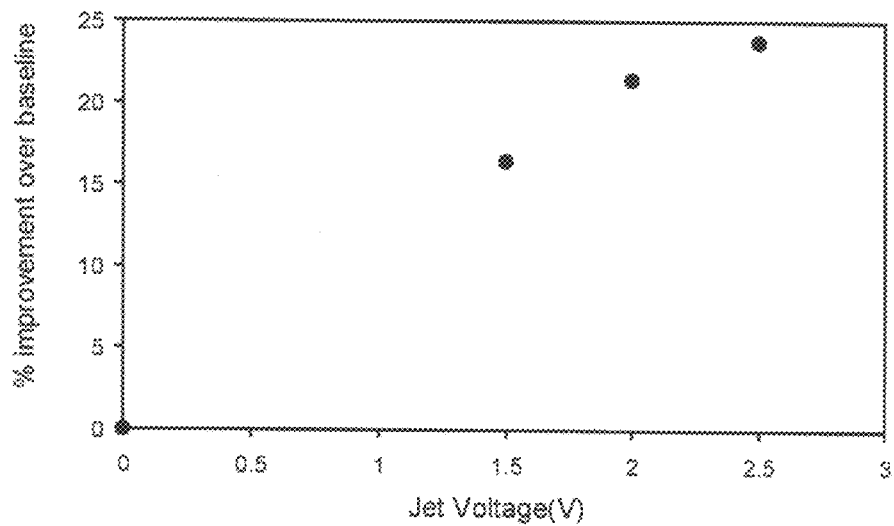
FIG. 24 is a graph of the % improvement in heat dissipation over baseline (fan only) heat dissipation as a function of actuator voltage.

FIG. 24 show the effect of varying the voltage to the jet module, where the heat dissipation improvement increases from 16% to 24% as the jet voltage varies from 0 to 2.5V. Note that the improvement for a jet spanning the entire heat sink would vary from 25% to 36% for the same input voltage range. The limitation on the jet performance is primarily due to the operating frequency chosen and the characteristics of the off-the-shelf actuator. It will be shown below that significantly higher improvements can be expected with a properly designed actuator.

Figure 25:
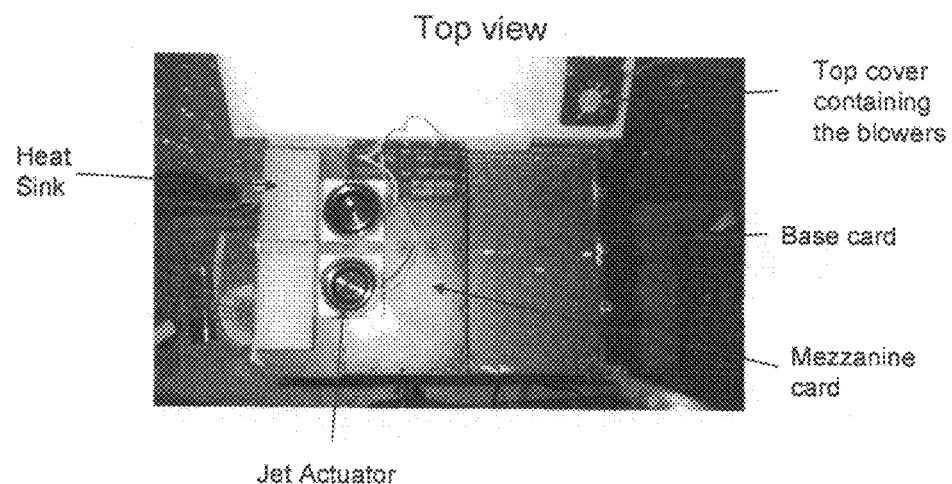
FIG. 25 is a top view of the experimental set-up used for the experiments described herein involving tests conducted with a mezzanine card.
Figure 27:
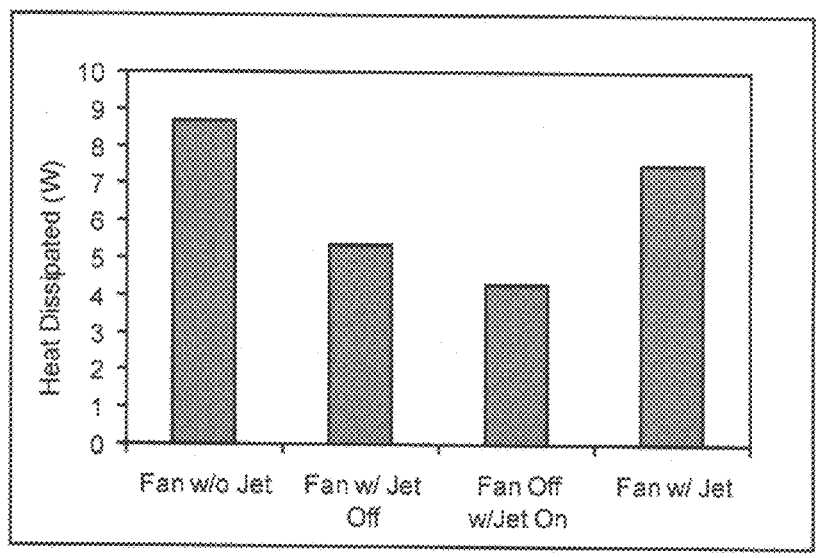
FIG. 27 is a graph of the amount of heat dissipated for four possible operating states of the fans and synthetic jet actuators in a device in a mezzanine card configuration of the type illustrated in FIG. 9.

The base card has the ability to add on a mezzanine card as shown in FIG. 25. The mezzanine card plugs into two connectors provided on the base card. The placement of the mezzanine card within the constraints shown prevents the jets from being registered to the channels of the heat sink as desired. Since there is virtually no space between the mezzanine card and the dummy blocks on which the jet module were placed in the baseline case, the jet modules were positioned on the mezzanine card. The picture below also shows the top cover, which contains the blowers that provide the mean flow. With the top cover on, the flow from the fans was almost entirely blocked by the arrangement of the components, including the mezzanine card and the jet modules. This is reflected in the heat dissipation as shown in FIG. 27.

Significantly, the baseline test case of "Fan Only" dissipates about 8.7 W, implying that the mezzanine card has an insignificant effect in flow blockage. However, placement of the jet module (non-operational) lowers the heat dissipation by 38% due to the blockage (compared to 8% with only base card). The jet module alone dissipates the least amount of heat, since it is a local cooling device and does not cool the adjacent board (which is also heated up due to conduction, as in the baseline case). Finally, the test case of the "fan and jet" dissipates 7.5 W, a 13% drop from the baseline.

Figure 26:
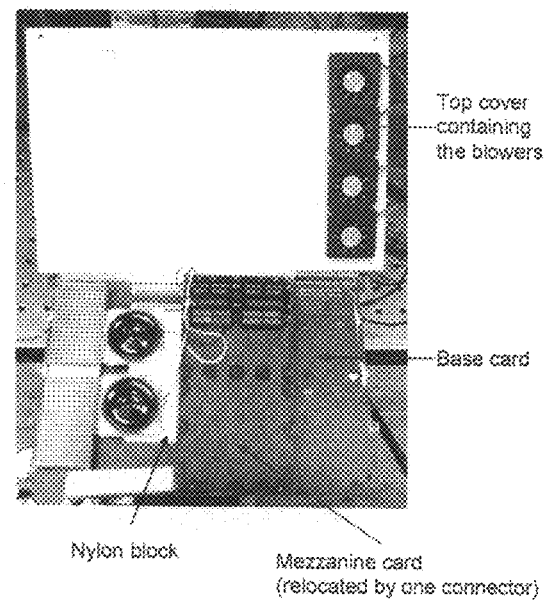
FIG. 26 is a top view of the experimental set-up used for the experiments described herein involving tests conducted with a mezzanine card in an alternate location.

An alternate mezzanine card placement strategy was attempted to test the effect of the mezzanine card when the jet modules themselves are not relocated. This was accomplished by moving the mezzanine card back by one connector as shown the FIG. 26. This helped maintain the Z-location of all components the same as the baseline test case. This figure clearly shows the location of the bank of blowers that provide the mean flow.

Figure 28:
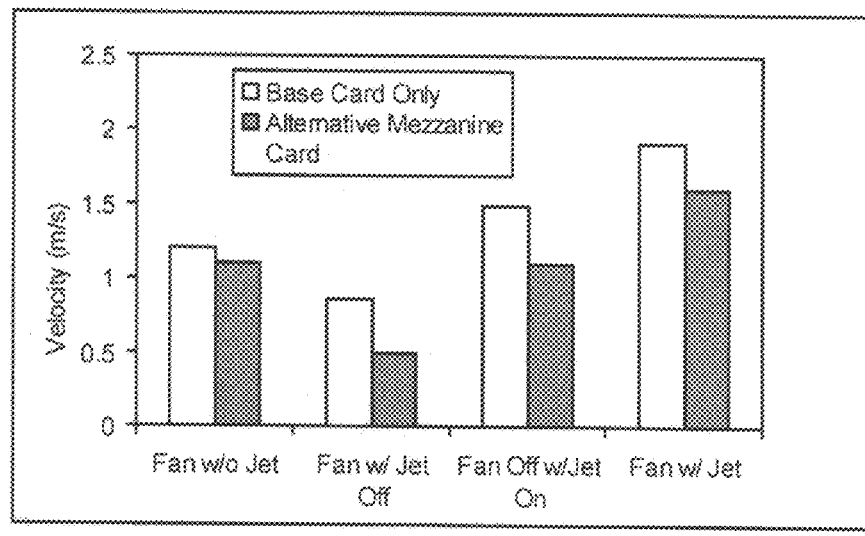
FIG. 28 is a graph of fluid flow velocity of the base card only and base card with mezzanine card for four possible operating states of the fans and synthetic jet actuators in a device in a mezzanine card configuration of the type illustrated in FIG. 25.

FIG. 28 shows the comparison between two cases: Base Card Only and Alternative Mezzanine Card Location. The presence of mezzanine card reduces channel velocities minimally for each test condition; velocity reduction is about 8% for the baseline case (Fan without jet), and is higher for other test conditions.

Figure 29:
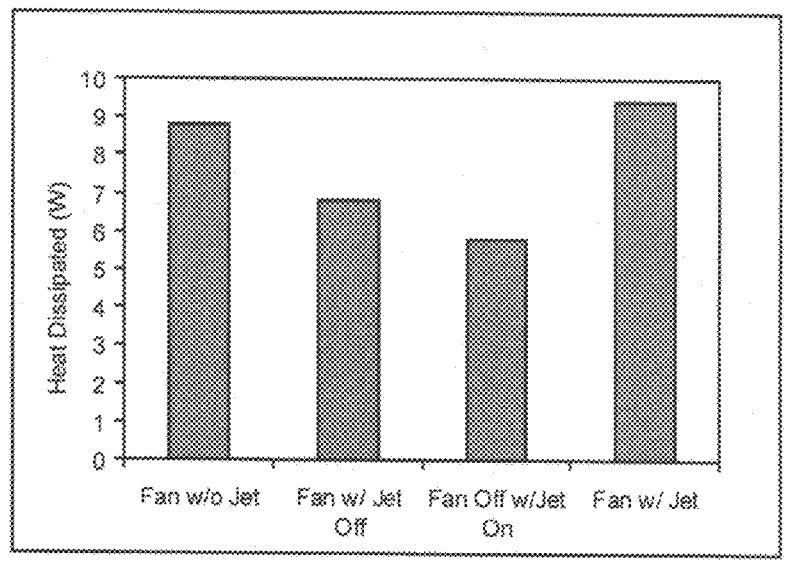
FIG. 29 is a graph of fluid flow velocity for four possible operating states of the fans and synthetic jet actuators in a device in a mezzanine card configuration of the type illustrated in FIG. 25.

FIG. 29 shows the heat dissipation performance for the alternative mezzanine card location. The baseline test case of "Fan Only" dissipates about 8.7 W (mezzanine card has insignificant effect). Placement of the jet module (non-operational) lowers the heat dissipation by 22% due to the blockage (compared to 8% with only base card). As before, the jet module alone dissipates the least amount of heat since it is a local cooling device and does not cool the adjacent board, which is heated up due to conduction. Finally, the test case of the "fan and jet" dissipates ~9.5 W, a 6% improvement from the baseline case. Extrapolating this to the case where the jets span the entire length of the heat sink, this corresponds to a 14% improvement in heat dissipation.

Figure 30:
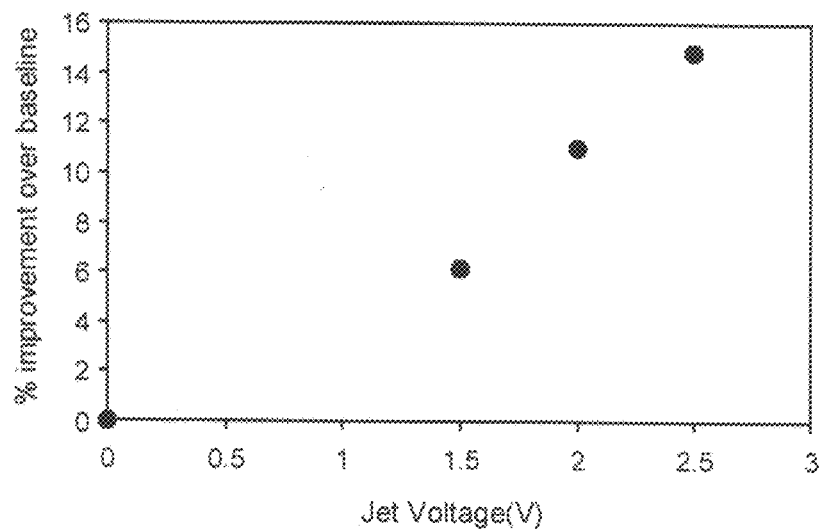
FIG. 30 is a graph of the % improvement in heat dissipation over baseline (fan only) heat dissipation as a function of actuator voltage in a mezzanine card configuration of the type illustrated in FIG. 25.

FIG. 30 shows the effect of increasing the jet voltage in heat dissipation enhancement, which varies from 6% at 1.5V to 15% at 2.5V. For a jet module spanning the entire heat sink, this corresponds to a 13% to 24% increase in heat dissipation above the baseline case.

Figure 31:
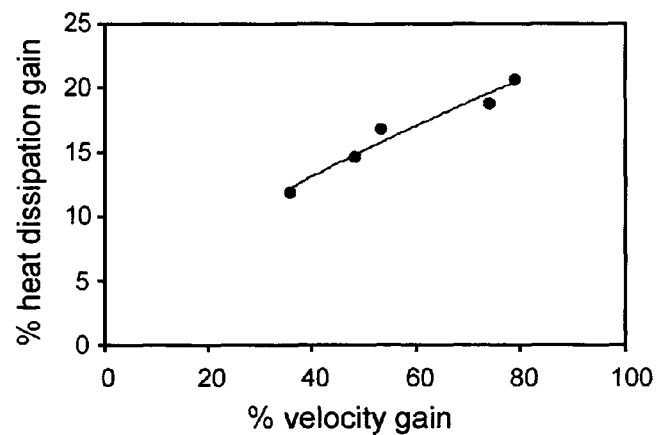
FIG. 31 is a graph of the % improvement in heat dissipation in a heat sink over baseline (fan only) heat dissipation as a function of % velocity gain in the heat sink.
Figure 32:
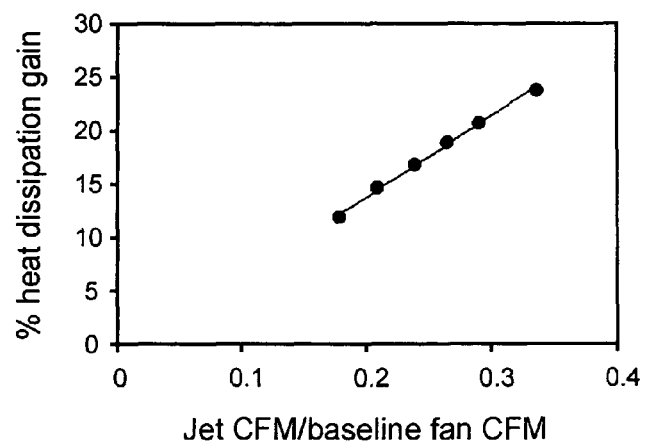
FIG. 32 is a graph of the % improvement in heat dissipation in a heat sink over baseline (fan only) heat dissipation as a function of the jet to fan CFM ratio.

FIG. 31 shows the correlation of the gain in heat dissipation with gain in flow velocity through the heat sink due to the jets. The velocity gain within heat sink channels due to synthetic jets varies from 25 to 80%. In that range, the heat dissipation gain due to the jets varies from 13 to 24%. Also, as shown in FIG. 32, it appears that within the geometric and operation parameters of the current test the heat dissipation gain due to the synthetic jets varies almost linearly as the ratio between the jet CFM and the baseline fan driven CFM within the channel.

Figure 33:
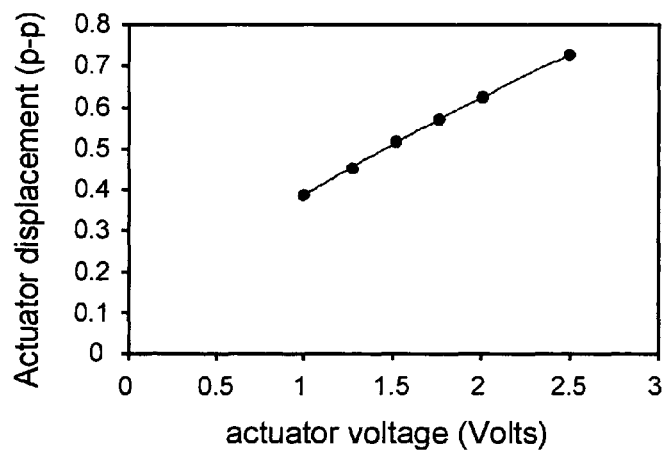
FIG. 33 is a graph of actuator displacement as a function of actuator input voltage.
Figure 34:
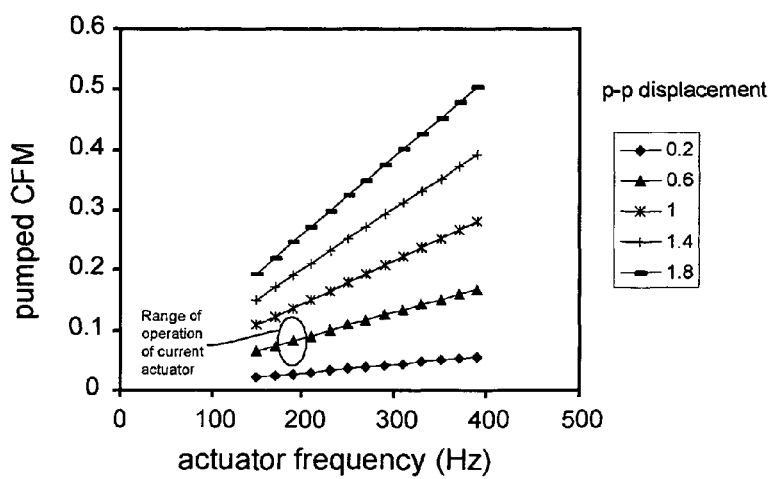
FIG. 34 is a graph of actuator output (flow rate) as a function of actuator displacement and frequency.
Figure 35:
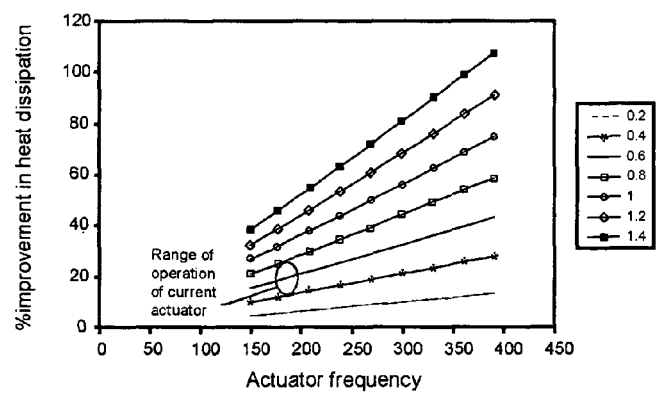
FIG. 35 is a graph of the % improvement in heat dissipation in a heat sink over baseline (fan only) heat dissipation as a function of actuator operating frequency.
Figure 36:
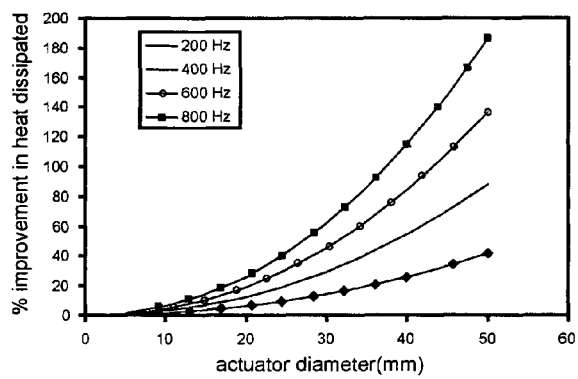
FIG. 36 is a graph of the % improvement in heat dissipation in a heat sink over baseline (fan only) heat dissipation as a function of actuator operating frequency.

FIG. 33 shows the actuator diaphragm displacement characteristics obtained from vibrometer measurements of the center point of the diaphragm at 190 Hz. Within the testing voltage range, the actuator displacement varies from 0.4 to 0.72 mm peak-peak; this corresponds to a pumped CFM in the range of 0.05 to 0.1 CFM (ratio between jet to baseline fan CFM of 0.15 to 0.35) as shown in FIG. 34. The curves for pumped CFM in FIG. 34 are calculated using EQUATION 1 below:

$$F=V_p \cdot s \qquad \text{(EQUATION 1)}$$

wherein
F=flow (in CFM);
$V_p$=pumped volume per stroke (in CF);
s=strokes per second From FIG. 34, it is clear that a proper redesign of the actuator will allow 5 times better flow performance from the synthetic jets (i.e., 5 times higher pumped CFM). As seen in FIG. 35, better flow performance translates into better thermal performance.

Using the correlation between gain in heat dissipation as a function of pumped CFM derived from experimental data, it can be shown that significant performance improvements are possible with a redesigned actuator; for example, an actuator designed for 400 Hz and 1.4 mm displacement (p-p) can increase the heat dissipation by over 100%. The appropriate design should take into account other system design issues including, but not limited to, noise, reliability and cost. Thus, with the current heat sink used in the tests, the synthetic jet actuators can be redesigned to dissipate twice as much as is being dissipated now (i.e, about 20 W per die). Heat sink improvements including using aluminum 6063 or copper heat sinks, optimization of spacing, and other such measures may provide further improvements in heat dissipation.

Figure 37:
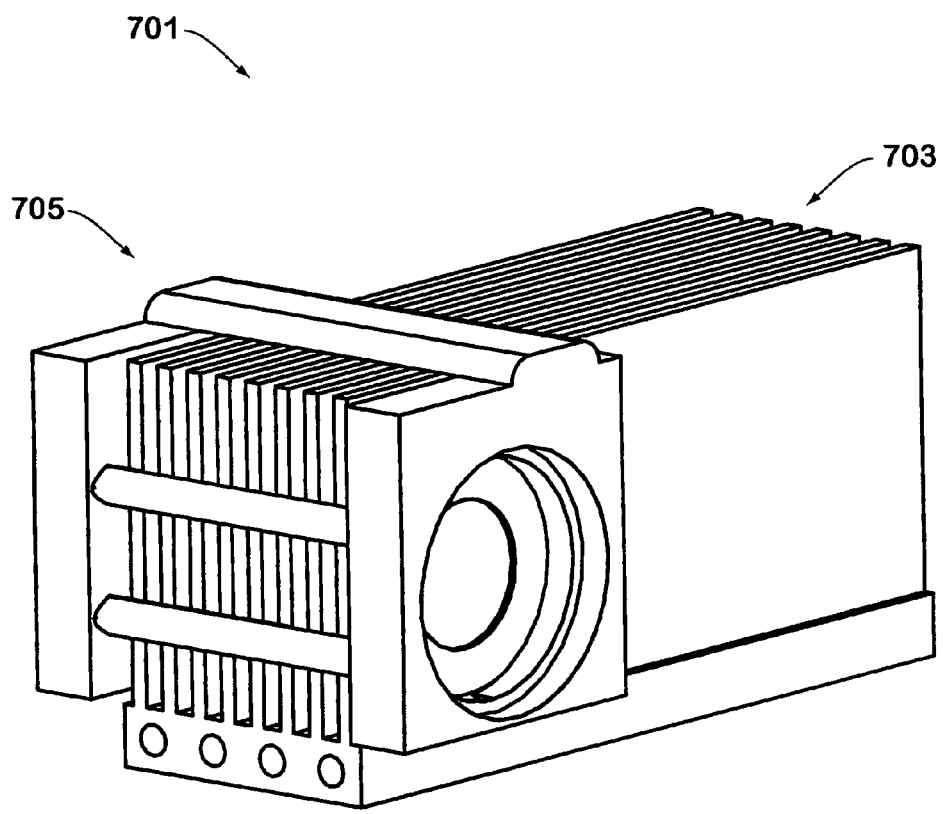
FIG. 37 is a perspective view of a heat exchanger made in accordance with the teachings herein.
Figure 38:
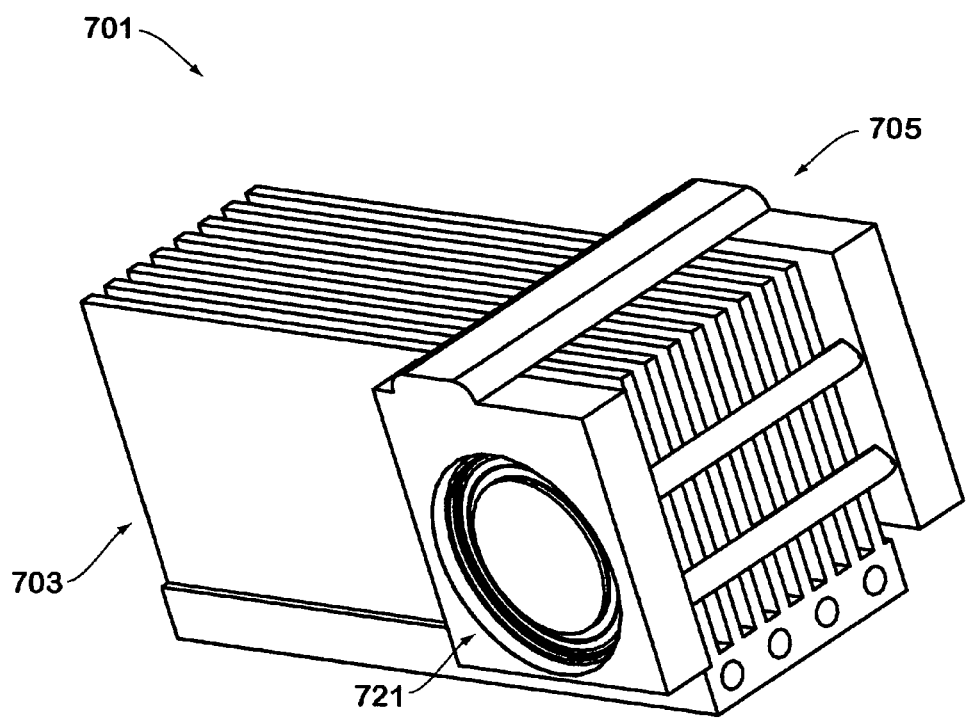
FIG. 38 is a perspective view of a heat exchanger made in accordance with the teachings herein.

FIGS. 37-38 illustrate another embodiment of a heat exchanger made in accordance with the teachings herein. The heat exchanger 701 depicted therein comprises a heat sink 703 equipped with a compact synthetic jet ejector 705 which is adapted to direct a plurality of synthetic jets between the fins of the heat sink 703. As can be appreciated from FIG. 38, one side of the synthetic jet ejector 705 is equipped with an actuator 721 (in this particular embodiment, the actuator is an acoustical diaphragm) which powers the synthetic jet ejector 705. Although the heat exchanger 701 is illustrated with a single synthetic jet actuator 721, it will be appreciated that, in some embodiments, both sides of the synthetic jet ejector 705 may be equipped with suitable actuators.

Figure 39:
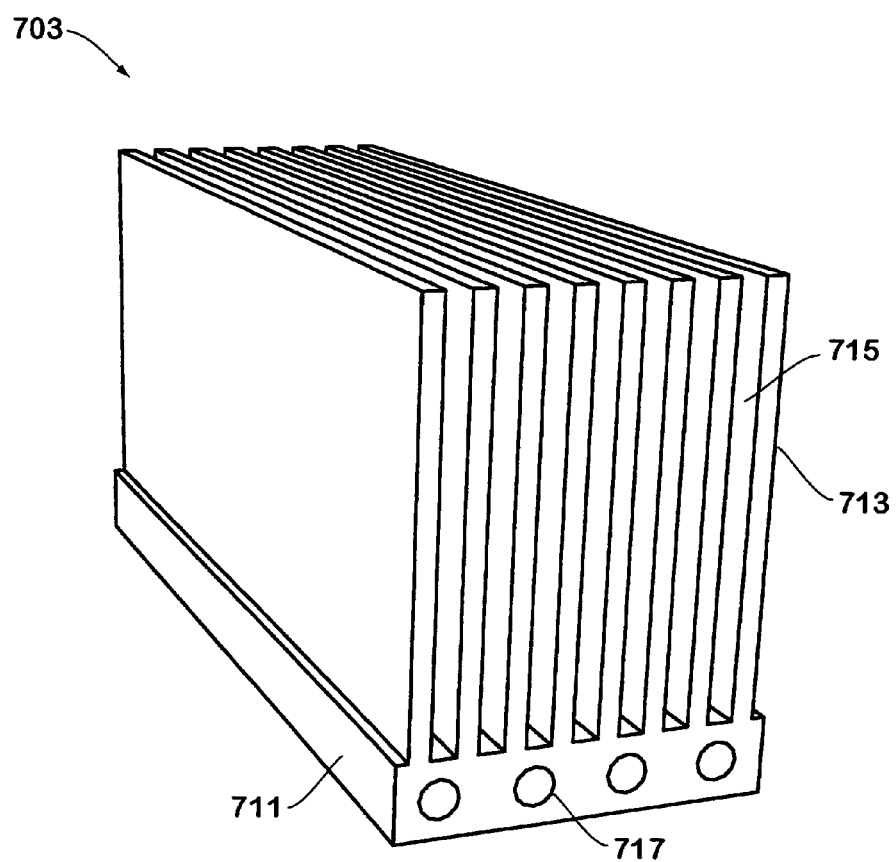
FIG. 39 is a perspective view of the heat sink used in the heat exchanger of FIG. 37.

FIG. 39 depicts the heat sink 703 in greater detail. As seen therein, the heat sink 703 comprises a baseplate 711 upon which are disposed a plurality of heat fins 713. The heat fins 713 are arranged in parallel, spaced-apart fashion so as to define a channel 715 between each adjacent pair of heat fins 713. As will be explained in greater detail below, the synthetic jet ejector 705 (see FIGS. 37-38) is adapted to direct one or more synthetic jets along the longitudinal axis of each of these channels, thereby improving local heat transfer and heat dissipation.

The baseplate 711 is provided with a series of apertures 717 therein. These apertures reduce the weight of the baseplate 711 without having a significant adverse impact on its heat transfer properties, and may also be used to mount the baseplate 711 on a substrate. In some embodiments, a flow of fluid may be directed through these apertures to provide additional thermal management.

Figure 40:
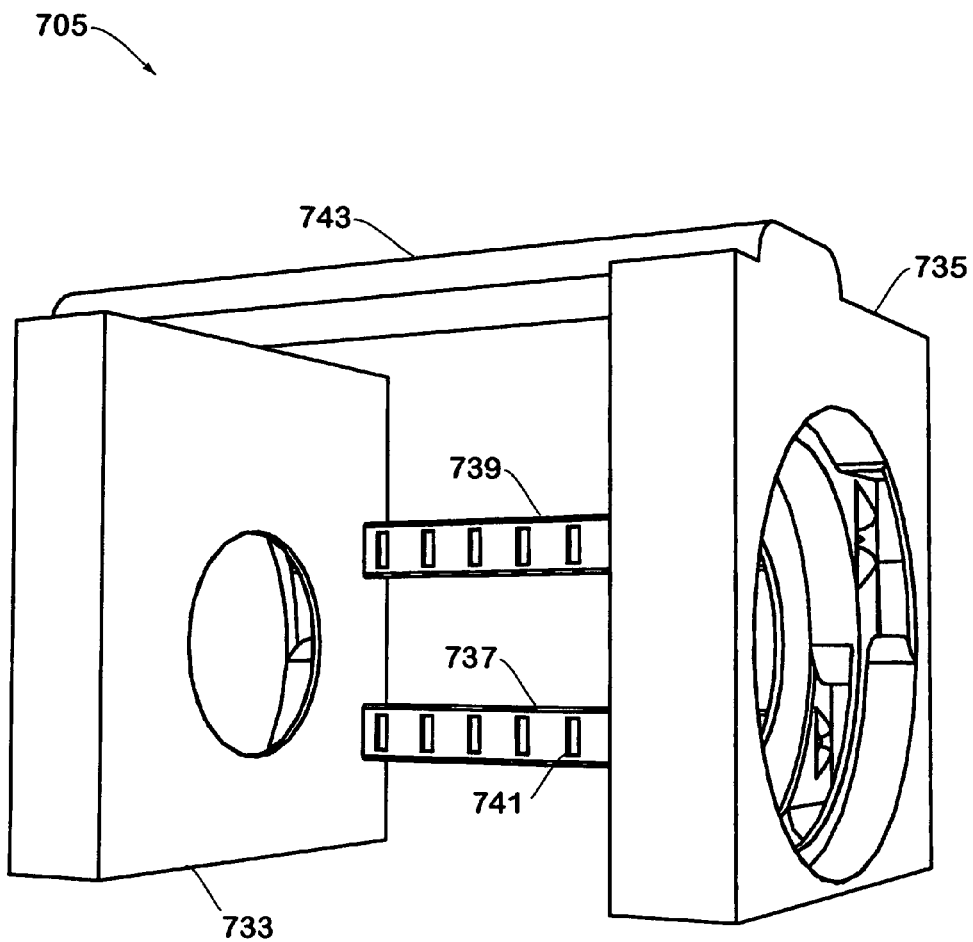
FIG. 40 is a perspective view of the synthetic jet ejector used in the heat exchanger of FIG. 37.
Figure 41:
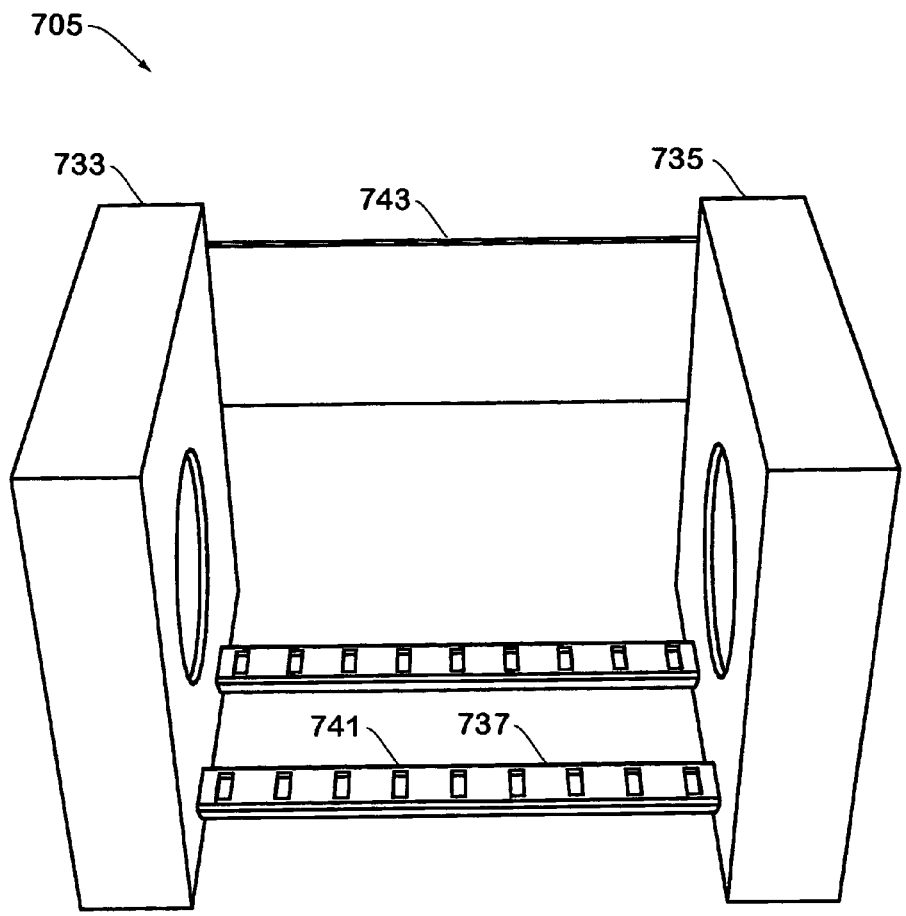
FIG. 41 is a perspective view of the synthetic jet ejector used in the heat exchanger of FIG. 37.
Figure 42:
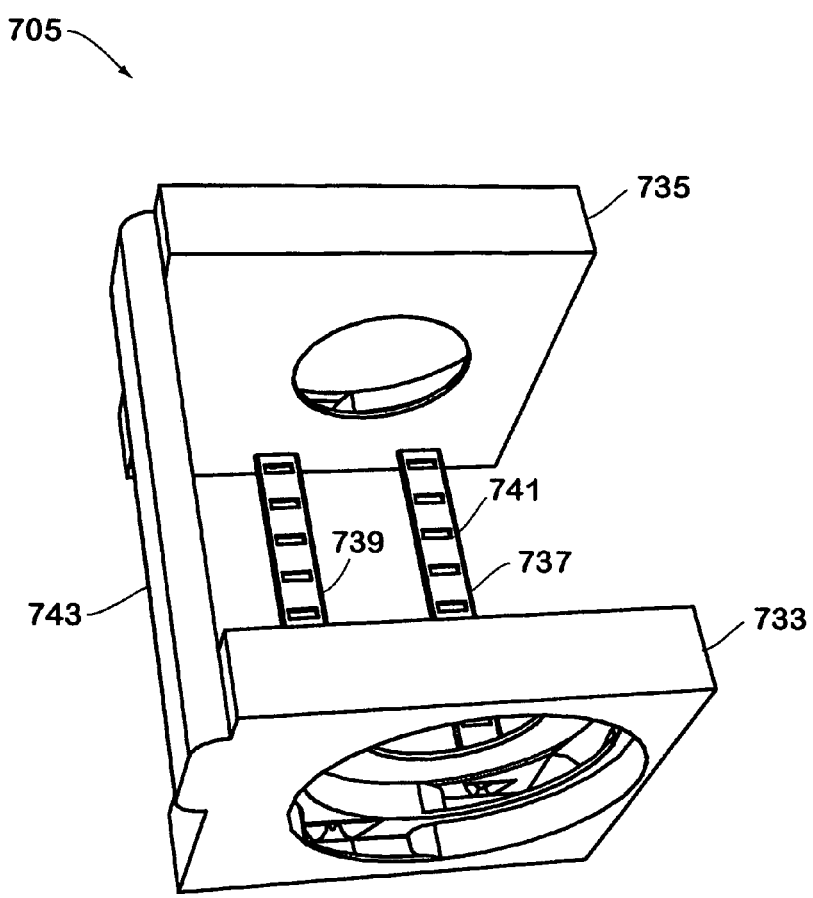
FIG. 42 is a perspective view of the synthetic jet ejector used in the heat exchanger of FIG. 37.

Referring now to FIGS. 40-42, the synthetic jet ejector 705 is illustrated in greater detail. The synthetic jet actuator 721 (see FIG. 38) has been removed from the device for greater clarity. As seen therein, the synthetic jet ejector 705 comprises first 733 and second 735 side lobes which are in fluidic communication with first 737 and second 739 booms. Each of the first 737 and second 739 booms is equipped with a series of apertures 741, each of which is adapted to emit a synthetic jet. The apertures 741 are spaced such that, when the synthetic jet ejector 705 is mounted on the heat sink 703 (see FIGS. 37-38), the apertures are aligned with the channels 715 (see FIG. 39) defined in the heat sink. A support bracket 743 is provided to impart greater mechanical integrity to the synthetic jet ejector 705.

Figure 43:
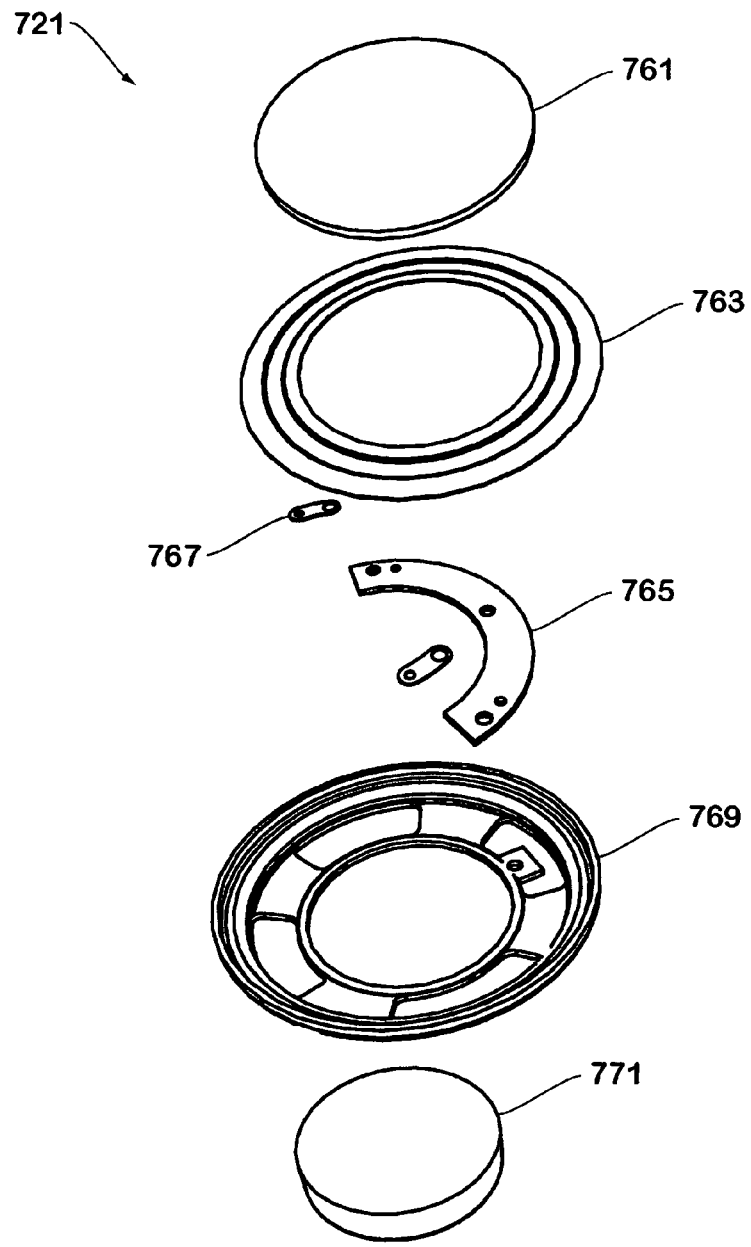
FIG. 43 is an exploded view of the actuator utilized in the heat exchanger of FIG. 37.
Figure 44:
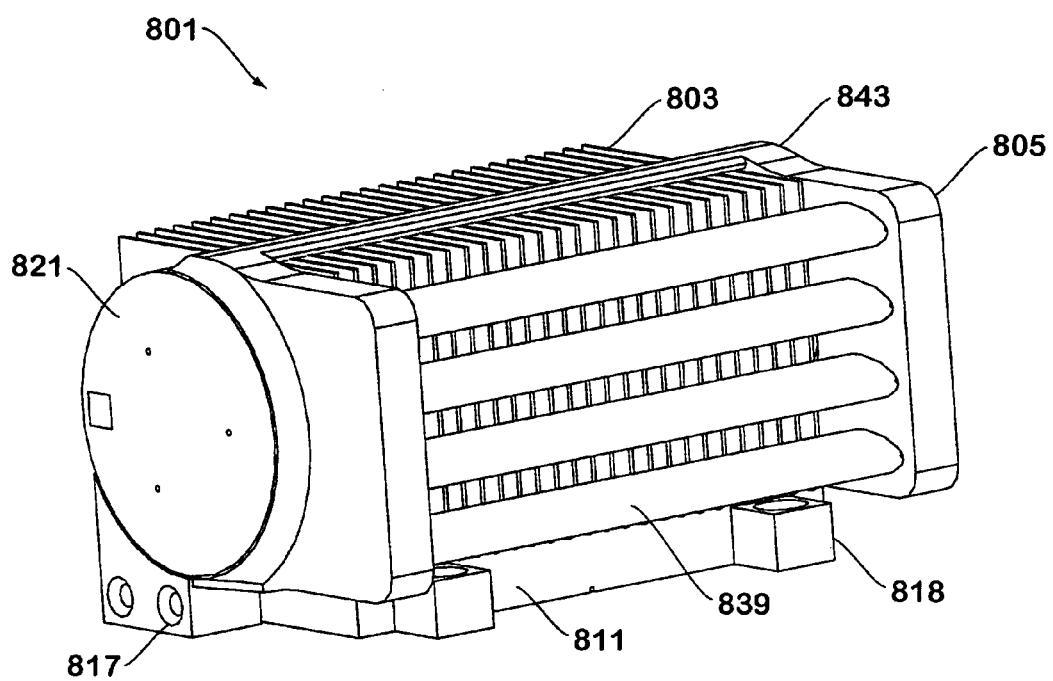
FIG. 44 is a perspective view of a heat exchanger made in accordance with the teachings herein.
Figure 45:
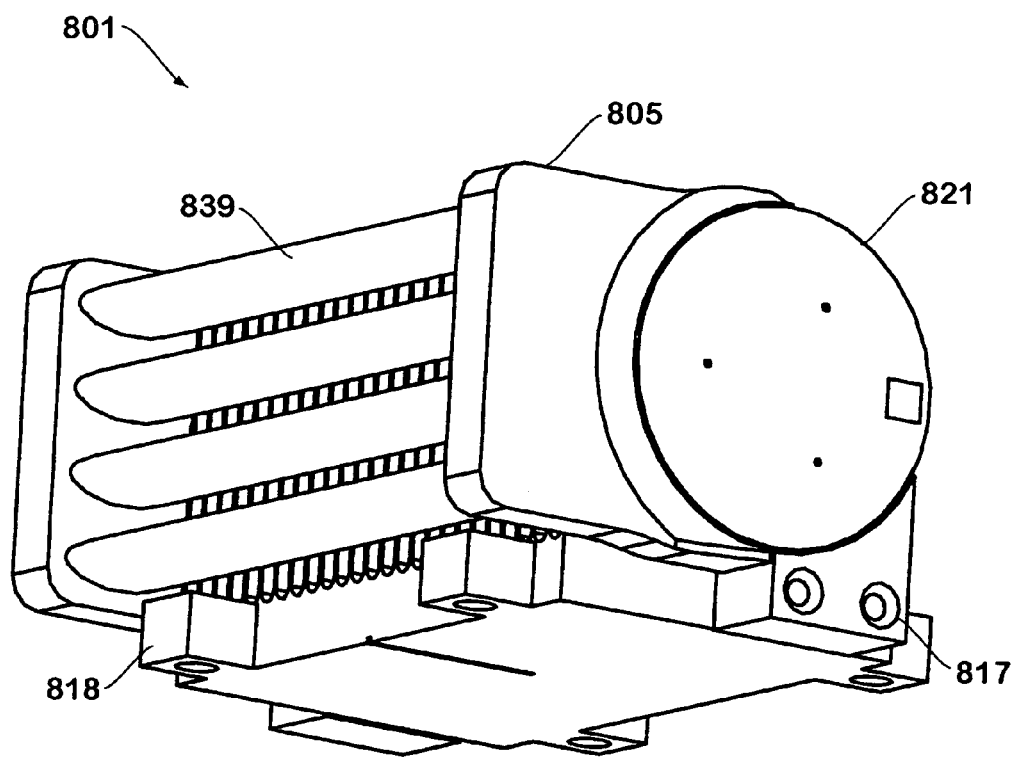
FIG. 45 is a perspective view of a heat exchanger made in accordance with the teachings herein.
Figure 46:
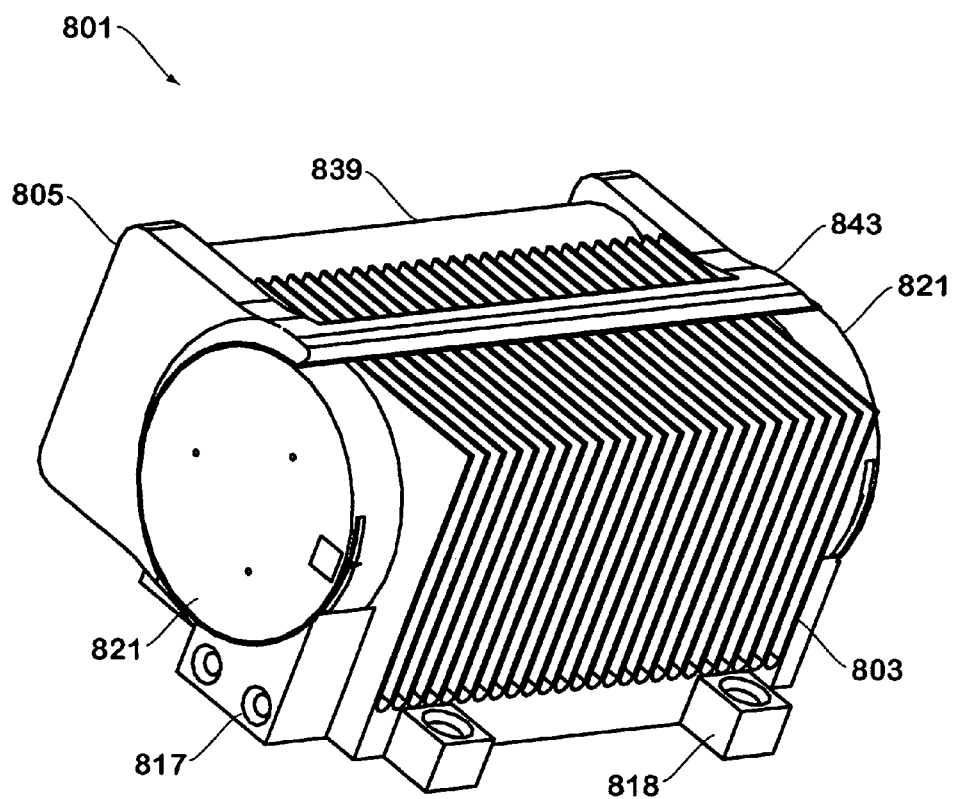
FIG. 46 is a perspective view of a heat exchanger made in accordance with the teachings herein.
Figure 47:
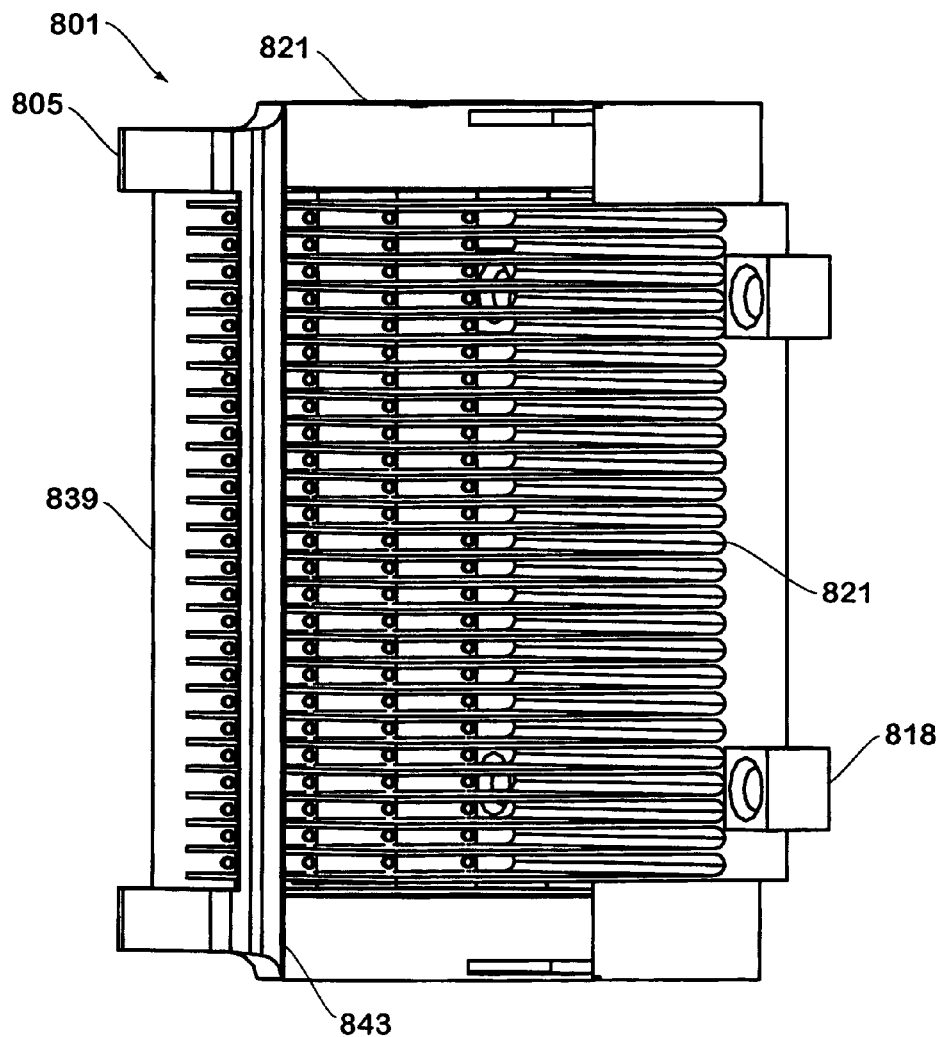
FIG. 47 is a perspective view of a heat exchanger made in accordance with the teachings herein.
Figure 48:
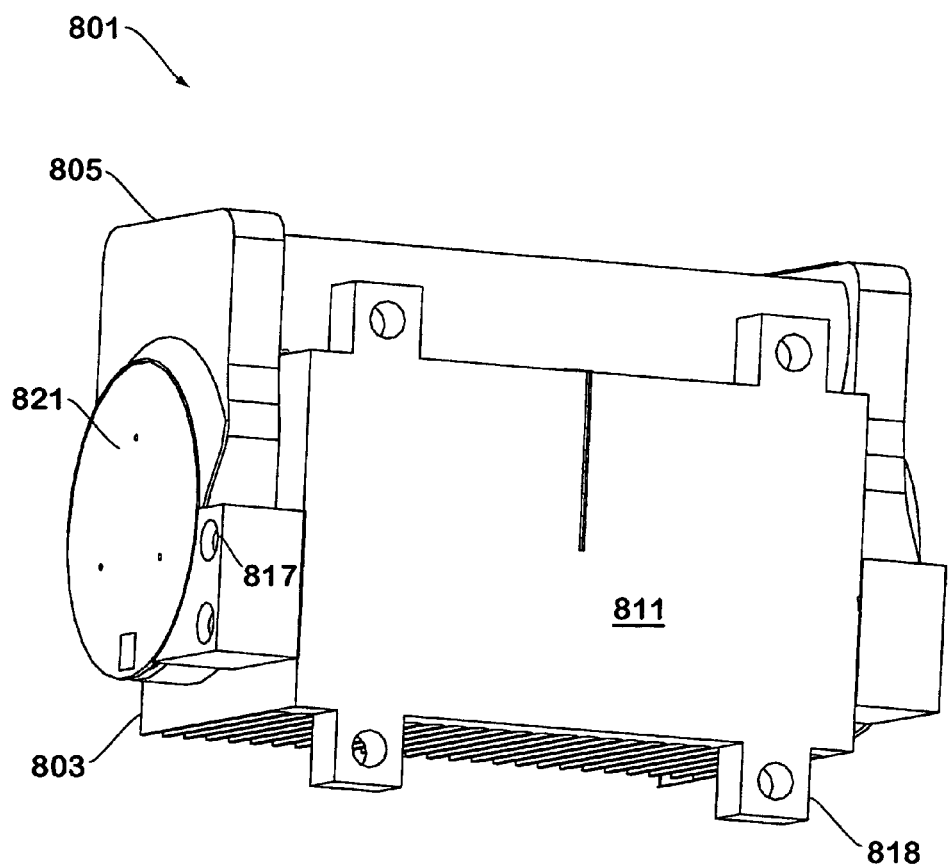
FIG. 48 is a perspective view of a heat exchanger made in accordance with the teachings herein.

FIG. 43 illustrates some of the components of the synthetic jet actuator 721 (see FIG. 37). In this particular embodiment, the synthetic jet actuator 721 is essentially an acoustical speaker. Hence, it comprises a diaphragm 761, a suspension 763, a mounting bracket 765, a washer 767, a basket 769, and a magnet 771. It will be appreciated, of course, that other types of actuators (including, without limitation, piezoelectric actuators) may be employed in the devices described herein.

FIGS. 44-48 illustrate a further embodiment of a heat exchanger made in accordance with the teachings herein. The heat exchanger 801 depicted therein comprises a heat sink 803 equipped with a compact synthetic jet ejector 805 which is adapted to direct a plurality of synthetic jets between the fins of the heat sink 803. Each side of the synthetic jet ejector 805 is equipped with an actuator 821 (in this particular embodiment, the actuator is an acoustical diaphragm) which power the synthetic jet ejector 805.

Figure 49:
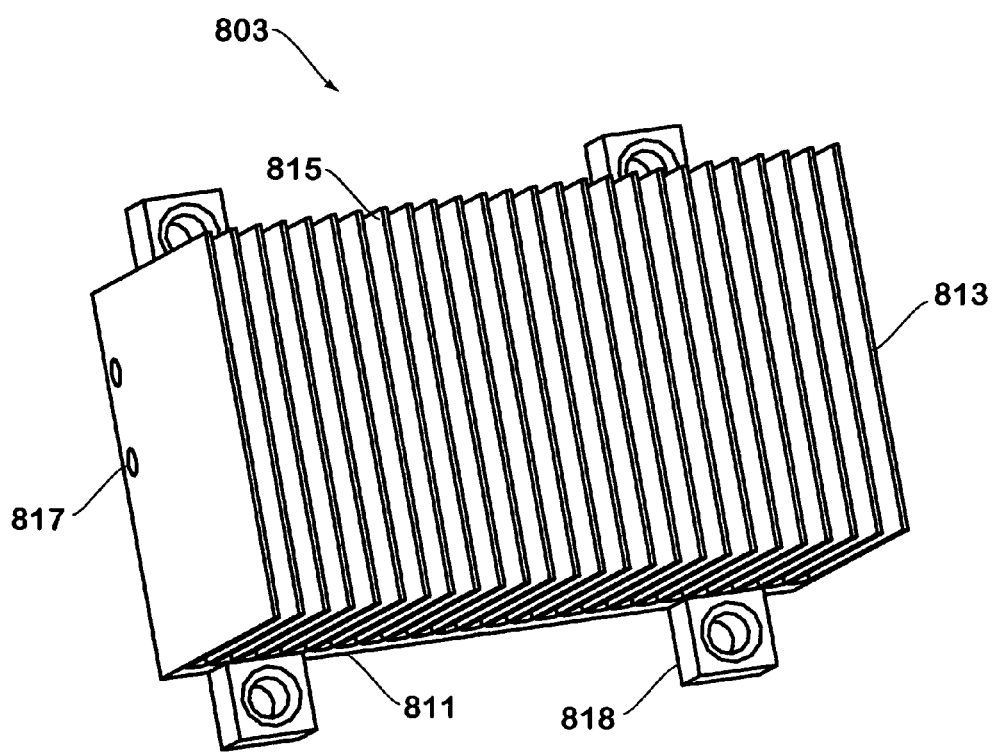
FIG. 49 is a perspective view of the heat sink used in the heat exchanger of FIG. 44.
Figure 50:
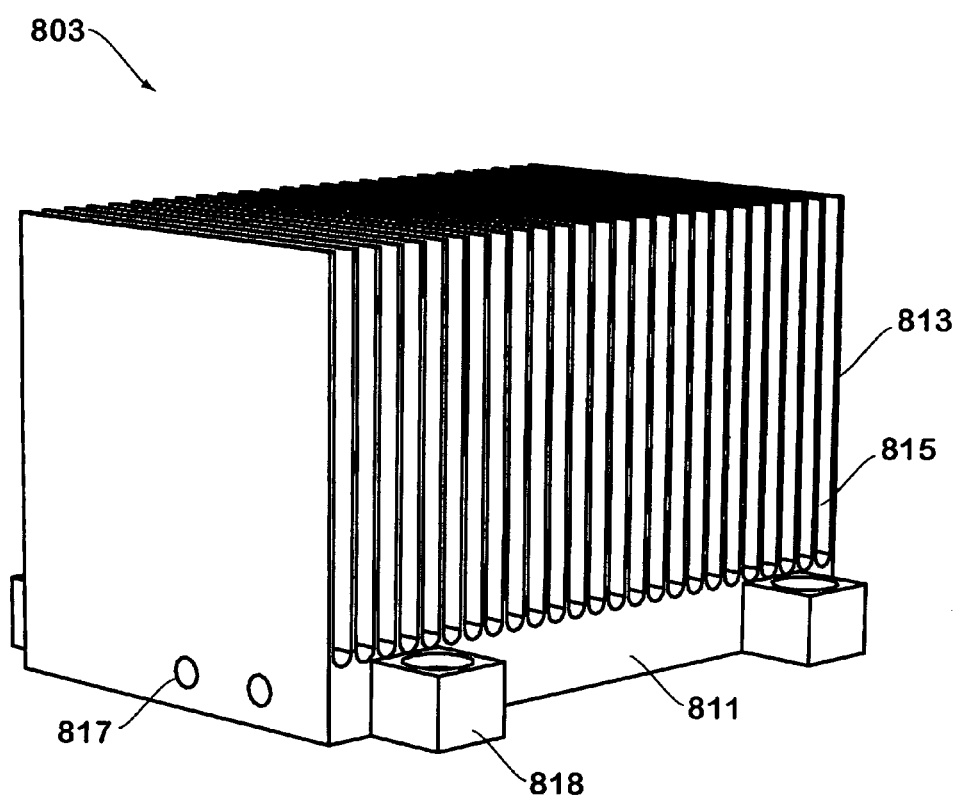
FIG. 50 is a perspective view of the heat sink used in the heat exchanger of FIG. 44.

FIGS. 49-50 depict the heat sink 803 in greater detail. As seen therein, the heat sink 803 comprises a baseplate 811 upon which are disposed a plurality of heat fins 813. The heat fins 813 are arranged in parallel, spaced-apart fashion so as to define a channel 815 between each adjacent pair of heat fins 813. As with the preceding embodiment, the synthetic jet ejector 805 (see FIGS. 51-53) is adapted to direct one or more synthetic jets along the longitudinal axis of each of these channels, thereby improving local heat transfer and heat dissipation.

The baseplate 811 is provided with a series of apertures 817 therein. These apertures reduce the weight of the baseplate 811 without having a significant adverse impact on its heat transfer properties. In some embodiments, a flow of fluid may be directed through these apertures to provide additional thermal management. The baseplate 811 is further equipped with a series of tabs 818, each of which is provided with a threaded aperture, for securing the heat exchanger 801 to a substrate.

Figure 51:
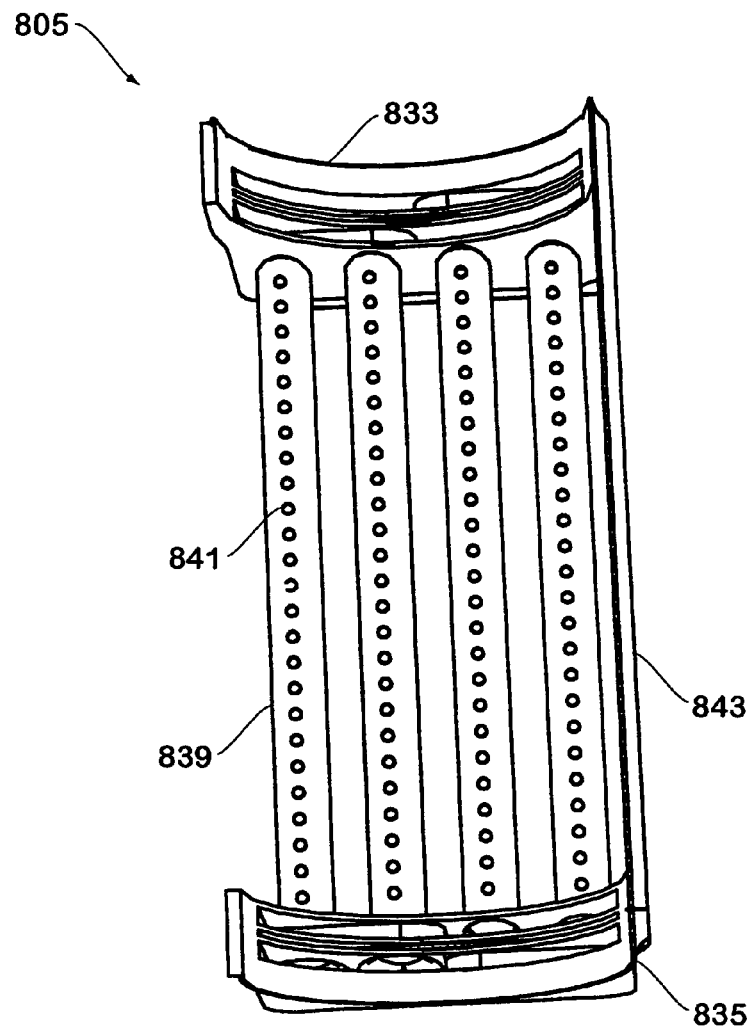
FIG. 51 is a perspective view of the synthetic jet ejector used in the heat exchanger of FIG. 44.
Figure 52:
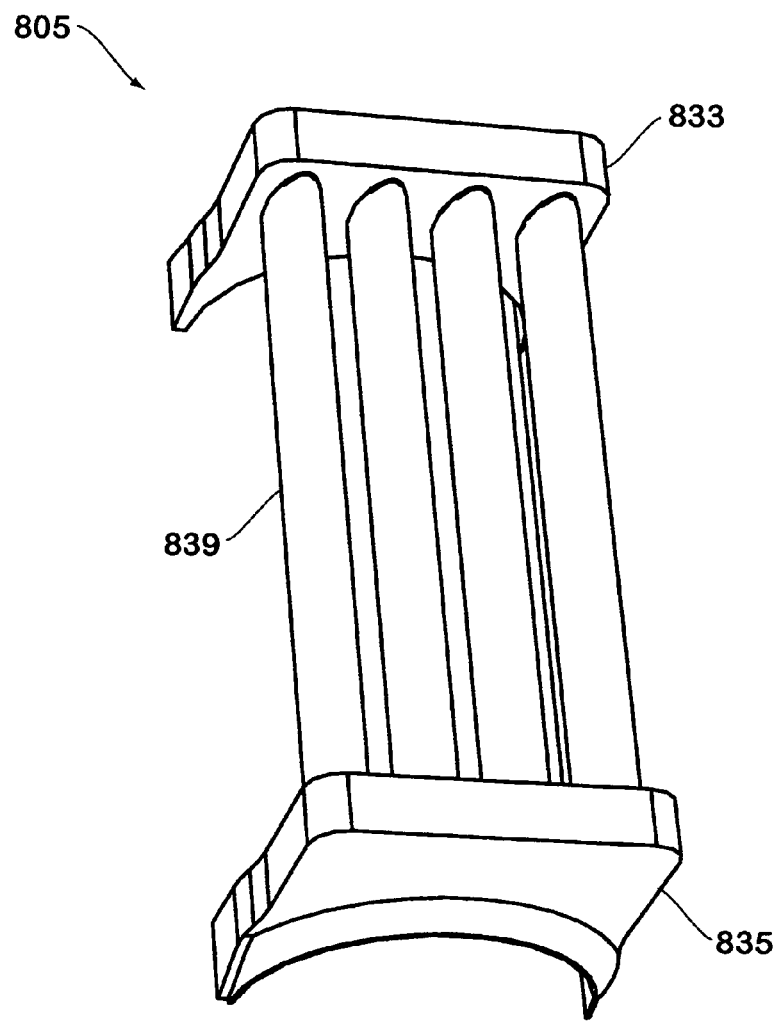
FIG. 52 is a perspective view of the synthetic jet ejector used in the heat exchanger of FIG. 44.
Figure 53:
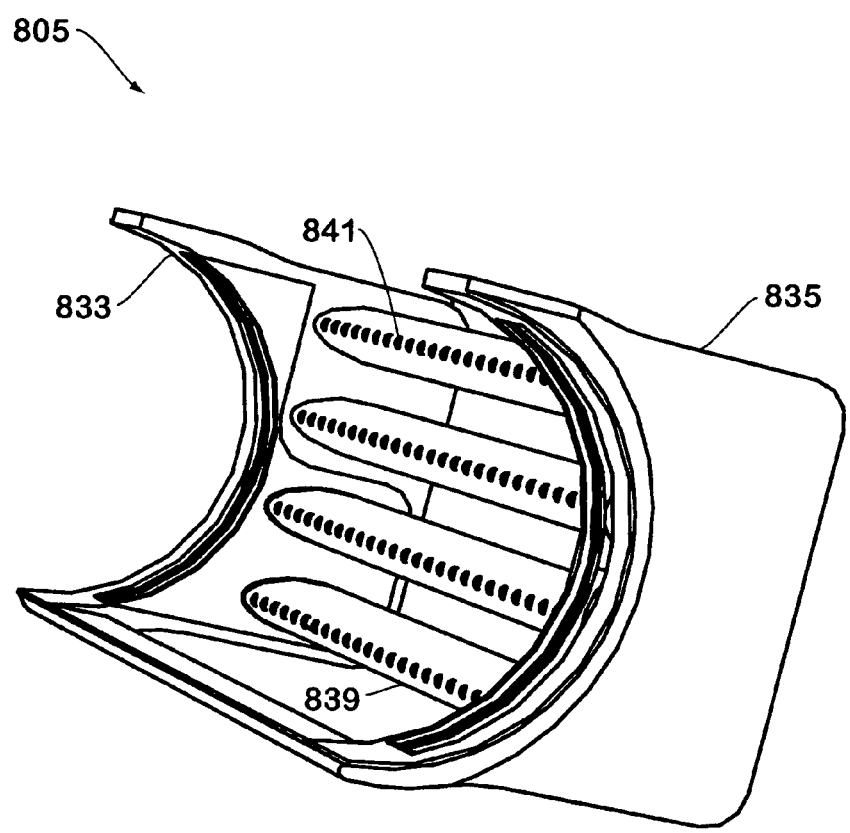
FIG. 53 is a perspective view of the synthetic jet ejector used in the heat exchanger of FIG. 44.
Figure 54:
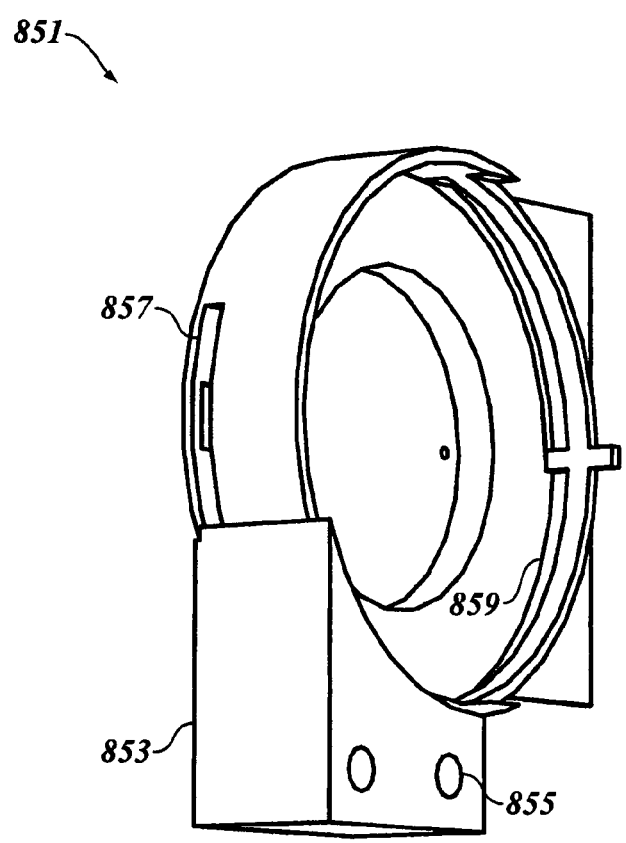
FIG. 54 is a perspective view of the housing for the synthetic jet ejector used in the heat exchanger of FIG. 44.
Figure 55:
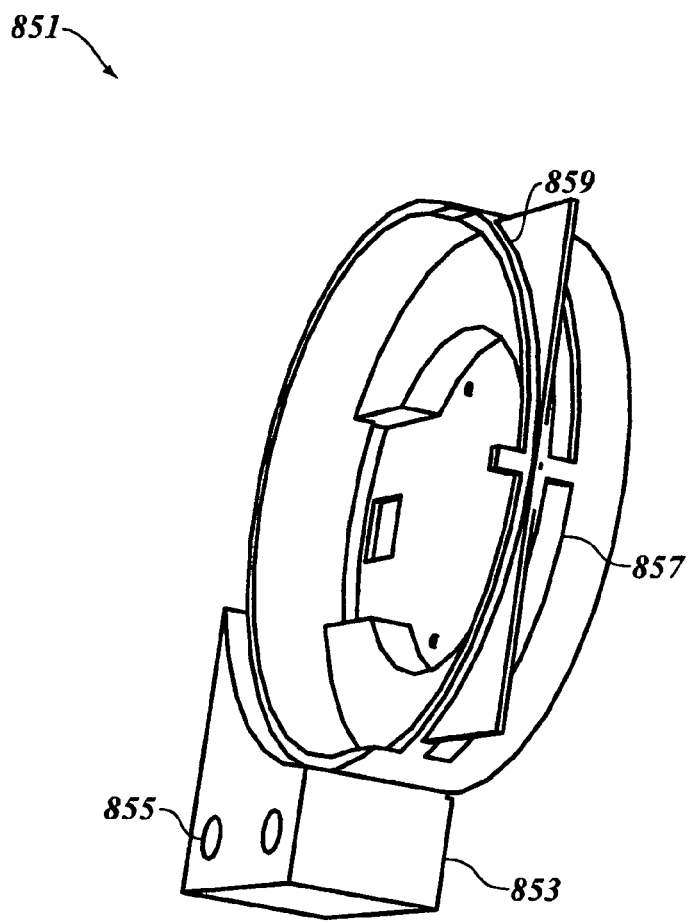
FIG. 55 is a perspective view of the housing for the synthetic jet ejector used in the heat exchanger of FIG. 44.
Figure 56:
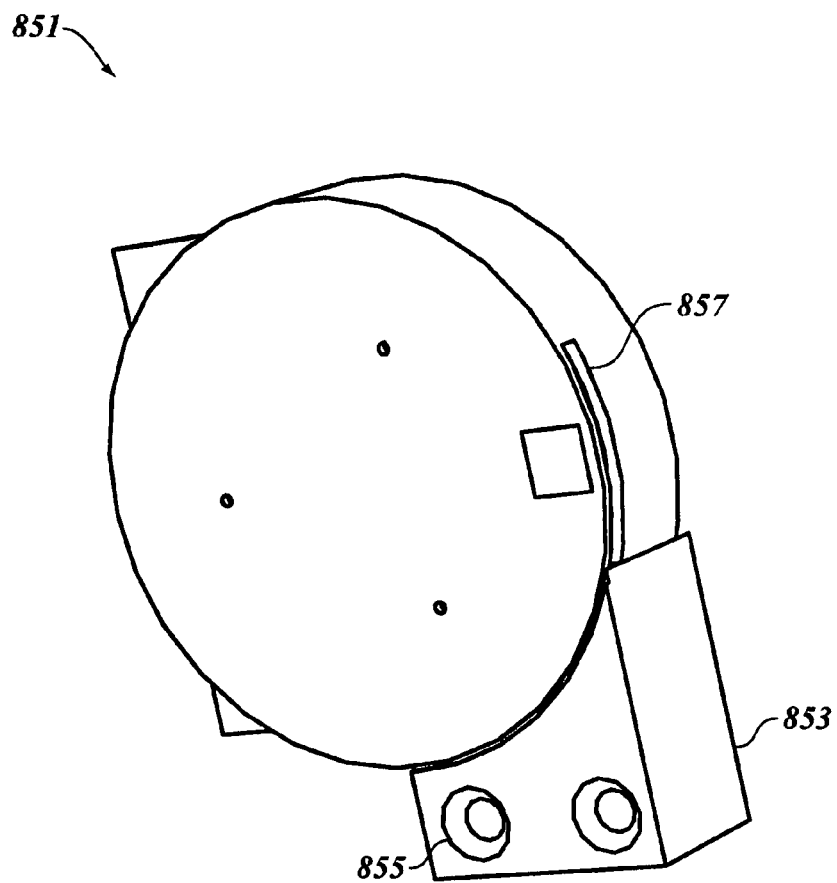
FIG. 56 is a perspective view of the housing for the synthetic jet ejector used in the heat exchanger of FIG. 44.
Figure 57:
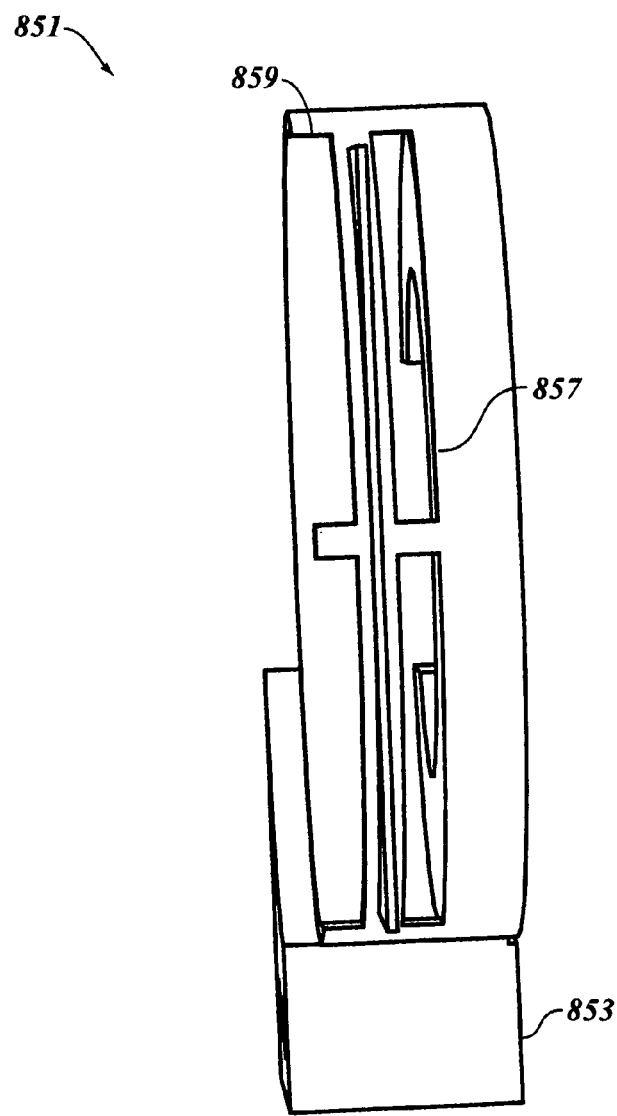
FIG. 57 is a perspective view of the housing for the synthetic jet ejector used in the heat exchanger of FIG. 44.
Figure 58:
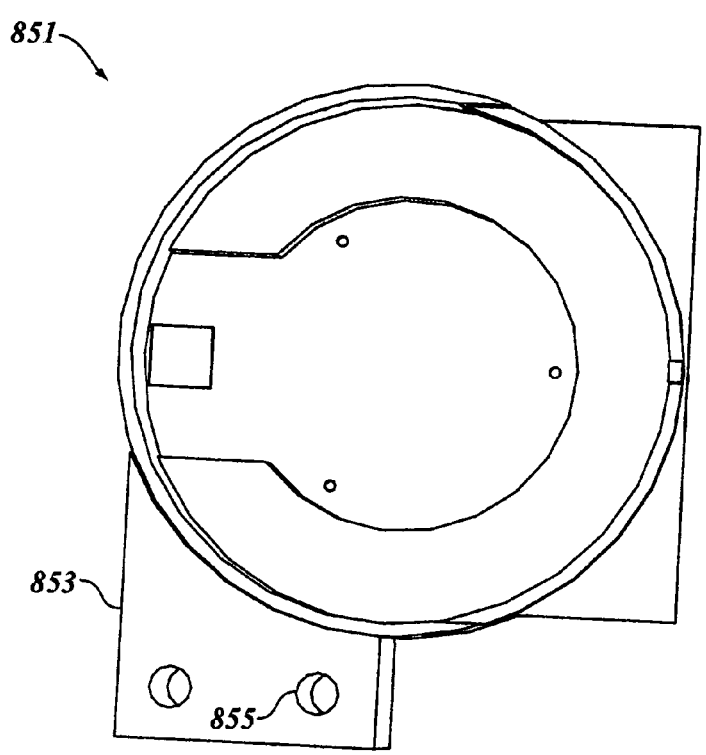
FIG. 58 is a perspective view of the housing for the synthetic jet ejector used in the heat exchanger of FIG. 44.

Referring now to FIGS. 51-53, the synthetic jet ejector 805 is illustrated in greater detail. As seen therein, the synthetic jet ejector 805 comprises first 833 and second 835 side lobes which are in fluidic communication with a series of booms 839. Each of the booms 839 is equipped with a series of apertures 841, each of which is adapted to emit a synthetic jet. The apertures 841 are spaced such that, when the synthetic jet ejector 805 is mounted on the heat sink 803 (see FIGS. 37-38), the apertures are aligned with the channels 815 (see FIGS. 49-50) defined in the heat sink. A support bracket 843 is provided to impart greater mechanical integrity to the synthetic jet ejector 805.

FIGS. 54-58 illustrate the details of the synthetic jet ejector housing 851. The components of the synthetic jet ejector disposed in the synthetic jet ejector housing 851 are similar to those depicted in FIG. 43. The synthetic jet ejector housing 851 comprises a mounting portion 853 with suitable apertures 855 therein which allow the synthetic jet ejector housing 851 to be releasably fastened to the baseplate 811. The synthetic jet ejector housing 851 is provided with first 857 and second 859 openings which are in fluidic communication with first and second sets of the booms 839, thereby allowing the synthetic jet ejector to produce synthetic jets at the apertures 841 in the booms 839. These synthetic jets are directed between the fins 813 of the heat sink as indicated, for example, by the placement of the apertures 841 in FIG. 47.

Figure 59:
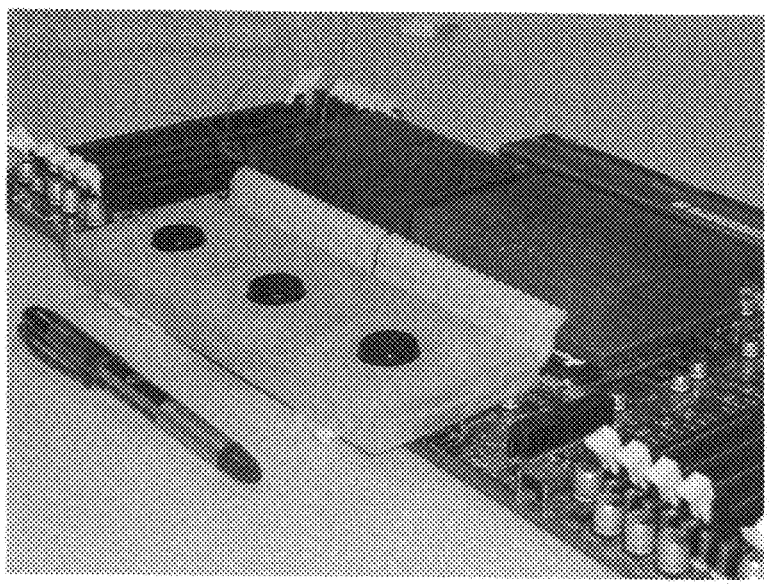
FIG. 59 is a perspective view of a low profile heat exchanger made in accordance with the teachings herein.

FIG. 59 illustrates a particular, non-limiting embodiment of a thermal management device 901 which is similar in many respects to the embodiments depicted in FIGS. 81-83, which are described in further detail below. The thermal management system depicted in FIG. 59 comprises first 903 and second 905 synthetic jet ejectors. The first 903 and second 905 synthetic jet ejectors are mounted on an add-on card substrate 907, and are registered with first 909 and second 911 heat sinks such that the nozzles 913 of the first 903 and second 905 synthetic jet ejectors are disposed between adjacent fins 915 of the first 909 and second 911 heat sinks. Consequently, the synthetic jets generated by the first 903 and second 905 synthetic jet ejectors and emitted from the nozzles 913 thereof are directed between the adjacent fins 915.

A number of variations are possible to thermal management devices of the type depicted in FIG. 59. Some of these variations are depicted in FIGS. 60-65. Thus, in the thermal management system 921 depicted in FIG. 60, first 923 and second 925 cards are provided that are spaced apart from each other. The cards 923, 925 have various features 927 defined thereon which require thermal management. Such features 927 may include various types of chips, semiconductor devices, electrical components, and other heat sources as are known to the art.

Figure 60:
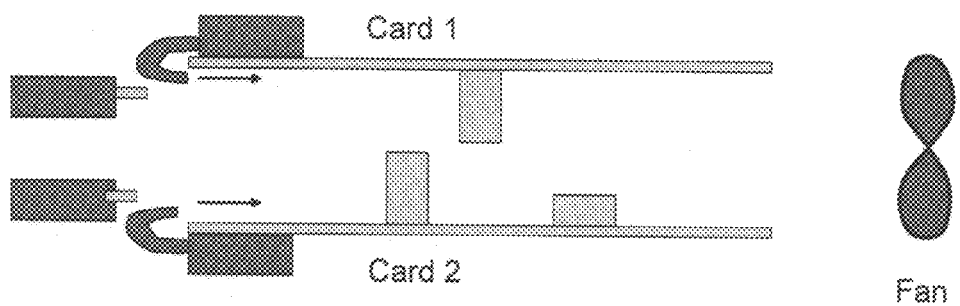
FIG. 60 is an illustration depicting the mounting of synthetic jet ejectors along the edges of cards.
Figure 61:
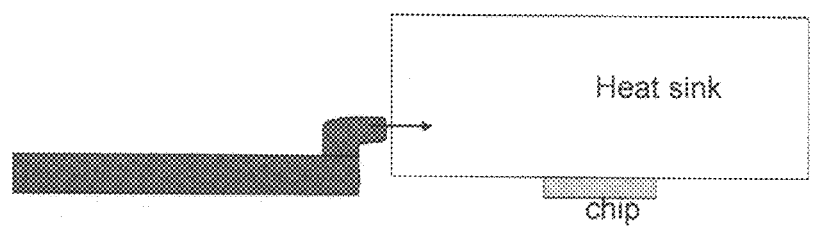
FIG. 61 is an illustration of one possible configuration (low) of a low profile synthetic jet ejector made in accordance with the teachings herein.

In the particular embodiment depicted in FIG. 60, a global fluidic flow is provided by a fan 929. This global fluidic flow is augmented at the local level by a first synthetic jet ejector 933 mounted on the first card 923, and a second synthetic jet ejector 935 mounted on the second card 937. It is to be noted that the flexibility of design afforded by synthetic jet ejectors allows the first 933 and second 935 synthetic jet ejectors to be mounted on the opposing sides of the cards 923, 925 on which the features 927 to be thermally managed are located. As indicated in the figure, this same flexibility also permits an alternative configuration in which the first 933 and second 935 synthetic jet ejectors are disposed in the same plane as the features 927 to be thermally managed, but are mounted adjacent to the cards 923, 925.

FIGS. 61-65 illustrate further embodiments of thermal management systems in accordance with the teachings herein, and demonstrate the significant versatility these systems offer in terms of disposition, orientation and construction. In the system 941 depicted in FIG. 61, the synthetic jet ejector 951 is disposed adjacent to a heat sink 953, and is arranged such that the body 955 of the synthetic jet ejector 951 is below the bottom of the heat sink 953, while the nozzles 957 of the synthetic jet ejector 951 are registered with the channels of the heat sink 953. The device 959 to be thermally managed is attached to the heat sink 953.

Figure 62:
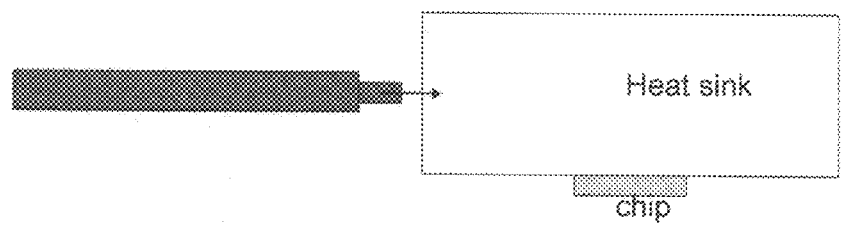
FIG. 62 is an illustration of one possible configuration (in-line) of a low profile synthetic jet ejector made in accordance with the teachings herein.

In the system 943 depicted in FIG. 62, the synthetic jet ejector 951 is disposed adjacent to a heat sink 953, and is arranged such that the body 955 of the synthetic jet ejector 951 is orthogonal to the fins of the heat sink 953, while the nozzles 957 of the synthetic jet ejector 951 are registered with the channels of the heat sink 953. The device 959 to be thermally managed is attached to the heat sink 953.

Figure 63:
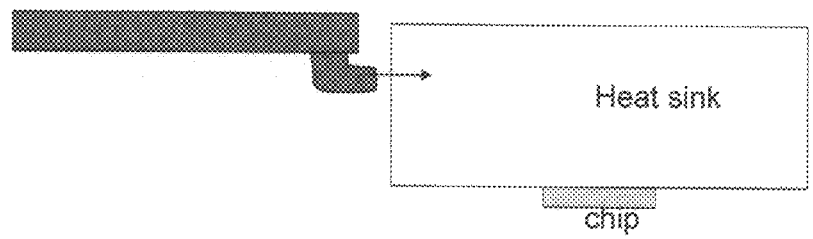
FIG. 63 is an illustration of one possible configuration (high) of a low profile synthetic jet ejector made in accordance with the teachings herein.

In the system 945 depicted in FIG. 63, the synthetic jet ejector 951 is disposed adjacent to a heat sink 953, and is arranged such that the body 955 of the synthetic jet ejector 951 is above the bottom of the heat sink 953, while the nozzles 957 of the synthetic jet ejector 951 are registered with the channels of the heat sink 953. The device 959 to be thermally managed is attached to the heat sink 953.

Figure 64:
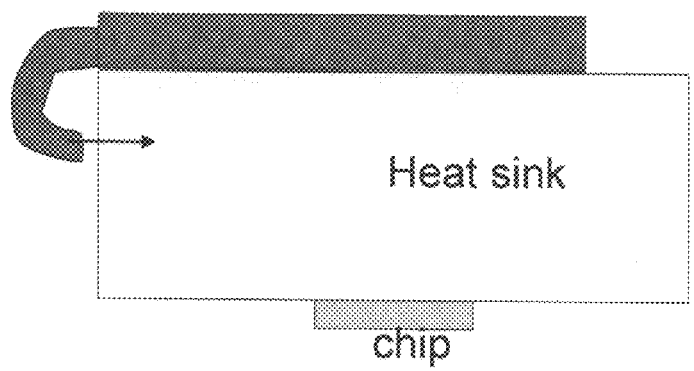
FIG. 64 is an illustration of one possible configuration of a synthetic jet ejector made in accordance with the teachings herein which is mounted on top of a heat sink.

In the system 947 depicted in FIG. 64, the synthetic jet ejector 951 is disposed on top of the heat sink 953, and is arranged such that the body 955 of the synthetic jet ejector 951 is orthogonal to the fins of the heat sink 953, while the nozzles 957 of the synthetic jet ejector 951 are registered with the channels of the heat sink 953. The device 959 to be thermally managed is attached to the heat sink 953.

Figure 65:
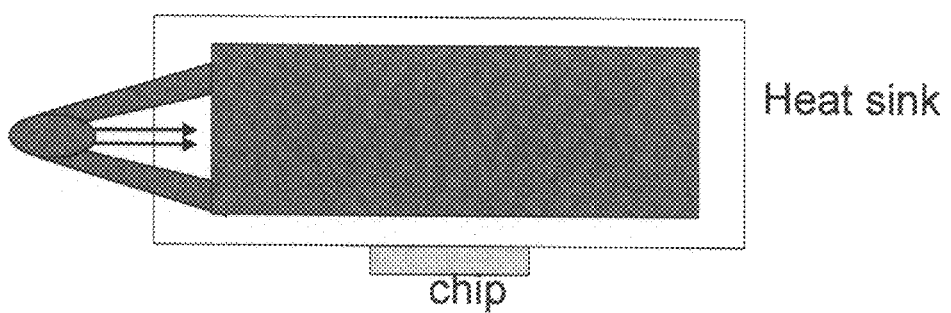
FIG. 65 is an illustration of one possible configuration of a synthetic jet ejector made in accordance with the teachings herein which is mounted on the sides of a heat sink and is equipped with jet plenums disposed across the inlet of the heat sink.

In the system 949 depicted in FIG. 65, the synthetic jet ejector 951 is disposed on one side of the heat sink 953, and is arranged such that the body 955 of the synthetic jet ejector 951 is parallel to the fins of the heat sink 953, while the nozzles 957 of the synthetic jet ejector 951 are registered with the channels of the heat sink 953. The device 959 to be thermally managed is attached to the heat sink 953. In this particular embodiment, the synthetic jet ejector 951 is equipped with a plurality of arms 961 which are in fluidic communication with a manifold 963 which directs a plurality of synthetic jets along the channels of the heat sink 953.

Figure 66:
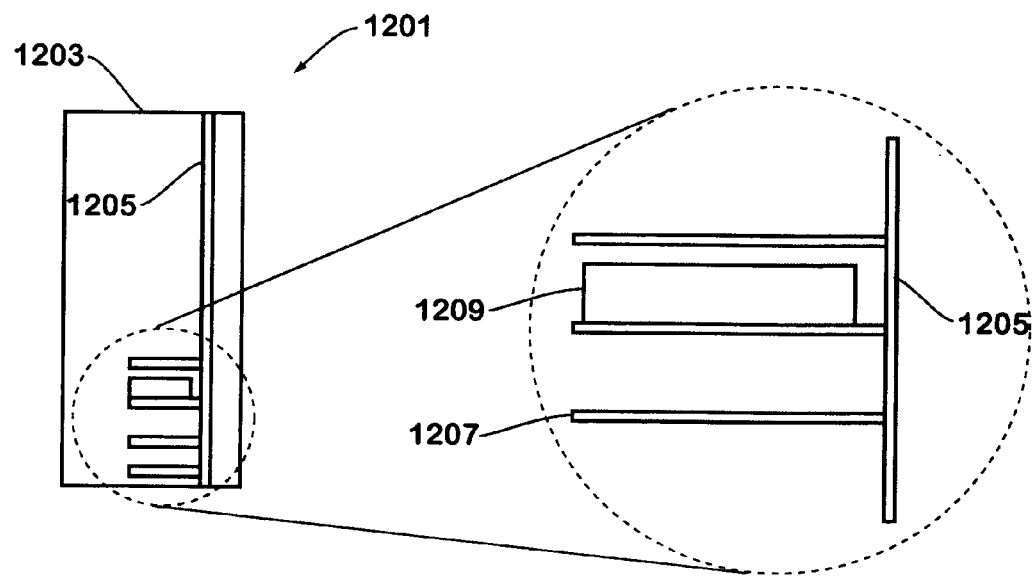
FIG. 66 is an illustration (front view) of a computer equipped with add-on cards having a thermal management system made in accordance with the teachings herein.
Figure 67:
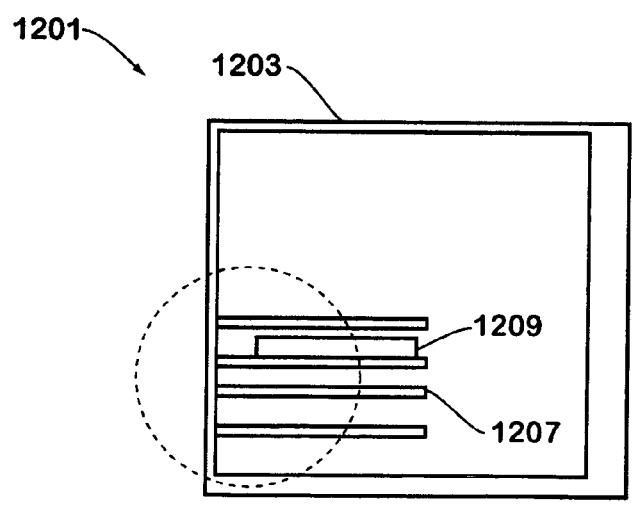
FIG. 67 is a side view of the computer of FIG. 66.

Another specific, non-limiting example of a device made in accordance with the teachings herein is illustrated in FIGS. 66-67, which depicts a computer 1201 equipped with a thermal management system of the type depicted herein. The computer 1201 comprises a chassis 1203 which houses a motherboard 1205. The motherboard 1205 is equipped with a plurality of single slot PCI add-on cards 1207. One surface of each add-on card 1207 is equipped with a thermal management system 1209 that comprises a synthetic jet ejector 1211 and a heat sink 1213 (see FIG. 68).

Figure 68:
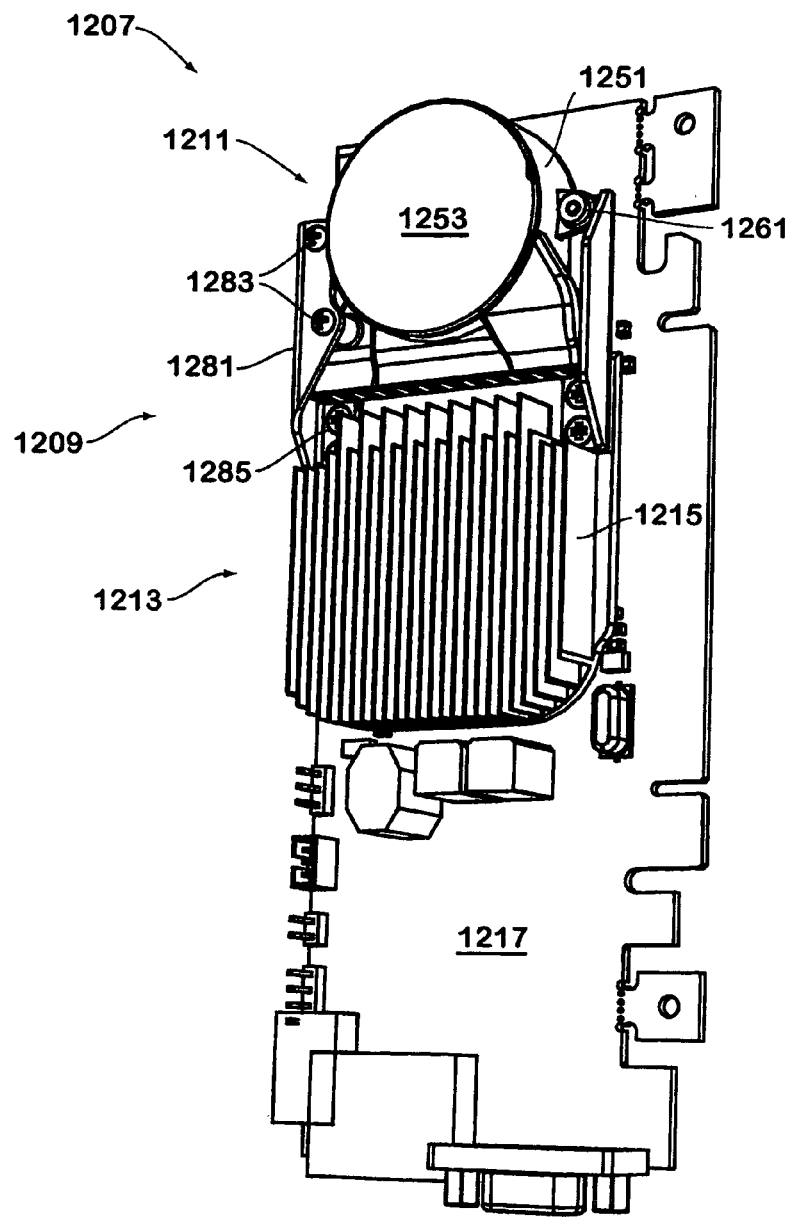
FIG. 68 is a perspective view of the add-on card of the computer of FIG. 66.

The details of the PCI add-on card 1207 of FIGS. 66-67, and in particular, the thermal management system 1209 mounted thereon, may be further appreciated with respect to the particular, non-limiting embodiment depicted in FIG. 68. As seen therein, the thermal management system 1209 comprises a synthetic jet ejector 211 which is mounted on one side of the PCI add-on card 1207 and which is in fluidic communication with an adjacent heat sink heat sink 1213 that is mounted on the same surface of the add-on card 1207. The synthetic jet ejector 1211 is adapted to generate a plurality of synthetic jets which are directed along the longitudinal axis of the fins 1215 of the heat sink 1213. The heat sink 1213 is in thermal contact with the graphics chip as well as the memory modules defined on the opposing side of the PCI add-on card 1207. Hence, as the circuitry of the add-on card 1207 and its components generate heat through ohmic resistance, that heat is transferred to the heat sink 1213, where it is effectively dissipated by the turbulent synthetic jets emitted by the synthetic jet ejector 1211.

Figure 69:
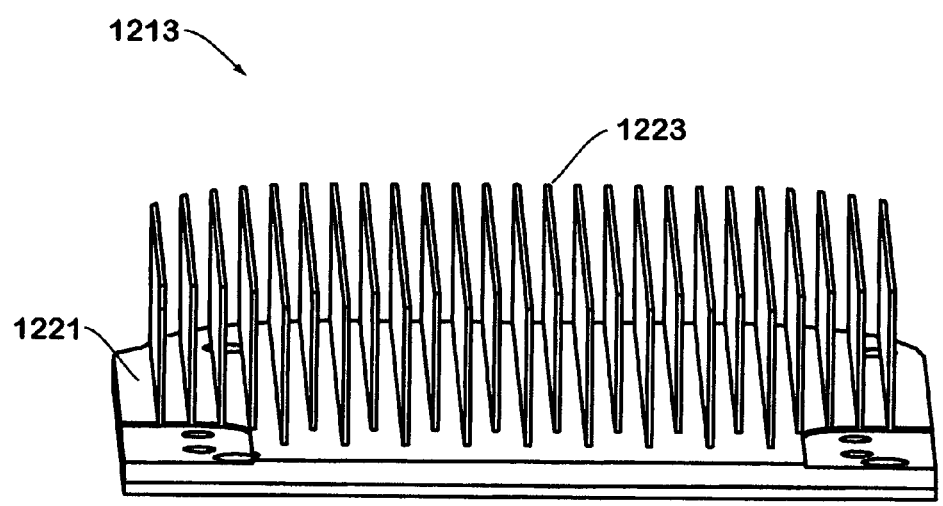
FIG. 69 is a an enlarged view of the heat sink utilized in the add-on card of FIG. 68.
Figure 70:
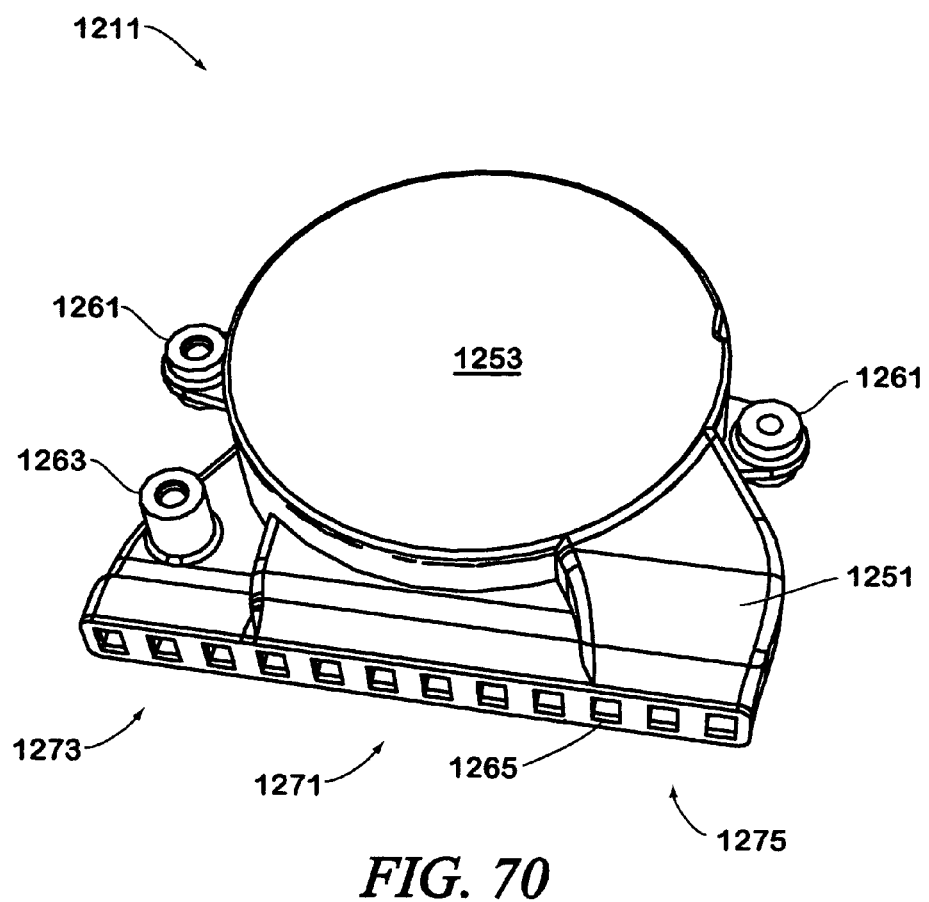
FIG. 70 is an enlarged view of the synthetic jet ejector utilized in the add-on card of FIG. 69.
Figure 71:
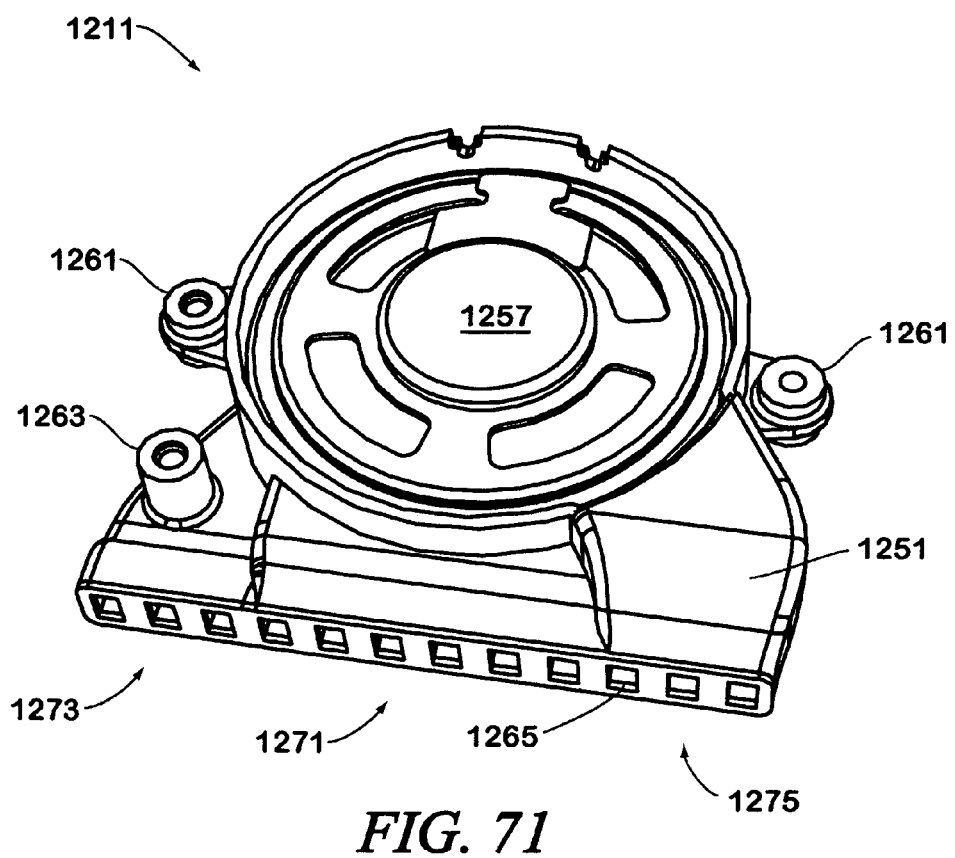
FIG. 71 is a view of the synthetic jet ejector of FIG. 70 with the cap removed to show one of the two electromagnetic actuators.
Figure 72:
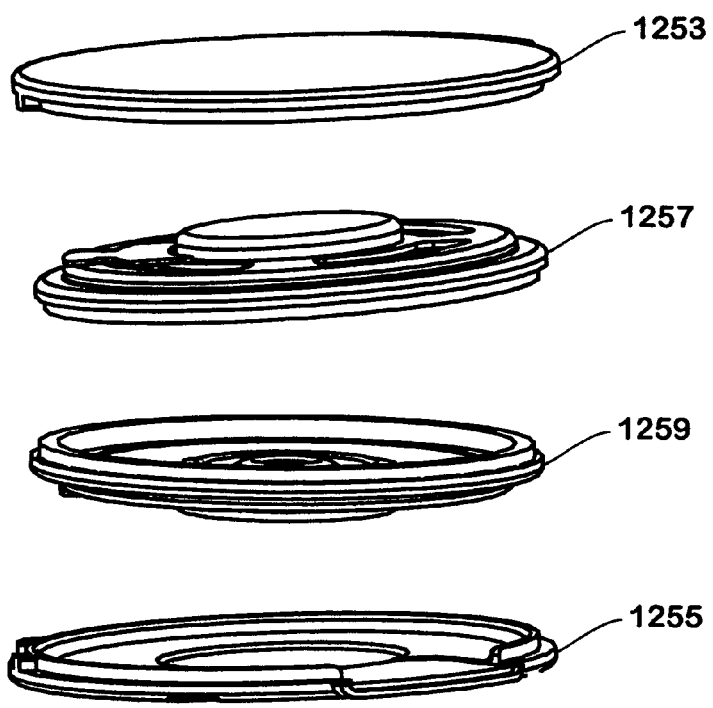
FIG. 72 is an exploded view of the internal components of the synthetic jet ejector of FIG. 70 which depicts the top and bottom lids and the first and second electromagnetic actuators.
Figure 73:
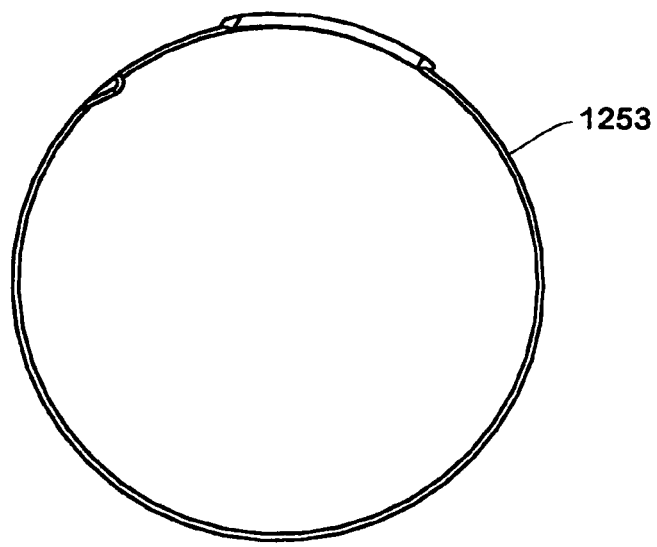
FIG. 73 is an illustration of the top surface of the one of the lids of FIG. 72.
Figure 74:
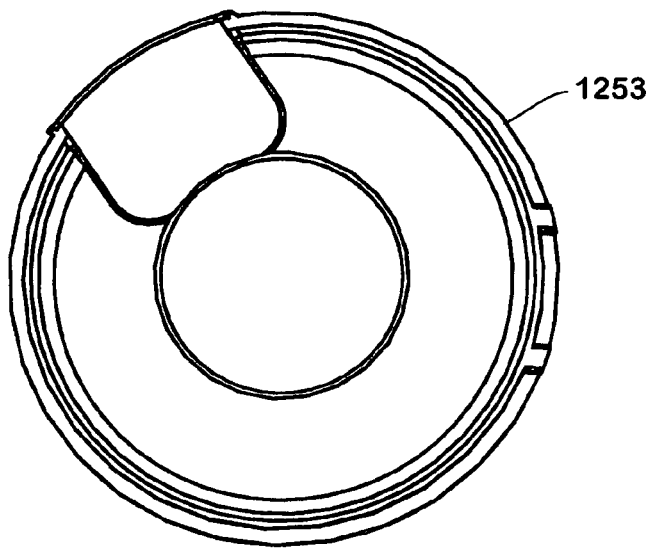
FIG. 74 is an illustration of the bottom surface of the one of the lids of FIG. 72.
Figure 75:
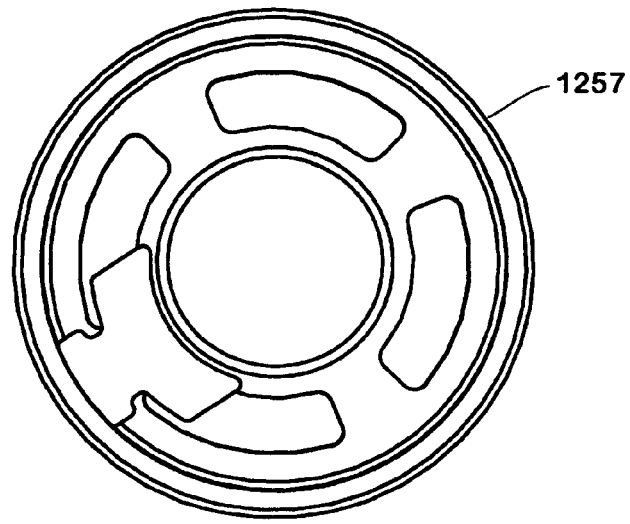
FIG. 75 is an illustration of the top surface of the one of the electromagnetic actuators of FIG. 72.
Figure 76:
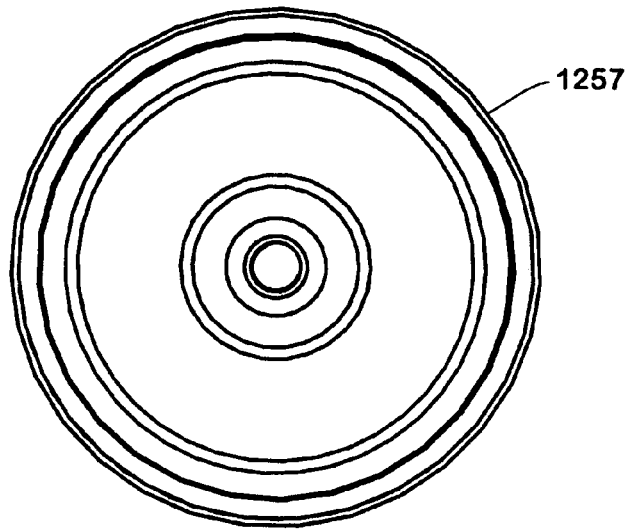
FIG. 76 is an illustration of the bottom surface of the one of the electromagnetic actuators of FIG. 72.

The details of the heat sink 1213 may be further appreciated with reference to the particular, non-limiting embodiment depicted in FIG. 69. As seen therein, the heat sink 1213 comprises a base plate 1221 upon which is mounted a plurality of parallel fins 1215. The base 1221 and fins 1215 preferably comprise a thermally conductive metal such as copper or aluminum. In some embodiments, the fins 1215 and/or base plate 1221 (or portions thereof) may be constructed out of heat pipes. Such constructions are described, for example, in commonly assigned U.S. Provisional Patent Application U.S. Ser. No. 60/736,412, filed on Nov. 14, 2005, entitled "SYNTHETIC JET HEAT PIPE THERMAL MANAGEMENT SYSTEM", and incorporated herein by reference in its entirety.

As best seen in FIG. 68, in this particular embodiment, every alternate fin 1215 in the heat sink 1213 is made to protrude from its neighboring fins. Such a construction has been found to improve entrainment and to reduce noise attendant to the fluid flow between the fins 1215 in some applications. Of course, one skilled in the art will also appreciate that embodiments are possible wherein the fins are co-continuous (that is, where every alternate fin does not protrude).

The details of the synthetic jet ejector 1211 may be appreciated with respect to the particular, non-limiting embodiment depicted in FIGS. 70-76. The synthetic jet ejector 1211 depicted therein comprises a chassis 1251 within which is housed first 1253 and second 1255 lids (see FIG. 72) that have disposed between them first 1257 and second 1259 electromagnetic or piezoelectric diaphragms.

The chassis 1251 of the synthetic jet ejector is equipped with first 1261 and second 1263 sets of flanges by which the chassis may be attached to a card substrate 1217 and/or to the heat sink 1213. Each of the flanges 1261, 1263 is equipped with an aperture through which a suitable fastener may be extended. In some embodiments, the aperture may be threaded so as to rotatingly engage a threaded fastener. In other embodiments, a nut and bolt assembly (optionally including washers) or the like may be used to fasten each of the flanges 1261, 1263 to the card substrate 1217, thereby securing the synthetic jet ejector 1211 in place. The flanges 1261, 1263, in conjunction with the mounting brackets 1281 (shown in FIG. 68 and seen in greater detail in FIG. 80), ensure that the synthetic jet ejector 1211 is in the proper orientation both with respect to the card substrate 1217 and with respect to the heat sink 1213.

The chassis 1251 of the synthetic jet ejector 1211 is also equipped with a plurality of apertures 1265 which are in fluidic communication with the interior of the synthetic jet ejector 1211 and which are of suitable profile to emit a plurality of synthetic jets. Preferably, the longitudinal axes of these synthetic jets are disposed in a common plane, although embodiments are also possible in which this is not the case. Preferably, the synthetic jet ejector 1211 is equipped with 4n apertures 1265 (wherein n≧1), of which a first set 1273 of apertures 1265 are disposed in the central region of the synthetic jet ejector 1211 and second 1273 and third 1275 sets of apertures are disposed on each lateral portion of the synthetic jet ejector 1211.

As best appreciated with respect to FIG. 72 and FIGS. 87-89, during operation of the synthetic jet ejector 1211, the first 1257 and second 1259 electromagnetic actuators vibrate in a manner that causes them to move alternately toward and away from each other. Consequently, the fluid in the space 1277 between the first 1257 and second 1259 electromagnetic actuators is powered by both electromagnetic actuators. By contrast, the space between the first electromagnetic actuator 1257 and the first lid 1253, and the space between the second electromagnetic actuator 1259 and the second lid 1255, are powered by a single actuator. Accordingly, by utilizing twice the number of apertures 1265 in the central region 1271 of the synthetic jet ejector 1211 as compared to the number of apertures 1265 employed in the lateral portions 1273, 1275 of the synthetic jet ejector 1211, a more even distribution of power among the synthetic jets may be obtained.

Figure 77:
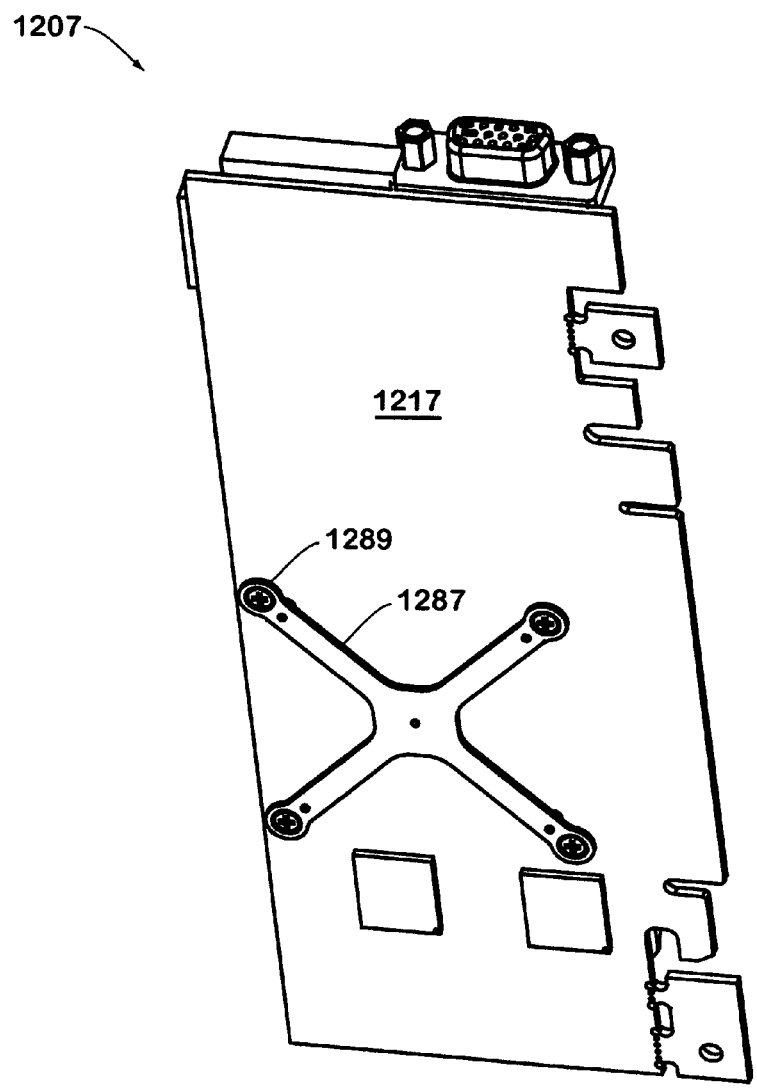
FIG. 77 is a perspective view of the bottom of the add-on card of FIG. 68.
Figure 78:
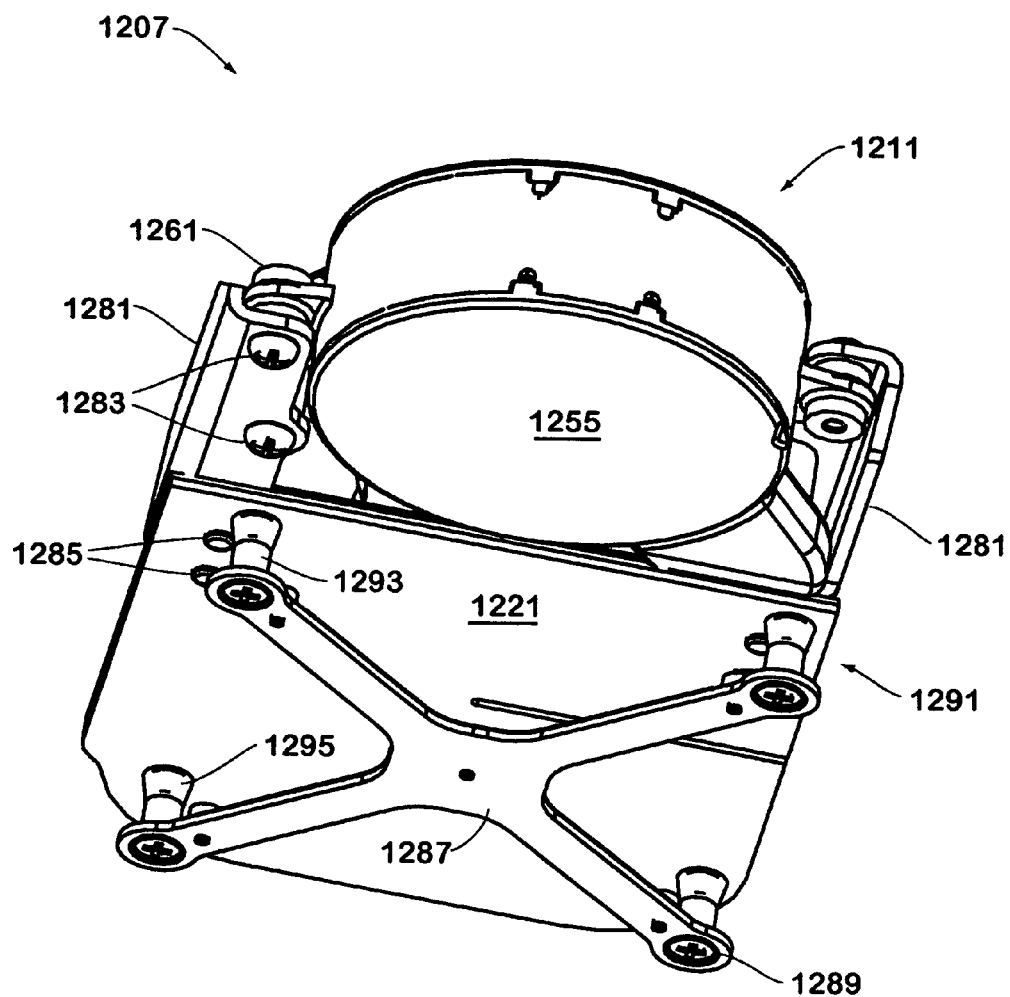
FIG. 78 is a perspective view of the bottom of the add-on card of FIG. 68 with the card substrate removed to reveal the fastening mechanism utilized to secure the heat sink to the card substrate.
Figure 79:
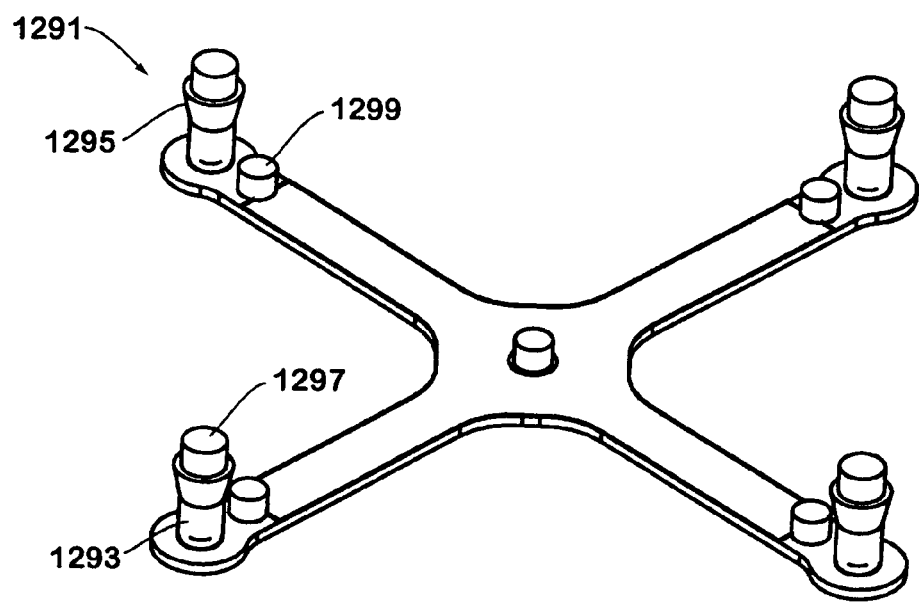
FIG. 79 is a perspective view of the fastening mechanism of FIG. 78.

FIGS. 77-79 illustrate one particular, non-limiting embodiment of a fastening means that may be employed in the devices described herein to fasten the heat sink to a card substrate. As can be appreciated from FIGS. 68, 69 and 78, the synthetic jet ejector 1211 is mounted to the base plate 1221 of the heat sink 1213 by way of mounting brackets 1281 (the mounting brackets 1281 are seen in greater detail in FIG. 80) and by first 1283 and second 1285 sets of set screws. The base plate 1221, in turn, is attached to the card substrate 1217 by way of a cross-bracket 1287 and a third set of set screws 1289 (note that the card substrate 1217 has been omitted from FIG. 78 to illustrate the cross-bracket 1287 in greater detail).

As best seen in FIGS. 78-79, each of the third set of set screws 1289 secure the terminal portion of one arm of the cross-bracket 1287 to an elastomeric grommet 1291. The elastomeric grommets 1291 have a cylindrical body 1293 and are equipped with a tapered skirt 1295 and a terminal dowel 1297. Each dowel 1297 engages a complimentary shaped aperture (not shown) disposed in the base plate 1221 of the heat sink 1213. The cross-bracket 1287 is likewise equipped with a series of elastomeric protrusions 1299. In the assembled add-on card 1201, the card substrate 1217 is seated between the elastomeric protrusions 1299 and the flared skirt 1295 of the elastomeric grommets 1291 and is mounted on the cylindrical body 1293 of the elastomeric grommets 1291. The use of this type of fastening means secures the heat sink to the card substrate 1217 and provides sufficient pressure to minimize the air pockets between the card substrate 1217 and the heat sink 1213.

Figure 80:
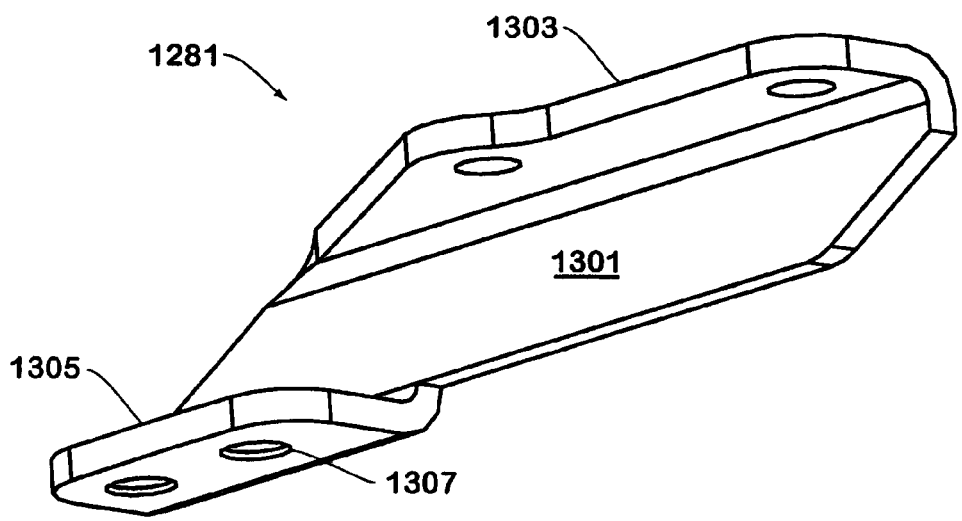
FIG. 80 is a perspective view of the bracket used to mount the synthetic jet actuator to the card substrate and/or heat sink in the add-on card of FIG. 68.

FIG. 80 illustrates in detail one particular, non-limiting embodiment of a mounting bracket 1281 that may be used in the devices described herein. As seen therein, the mounting bracket 1281 comprises a main body 1301 from which first 1303 and second 1305 flanges protrude in a spaced-apart manner. Preferably, the major planes of the first 1303 and second 1305 flanges are parallel and are each perpendicular to the main body 1301. Each of the first 1303 and second 1305 flanges contains a plurality of apertures 1307 through which a suitable fastener may be extended such that the first flange 1303 may be secured to the flanges 1261, 1263 of the synthetic jet ejector 1211, and the second flange 1305 may be secured to the base plate 1221 of the heat sink 1213.

A number of fluid flow options are possible in the thermal management systems described herein. Some non-limiting embodiments of add-on cards which illustrate various possible fluid flow options are depicted in FIGS. 81-84.

Figure 81:
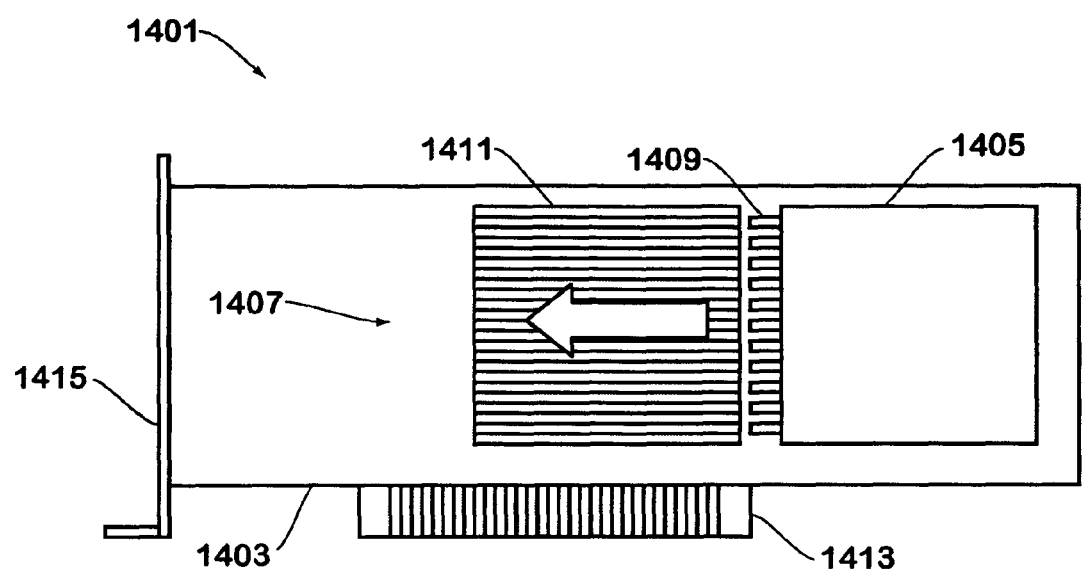
FIG. 81 is an illustration of an add-on card equipped with a thermal management system of the type disclosed herein wherein the synthetic jet ejector is adapted to direct a plurality of jets in a direction parallel to the longitudinal axis of the card and in the direction of the back plane connector.

The add-on card 1401 of FIG. 81 comprises a card substrate 1403 upon which is mounted a synthetic jet ejector 1405 and a heat sink 1407. The synthetic jet ejector 1405 is equipped with a plurality of nozzles 1409 that are adapted to direct a plurality of synthetic jets between the fins 1411 of the adjacent heat sink 1407. The add-on card 1401 is further equipped with a motherboard connector 1413 and a back plane connector 1415. Notably, the directional flow of fluid in the add-on card 401 of FIG. 81 is parallel to the longitudinal axis of the card substrate 1403 and in the direction of the back plane connector 1415. In some embodiments, one or more vents may be provided in the back plane connector 1415 to permit a flow of fluid through it.

Figure 82:
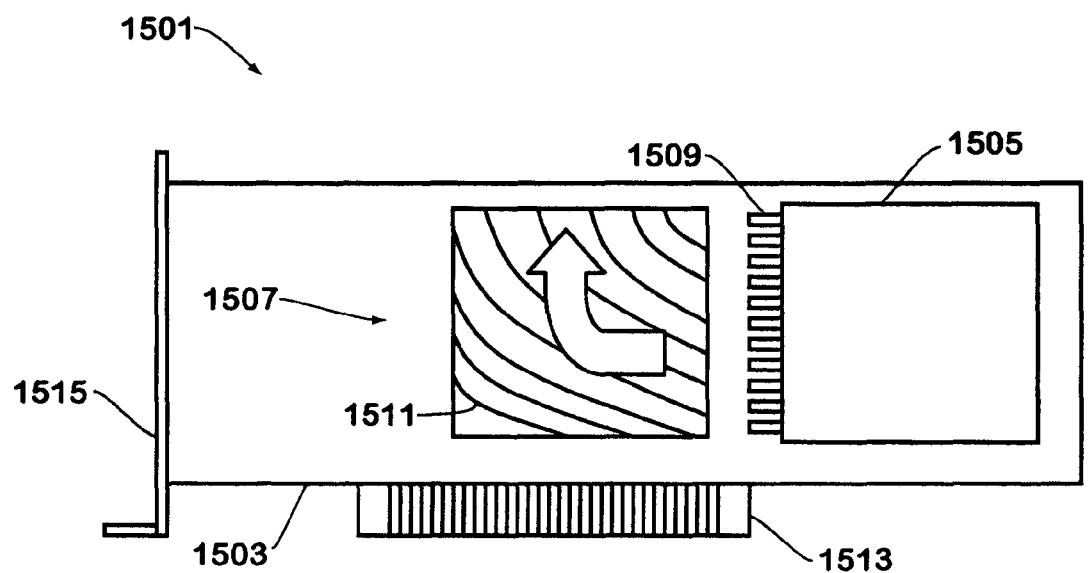
FIG. 82 is an illustration of an add-on card equipped with a thermal management system of the type disclosed herein wherein the synthetic jet ejector is adapted to direct a plurality of jets in a direction perpendicular to the longitudinal axis of the card and in the direction of the back plane connector.

The add-on card 1501 of FIG. 82 comprises a card substrate 1503 upon which is mounted a synthetic jet ejector 1505 and a heat sink 1507. The synthetic jet ejector 1505 is equipped with a plurality of nozzles 1509 that are adapted to direct a plurality of synthetic jets between the fins 1511 of the adjacent heat sink 1507. The add-on card 1501 is further equipped with a motherboard connector 1513 and a back plane connector 1515. Notably, the fins 1511 of the heat sink 1507 in this embodiment are contoured such that the directional flow of fluid in the add-on card 1501 is diverted in a direction perpendicular to the longitudinal axis of the card substrate 1503.

Figure 83:
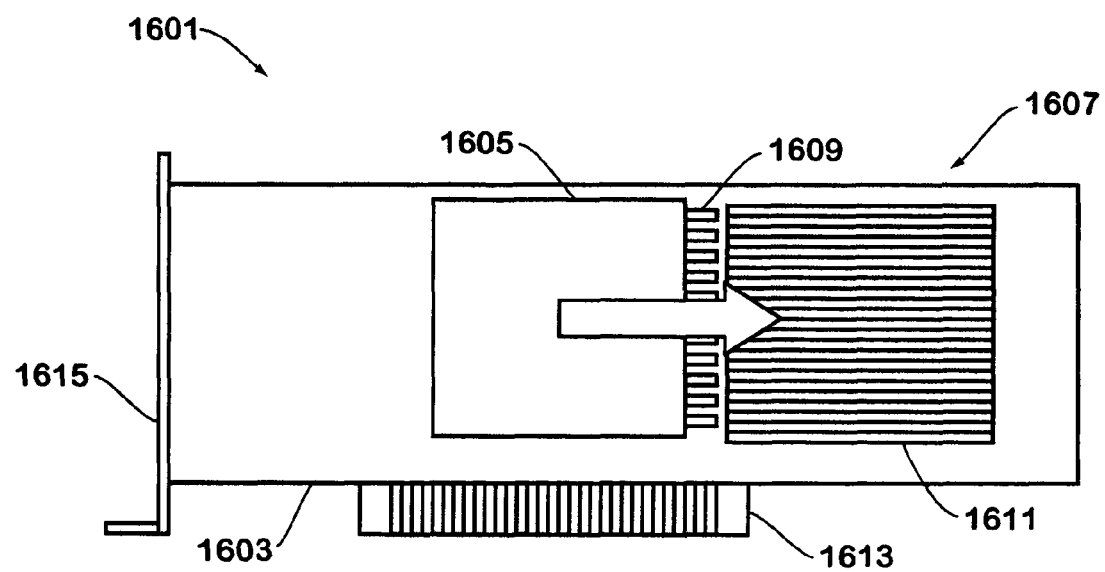
FIG. 83 is an illustration of an add-on card equipped with a thermal management system of the type disclosed herein wherein the synthetic jet ejector is adapted to direct a plurality of jets in a direction parallel to the longitudinal axis of the card and in the direction away from the back plane connector.

The add-on card 1601 of FIG. 83 comprises a card substrate 1603 upon which is mounted a synthetic jet ejector 1605 and a heat sink 1607. The synthetic jet ejector 1605 is equipped with a plurality of nozzles 1609 that are adapted to direct a plurality of synthetic jets between the fins 1611 of the adjacent heat sink 1607. The add-on card 1601 is further equipped with a motherboard connector 1613 and a back plane connector 1615. Notably, the directional flow of fluid in the add-on card 1601 of FIG. 83 is parallel to the longitudinal axis of the card substrate 1603 and in the opposite direction of the back plane connector 1615.

Figure 84:
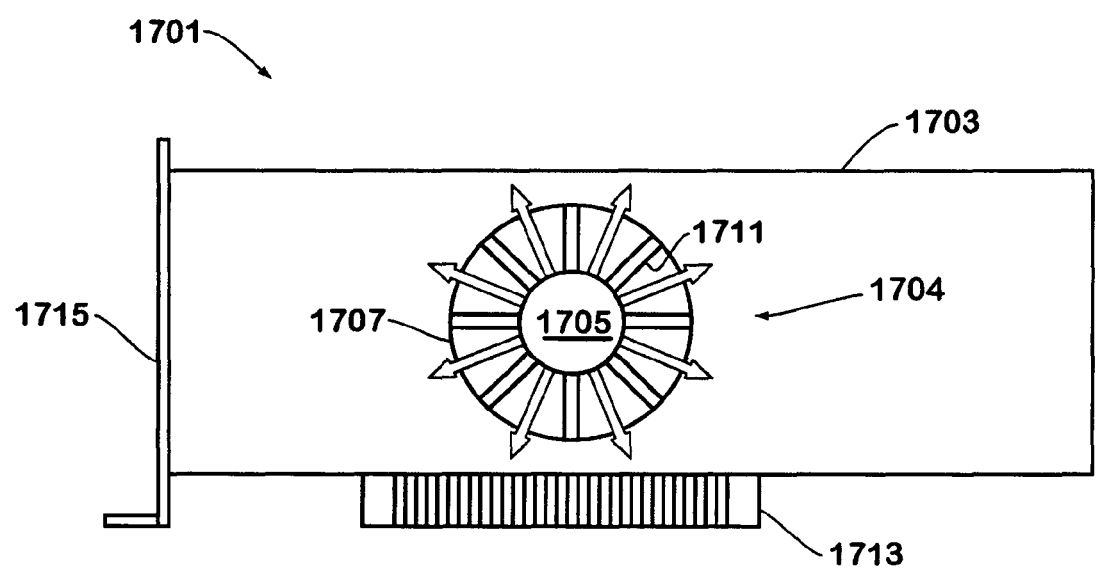
FIG. 84 is an illustration of an add-on card equipped with a thermal management system of the type disclosed herein wherein the synthetic jet ejector is adapted to direct a plurality of jets in multiple directions.

The add-on card 1701 of FIG. 84 comprises a card substrate 1703 upon which is mounted a combination thermal management device 1704 which comprises a synthetic jet ejector 1705 and a heat sink 1707. The synthetic jet ejector 1705 is equipped with a plurality of apertures 1709 (not shown, but similar to the apertures 1265 seen in the synthetic jet ejector 1211 of FIG. 70) that are adapted to direct a plurality of synthetic jets radially from the cylindrical synthetic jet ejector 1705 and between the fins 1711 of the adjacent heat sink 1707. The add-on card 1701 is further equipped with a motherboard connector 1713 and a back plane connector 1715. In this embodiment, the directional flow of fluid in the add-on card 1701 of FIG. 84 is multidirectional, with each synthetic jet being directed between a pair of radially extending fins.

It should be noted that, while the synthetic jet ejector 1705 in this embodiment is essentially cylindrical and the adjacent heat sink 1707 is complimentary in shape and is thus essentially annular, in other embodiments, the synthetic jet ejector may have an outer wall that is polygonal (including, without limitation, rectangular, square, pentagonal, and hexagonal), elliptical, or irregular in shape. The interior of the heat sink 1707 adjacent to the synthetic jet ejector 1705 is preferably complimentary in shape to that of the synthetic jet ejector 1705, although the exterior shape of the heat sink may be independent of the interior shape. It is also preferred that the synthetic jet ejector 1705 and the heat sink 1707 are formed as an integral device, though one skilled in the art will also appreciate that these components may be modular such that the synthetic jet ejector 1705 and heat sink 1707 may be releasably assembled into units of various dimensions and shapes and having various flow contours.

In the various systems disclosed herein, a plurality of synthetic jet ejector and/or heat sinks may be employed. This aspect of the devices and methodologies disclosed herein may be appreciated with respect to the particular, non-limiting embodiments depicted in FIGS. 85-86. Thus, in the system 1801 depicted in FIG. 85, a plurality of heat sinks 1803 are provided which operate in conjunction with a single synthetic jet ejector 1805. By contrast, in the system 1851 depicted in FIG. 86, a single heat sink 1853 is provided which operates in conjunction with a plurality of synthetic jet ejectors 1855.

Figure 85:
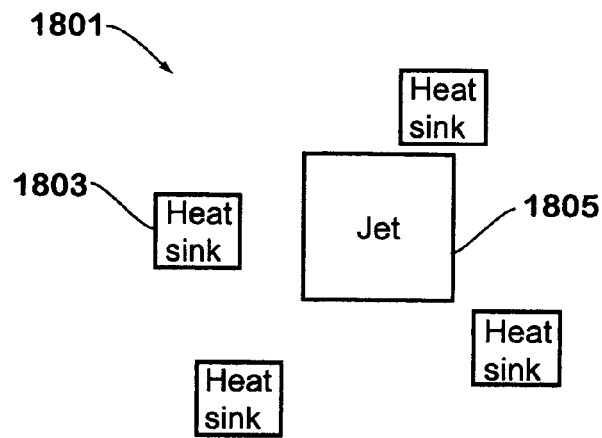
FIG. 85 is a schematic illustration of a thermal management system of the type disclosed herein wherein a single jet ejector utilizes a plurality of heat sinks.
Figure 86:
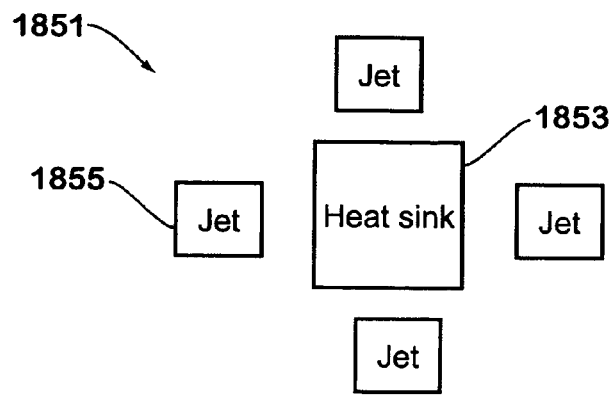
FIG. 86 is a schematic illustration of a thermal management system of the type disclosed herein wherein a plurality of single jet ejectors utilizes a single heat sink.

The means by which the heat sinks and synthetic jet ejectors interact with each other in the embodiments depicted in FIGS. 85-86 may vary. Preferably, the synthetic jet ejectors are disposed in close enough proximity to the heat sinks such that the synthetic jets generated by the synthetic jet ejectors can directly impinge upon the heat sinks. Since synthetic jets can be made to propagate significant distances, in some embodiments, the synthetic jet ejectors and heat sinks may be disposed on card substrates with significant distances between them. In other embodiments (as, for example, in a distributed system where it may be desirable to use a single synthetic jet ejector in conjunction with heat sinks disposed on separate add-on cards), the synthetic jet actuator may be utilized in combination with one or more conduits to direct one or more synthetic jets to their appropriate destinations. Various heat pipe constructions may also be used to convey heat from various heat sources to one or more of the heat sinks in these embodiments.

Figure 87:
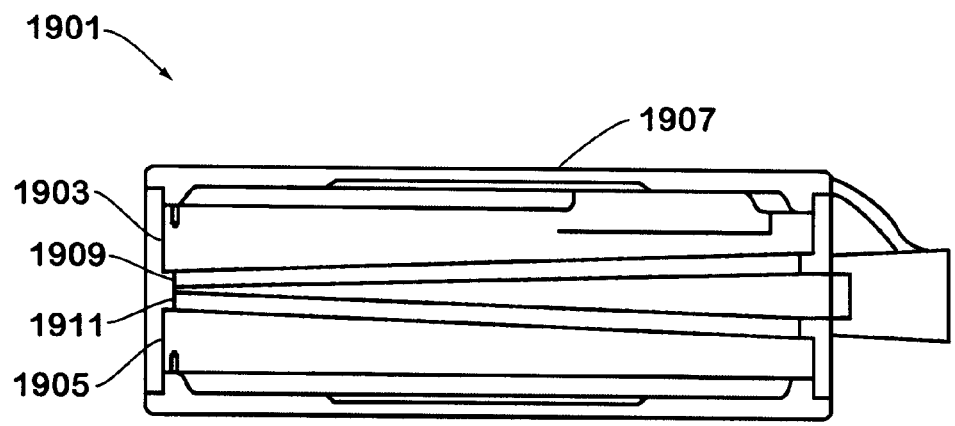
FIG. 87 is an illustration of a synthetic jet ejector useful in the thermal management systems disclosed herein and wherein the synthetic jet ejector is equipped with dual electromagnetic actuators that are canted with respect to each other.
Figure 88:
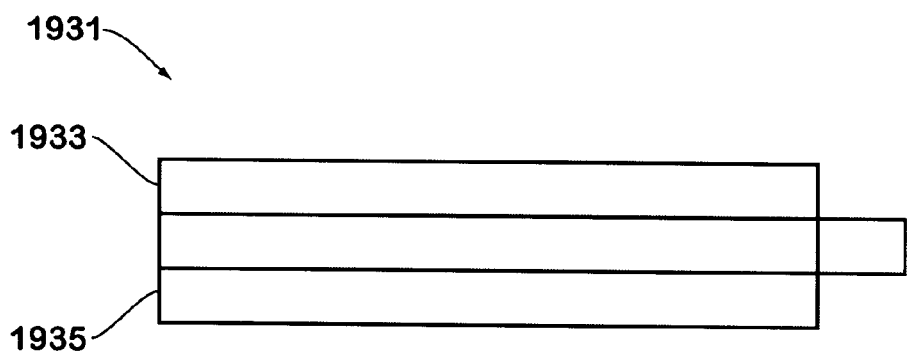
FIG. 88 is an illustration of a synthetic jet ejector useful in the thermal management systems disclosed herein and wherein the synthetic jet ejector is equipped with dual electromagnetic actuators that are disposed parallel to each other.
Figure 89:
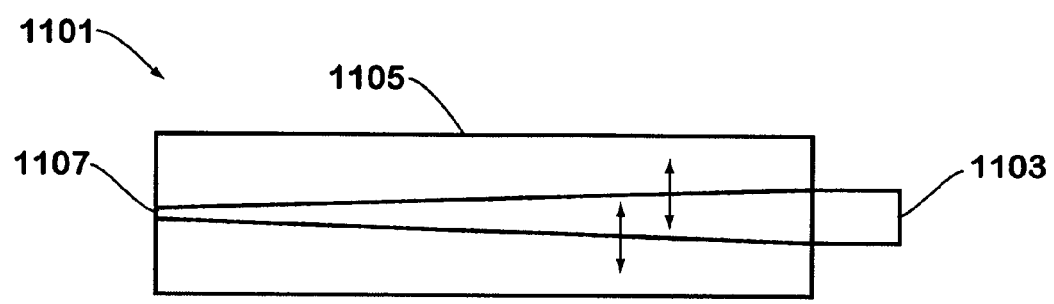
FIG. 89 is an illustration of a synthetic jet ejector useful in the thermal management systems disclosed herein and wherein the synthetic jet ejector is equipped with dual electromagnetic actuators that are canted with respect to each other for more power, and that operate out of phase to achieve vibration dampening.

FIGS. 87-89 illustrate some possible, non-limiting orientations of the electromagnetic actuators in those embodiments wherein the synthetic jet ejector is powered by dual electromagnetic actuators. In the synthetic jet ejector 1901 depicted in FIG. 87, first 1903 and second 1905 electromagnetic actuators are provided that are disposed within a housing 1907. The first 1903 and second 1905 electromagnetic actuators are equipped with respective first 1909 and second 1911 diaphragms that are canted with respect to each other. By contrast, in the synthetic jet ejector 1931 depicted in FIG. 88, the first 1933 and second 1935 electromagnetic actuators (and their respective diaphragms) are disposed essentially parallel to each other. It has been found that, in many applications, the orientation of FIG. 87 provides lower power consumption, higher fluid speeds and more volume for wire routing than the orientation of FIG. 88.

The angle at which the first 1909 and second 1911 diaphragms in the synthetic jet ejector 1901 depicted in FIG. 87 are canted may vary depending on a number of physical and operational parameters relating to the synthetic jet ejector 1901. It will also be appreciated that embodiments of synthetic jet ejectors could be assembled that have more than two electromagnetic actuators disposed within the housing. For example, embodiments are possible wherein pairs of electromagnetic actuators are provided that control the emission of synthetic jets from one group of a plurality of groups of nozzles or apertures provided in the synthetic jet ejector housing. Such an embodiment may be particularly desirable in applications where it is desirable for the frequencies or power characterizing the operation of a pair of electromagnetic actuators to vary from one pair of actuators to another. Such an embodiment also allows the pairs of electromagnetic actuators to be operated in concert with, or independently of, each other.

FIG. 89 illustrates a further aspect achievable with synthetic jet ejectors of the type disclosed herein. In the synthetic jet ejector 1951 depicted therein, first 1953 and second 1955 acoustic vibrators are provided that are disposed within a housing 1957. As in the embodiment depicted in FIG. 87, the first 1953 and second 1955 electromagnetic actuators are canted with respect to each other to create a wedge-shaped internal chamber 1957. Moreover, the first 1953 and second 1955 electromagnetic actuators are operated out of phase with each other to achieve vibration cancellation through destructive interference. In some embodiments, such a mode of operation may provide lower noise levels and increased lifetimes of the synthetic jet ejector and its components.

Figure 90:
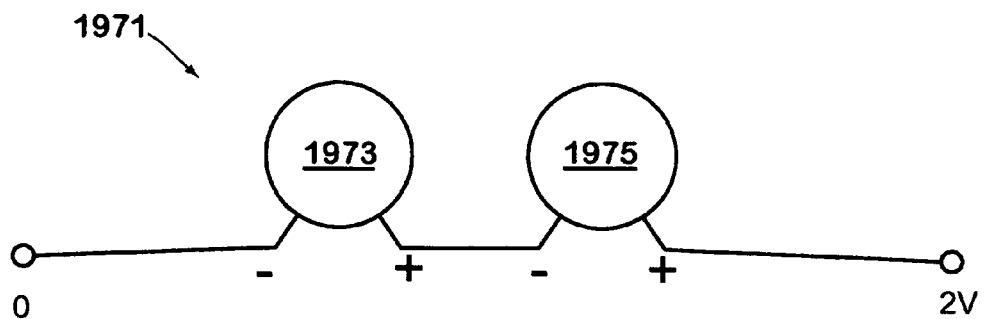
FIG. 90 is an illustration depicting a plurality of synthetic jet ejectors connected in series.
Figure 91:
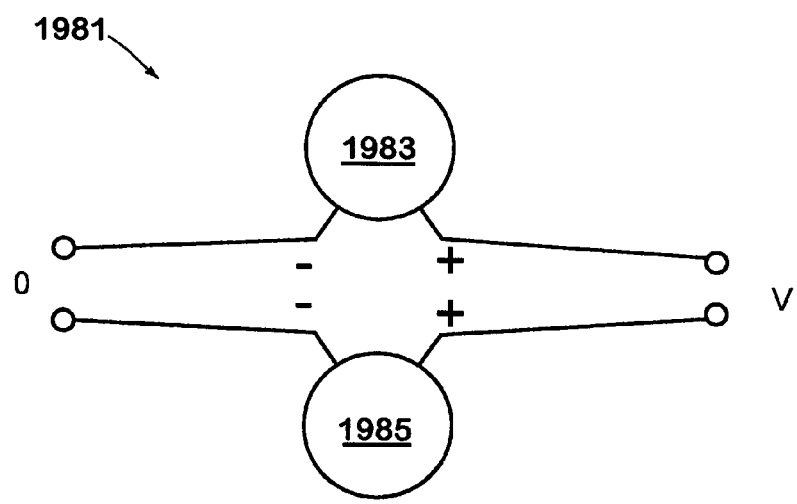
FIG. 91 is an illustration depicting a plurality of synthetic jet ejectors connected in parallel.

FIGS. 90-91 illustrate a further aspect of the devices and methodologies disclosed herein. As indicated therein, devices are possible in which the synthetic jet actuators 1973, 19975 are wired in series, as in the system 1971 indicated in FIG. 90, or in which the synthetic jet actuators 1983, 1985 are wired in parallel, as in the system 1981 depicted in FIG. 91. Each of these arrangements has its own advantages and disadvantages, and the optimal choice will typically depend on the specifics of the particular application at hand. For example, the series connection the synthetic jet actuators 1973, 1975 in FIG. 90 has the advantage of lower current consumption, while the parallel connection of the synthetic jet actuators 1983, 1985 of FIG. 91 requires lower voltages and built-in redundancy.

In the various embodiments of the devices and methodologies described herein, the fluid utilized by the synthetic jet actuator to provide thermal management is preferably air.

One skilled in the art will appreciate, however, that in many embodiments, other gases or liquids may be utilized as the fluid. For example, in some embodiments, especially where the thermal management system is a closed loop system, the use of inert gasses such as nitrogen, argon, helium, or fluorocarbons may be advantageous. In other applications, ambient air may be utilized as the fluid medium, but filters or scrubbers may be provided to remove certain components of the air. For example, a desiccant may be employed to control the moisture content of air entering the assembly. In still other embodiments, liquids may be employed as the fluid medium. Such liquids include, but are not limited to, water and various organic liquids, such as, for example, polyethylene glycol, polypropylene glycol, and other polyols, partially fluorinated or perfluorinated ethers, and various dielectric materials. Liquid metals (which are generally metal alloys with an amorphous atomic structure) may also be advantageously used in some embodiments of the devices and methodologies described herein.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A heat exchanger, comprising:
a heat sink comprising a plurality of fins; and
a synthetic jet ejector adapted to direct a plurality of synthetic jets between said fins;
wherein said synthetic jet ejector comprises a first actuator disposed on a first side of said heat sink which is in fluidic communication with a first boom that extends across said fins, and wherein said first boom is equipped with a first plurality of apertures; wherein the heat sink has a plurality of channels therein, wherein each of the plurality of channels is defined by a pair of adjacent fins, and wherein said synthetic jet ejector directs a plurality of synthetic jets along the longitudinal axis of at least one of said plurality of channels.

2. The heat exchanger of claim 1, wherein said first plurality of apertures is adapted to direct a plurality of synthetic jets between the fins of said heat sink.

3. The heat exchanger of claim 1, wherein said synthetic jet ejector comprises a second actuator disposed on a second side of said heat sink.

4. The heat exchanger of claim 3, wherein said second actuator is also in fluidic communication with said first boom.

5. The heat exchanger of claim 1, further comprising a second boom that extends across said fins, and wherein said second boom is equipped with a second plurality of apertures.

6. The heat exchanger of claim 5, wherein said synthetic jet ejector comprises a second actuator, and wherein said first and second actuators are in fluidic communication with said second boom.

7. The heat exchanger of claim 6, wherein each of said first and second actuators has a first and second opening defined therein, wherein said first opening is in fluidic communication with said first boom, and wherein said second opening is in fluidic communication with said second boom.

8. The heat exchanger of claim 1, wherein said synthetic jet ejector directs a synthetic jet along the longitudinal axis of each of said plurality of channels.

9. The heat exchanger of claim 1, wherein said synthetic jet ejector directs a plurality of synthetic jets along the longitudinal axis of each of said plurality of channels.

10. The heat exchanger of claim 1, wherein each of said first plurality of apertures is disposed adjacent to one of said plurality of channels.

11. The heat exchanger of claim 5, wherein each of said first and second plurality of apertures is disposed adjacent to one of said plurality of channels.

12. The heat exchanger of claim 11, wherein each of said plurality of channels is aligned with one of said first plurality of apertures and one of said second plurality of apertures.

13. The heat exchanger of claim 12, wherein each of said plurality of channels is aligned with one of said first plurality of apertures such that a synthetic jet emitted from the one of said first plurality of apertures is directed into the channel, and wherein each of said plurality of channels is aligned with one of said second plurality of apertures such that a synthetic jet emitted from the one of said second plurality of apertures is also directed into the channel.

14. The heat exchanger of claim 12, wherein each of said plurality of channels is aligned with one of said first plurality of apertures such that a synthetic jet emitted from the one of said first plurality of apertures is directed into the channel along a first axis, and wherein each of said plurality of channels is aligned with one of said second plurality of apertures such that a synthetic jet emitted from the one of said second plurality of apertures is also directed into the channel along a second axis that is parallel to said first axis.

15. The heat exchanger of claim 12, wherein each of said plurality of channels is aligned with one of said first plurality of apertures such that a synthetic jet emitted from the one of said first plurality of apertures is directed along the longitudinal axis of the channel, and wherein each of said plurality of channels is aligned with one of said second plurality of apertures such that a synthetic jet emitted from the one of said second plurality of apertures is also directed along the longitudinal axis of the channel.

16. The heat exchanger of claim 3, wherein said first and second actuators are adjacent to said heat sink.

17. The heat exchanger of claim 3, wherein said first actuator is adjacent to a first of said plurality of fins, and wherein said second actuator is adjacent to a second of said plurality of fins.

18. The heat exchanger of claim 3, wherein said heat sink comprises a base on which said plurality of fins are disposed, wherein said base has first and second opposing ends, wherein said first actuator is attached to a first end of said base, and wherein said second actuator is attached to a second end of said base.

19. The heat exchanger of claim 3, wherein said first actuator is in fluidic communication with a second boom that extends across said fins, wherein said second boom is equipped with a second plurality of apertures, and wherein said first and second boom are disposed on a common side of said heat sink.

20. A heat exchanger, comprising:
a heat sink comprising a plurality of fins; and
a synthetic jet ejector adapted to direct a plurality of synthetic jets between said fins;
wherein said synthetic jet ejector comprises a first actuator disposed on a first side of said heat sink which is in fluidic communication with a first boom that extends across said fins, and wherein said first boom is equipped with a first plurality of apertures; wherein said synthetic jet ejector comprises a second actuator disposed on a second side of said heat sink; wherein said heat sink comprises a base on which said plurality of fins are disposed, wherein said base has first and second opposing ends, wherein said first actuator is attached to a first end of said base, and wherein said second actuator is attached to a second end of said base.

21. The heat exchanger of claim 20, wherein said first plurality of apertures is adapted to direct a plurality of synthetic jets between the fins of said heat sink.

22. The heat exchanger of claim 20, wherein said second actuator is also in fluidic communication with said first boom.

23. The heat exchanger of claim 20, further comprising a second boom that extends across said fins, and wherein said second boom is equipped with a second plurality of apertures.

24. The heat exchanger of claim 23, wherein said first and second actuators are in fluidic communication with said second boom.

25. The heat exchanger of claim 24, wherein each of said first and second actuators has a first and second opening defined therein, wherein said first opening is in fluidic communication with said first boom, and wherein said second opening is in fluidic communication with said second boom.

26. The heat exchanger of claim 20, wherein said plurality of fins defines a plurality of channels, wherein each of said plurality of channels is formed by the space between a pair of adjacent fins, and wherein said synthetic jet ejector directs a synthetic jet along the longitudinal axis of each of said plurality of channels.

27. The heat exchanger of claim 26, wherein said synthetic jet ejector directs a plurality of synthetic jets along the longitudinal axis of each of said plurality of channels.

28. The heat exchanger of claim 26, wherein each of said first plurality of apertures is disposed adjacent to one of said plurality of channels.

29. The heat exchanger of claim 26, further comprising a second boom that extends across said fins, wherein said second boom is equipped with a second plurality of apertures, and wherein each of said first and second plurality of apertures is disposed adjacent to one of said plurality of channels.

30. The heat exchanger of claim 29, wherein each of said plurality of channels is aligned with one of said first plurality of apertures and one of said second plurality of apertures.

31. The heat exchanger of claim 29, wherein each of said plurality of channels is aligned with one of said first plurality of apertures such that a synthetic jet emitted from the one of said first plurality of apertures is directed into the channel, and wherein each of said plurality of channels is aligned with one of said second plurality of apertures such that a synthetic jet emitted from the one of said second plurality of apertures is also directed into the channel.

32. The heat exchanger of claim 29, wherein each of said plurality of channels is aligned with one of said first plurality of apertures such that a synthetic jet emitted from the one of said first plurality of apertures is directed into the channel along a first axis, and wherein each of said plurality of channels is aligned with one of said second plurality of apertures such that a synthetic jet emitted from the one of said second plurality of apertures is also directed into the channel along a second axis that is parallel to said first axis.

33. The heat exchanger of claim 29, wherein each of said plurality of channels is aligned with one of said first plurality of apertures such that a synthetic jet emitted from the one of said first plurality of apertures is directed along the longitudinal axis of the channel, and wherein each of said plurality of channels is aligned with one of said second plurality of apertures such that a synthetic jet emitted from the one of said second plurality of apertures is also directed along the longitudinal axis of the channel.

34. The heat exchanger of claim 20, wherein said first and second actuators are adjacent to said heat sink.

35. The heat exchanger of claim 34, wherein said first actuator is adjacent to a first of said plurality of fins, and wherein said second actuator is adjacent to a second of said plurality of fins.

36. The heat exchanger of claim 35, wherein said heat sink comprises a base on which said plurality of fins are disposed, wherein said base has first and second opposing ends, wherein said first actuator is attached to a first end of said base, and wherein said second actuator is attached to a second end of said base.

37. The heat exchanger of claim 36, wherein said first actuator is in fluidic communication with a second boom that extends across said fins, wherein said second boom is equipped with a second plurality of apertures, and wherein said first and second boom are disposed on a common side of said heat sink.

38. A heat exchanger, comprising:
a heat sink comprising a plurality of fins, wherein said plurality of fins define a plurality of channels, and wherein each of said plurality of channels is defined by a pair of adjacent fins;
a first boom which extends across said plurality of fins and which is equipped with a first plurality of apertures;
a second boom which extends across said plurality of fins and which is equipped with a second plurality of apertures; and
a synthetic jet ejector adapted to direct a plurality of synthetic jets between said fins;
wherein said synthetic jet ejector comprises a first actuator disposed on a first side of said heat sink which is in fluidic communication with said first boom; wherein each of said first and second plurality of apertures is disposed adjacent to one of said plurality of channels; wherein each of said plurality of channels is aligned with one of said first plurality of apertures such that a synthetic jet emitted from the one of said first plurality of apertures is directed into the channel, and wherein each of said plurality of channels is aligned with one of said second plurality of apertures such that a synthetic jet emitted from the one of said second plurality of apertures is also directed into the channel.

39. The heat exchanger of claim 38, wherein said synthetic jet ejector further comprises a second actuator, and wherein said second actuator is also in fluidic communication with said first boom.

40. The heat exchanger of claim 39, wherein each of said first and second actuators has a first and second opening defined therein, wherein said first opening is in fluidic communication with said first boom, and wherein said second opening is in fluidic communication with said second boom.

41. The heat exchanger of claim 38, wherein said synthetic jet ejector directs a synthetic jet along the longitudinal axis of each of said plurality of channels.

42. The heat exchanger of claim 38, wherein said synthetic jet ejector directs a plurality of synthetic jets along the longitudinal axis of each of said plurality of channels.

43. The heat exchanger of claim 38, wherein said synthetic jet ejector further comprises a second actuator disposed on a second side of said heat sink which is in fluidic communication with said first boom.

44. The heat exchanger of claim 43, wherein said first and second actuators are also in fluidic communication with said second boom.

45. The heat exchanger of claim 38, wherein said synthetic jet ejector further comprises a second actuator, wherein said heat sink comprises a base on which said plurality of fins are disposed, wherein said base has first and second opposing ends, wherein said first actuator is attached to a first end of said base, and wherein said second actuator is attached to a second end of said base.

46. The heat exchanger of claim 38, wherein said first and second booms are disposed on a common side of said heat sink.

47. The heat exchanger of claim 38, wherein said first and second booms have first and second parallel longitudinal axes.

\* \* \* \* \*